(12) United States Patent
Kobayashi et al.

(10) Patent No.: US 10,212,370 B2
(45) Date of Patent: Feb. 19, 2019

(54) SOLID-STATE IMAGE SENSOR AND ELECTRONIC INFORMATION DEVICE

(71) Applicant: Sharp Kabushiki Kaisha, Sakai, Osaka (JP)

(72) Inventors: Takashi Kobayashi, Sakai (JP); Kohzoh Hoshino, Sakai (JP); Tatsuya Yui, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 72 days.

(21) Appl. No.: 15/312,191

(22) PCT Filed: May 22, 2015

(86) PCT No.: PCT/JP2015/064761
§ 371 (c)(1),
(2) Date: Nov. 18, 2016

(87) PCT Pub. No.: WO2016/002382
PCT Pub. Date: Jan. 7, 2016

(65) Prior Publication Data
US 2017/0094202 A1  Mar. 30, 2017

(30) Foreign Application Priority Data
Jul. 4, 2014  (JP) .................. 2014-139085

(51) Int. Cl.
*H04N 5/355* (2011.01)
*H04N 5/359* (2011.01)
(Continued)

(52) U.S. Cl.
CPC ....... *H04N 5/359* (2013.01); *H01L 27/14609* (2013.01); *H01L 27/14612* (2013.01);
(Continued)

(58) Field of Classification Search
CPC ........ H04N 5/359; H04N 5/243; H04N 5/378; H04N 5/374; H04N 5/3559;
(Continued)

(56) References Cited

U.S. PATENT DOCUMENTS 6,538,695 B1 * 3/2003 Xiao ...................... H04N 5/361
250/208.1
7,626,532 B2 * 12/2009 Maruyama ............ H03M 1/181
341/164
(Continued)

FOREIGN PATENT DOCUMENTS

JP  2006-157263 A     6/2006
JP  2008-042673    *  8/2006 ............. H04N 5/335
(Continued)

OTHER PUBLICATIONS

Official Communication issued in International Patent Application No. PCT/JP2015/064761, dated Jul. 28, 2015.

*Primary Examiner* — Lin Ye
*Assistant Examiner* — Marly Camargo
(74) *Attorney, Agent, or Firm* — Keating & Bennett, LLP

(57) ABSTRACT

Provided are a solid-state image sensor and an electronic information device capable of effectively reducing the occurrence of pseudo-smear by adopting a simple configuration and operation. A solid-state image sensor 1 includes multiple pixel circuit units $P_N$ and $P_{OB}$, each including a photoelectric conversion unit that generates charges via photoelectric conversion and accumulates the generated charges, a floating diffusion unit that retains charges transferred from the photoelectric conversion unit, a transfer unit through which charges accumulated by the photoelectric conversion unit are transferred to the floating diffusion unit, an output unit that outputs a signal corresponding to the amount of charges retained by the floating diffusion unit, and a reset unit that discharges charges retained by the floating (Continued)

diffusion unit to the outside; and an A/D conversion unit 23 that acquires a signal output from the output unit and performs A/D conversion on the acquired signal using a set gain. At least one of the pixel circuit units $P_N$ and $P_{OB}$ is configured such that charges transferred from the photoelectric conversion unit to the floating diffusion unit and retained by the floating diffusion unit are limited so as not to exceed an upper limit amount which is set to be smaller by the extent of an increase in the gain.

19 Claims, 34 Drawing Sheets

(51) Int. Cl.
*H01L 27/146* (2006.01)
*H04N 5/374* (2011.01)
*H04N 5/378* (2011.01)

(52) U.S. Cl.
CPC .. *H01L 27/14643* (2013.01); *H01L 27/14656* (2013.01); *H04N 5/374* (2013.01); *H04N 5/378* (2013.01)

(58) Field of Classification Search
CPC .......... H04N 5/3591–5/3598; H01L 27/14654; H01L 27/14656; H01L 27/14643; H01L 27/14612; H01L 27/14609
USPC .... 348/308, 294, 302, 243, 241, 248, 222.1, 348/229.1, E3.021, E5.8; 341/155, 118; 250/208.1, 214, 214 R, 214 AG; 257/191, 192, 443, 426

See application file for complete search history.

(56) References Cited

U.S. PATENT DOCUMENTS

| | | | |
|---|---|---|---|
| 8,045,029 B2 * | 10/2011 | Kim | H04N 5/361 348/241 |
| 8,350,942 B2 * | 1/2013 | Shinohara | H04N 5/335 348/308 |
| 9,615,044 B2 * | 4/2017 | Hashimoto | H04N 5/357 |
| 2006/0114342 A1 | 6/2006 | Egawa | |
| 2009/0200449 A1 * | 8/2009 | Iwata | H04N 5/3598 250/206 |
| 2009/0224140 A1 * | 9/2009 | Gomi | H04N 5/3575 250/214 A |
| 2012/0008027 A1 | 1/2012 | Makino et al. | |
| 2013/0256512 A1 | 10/2013 | Shioya | |
| 2014/0078358 A1 | 3/2014 | Takenaka et al. | |

FOREIGN PATENT DOCUMENTS

| | | |
|---|---|---|
| JP | 2008-042673 A | 2/2008 |
| JP | 2009-005169 A | 1/2009 |
| JP | 2009-278454 A | 11/2009 |
| JP | 2012-019492 A | 1/2012 |
| JP | 2013-016904 A | 1/2013 |
| JP | 2013-183380 A | 9/2013 |
| JP | 2013-207433 A | 10/2013 |
| JP | 2014-060517 A | 4/2014 |

* cited by examiner

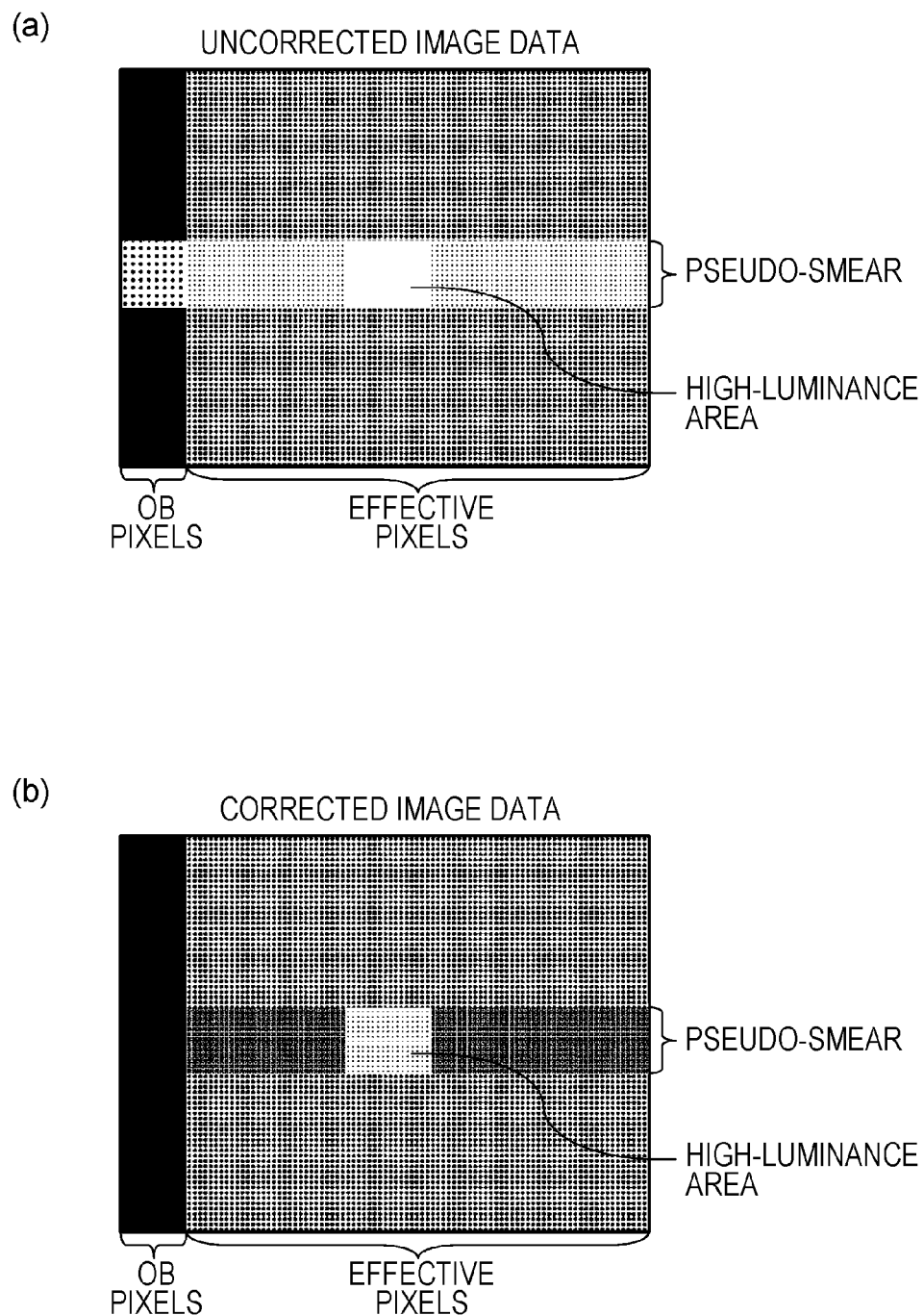

SOLID-STATE IMAGE SENSOR AND ELECTRONIC INFORMATION DEVICE

CROSS-REFERENCE TO RELATED APPLICATIONS

This application is a National Phase filing under 35 U.S.C. § 371 of International Application No. PCT/JP2015/064761 filed on May 22, 2015, and which claims priority to Japanese Patent Application No. 2014-139085 filed on Jul. 4, 2014.

TECHNICAL FIELD

The present invention relates to a solid-state image sensor which is represented by an amplified image sensor such as a complementary metal oxide semiconductor (CMOS) image sensor, and an electronic information device including the solid-state image sensor.

BACKGROUND ART

Since an amplified image sensor such as a CMOS image sensor has advantages such as a low-voltage operation, a low power consumption, ease of being integrally formed with peripheral circuits, and a low cost compared to a charge transfer image sensor such as a charge coupled device (CCD) image sensor, the amplified image sensor is mounted in various electronic devices such as a digital camera, a surveillance camera, and a mobile phone camera.

A solid-state image sensor includes a pixel array in which pixel circuits generating charges via photoelectric conversion are arrayed. Here, a typical pixel array will be described with reference to the accompanying drawings. FIG. 30 is a schematic diagram illustrating a typical pixel array.

As illustrated in FIG. 30, pixel circuits are arrayed in a matrix form in a typical pixel array 100. The typical pixel array 100 includes optically black pixel circuits (hereinafter, referred to as "OB pixel circuits") $P_{OB}$ which are shielded from light in addition to pixel circuits of effective pixels (hereinafter, referred to as "effective pixel circuits") $P_N$ on which light is incident (which are exposed to light). Since a signal or data obtained from the OB pixel circuit $P_{OB}$ contains only unnecessary components such as dark current or noise, the signal or data obtained from the OB pixel circuit $P_{OB}$ is used when performing an offset correct process by which unnecessary components such as dark current or noise are removed from a signal or data obtained from the effective pixel circuit $P_N$.

In a charge transfer image sensor, charges generated by each pixel circuit are sequentially transferred to pixel circuits which are adjacent to each other in a predetermined transfer direction (for example, pixel circuits in the same column which are adjacent to each other in the pixel array 100 in a vertical direction in FIG. 30), and then signals are sequentially acquired in correspondence with the charges. In contrast, in an amplified image sensor, it is possible to selectively acquire a signal corresponding to charges generated in any pixel circuit. In a typical amplified image sensor, a signal line is shared with multiple pixel circuits (for example, pixel circuits in the same row which are arrayed in the pixel array 100 in a lateral direction in FIG. 30) from the viewpoint of simplifying the configuration and control of the amplified image sensor, and speeding up the operation, and the operation is controlled in the unit of the multiple pixel circuits (hereinafter, referred to as a "control group").

In the charge transfer image sensor, if strong light is incident on a portion of pixel circuits, charges superabundantly generated by the pixel circuits overflow along a transfer direction, and therefore the amount of charges in pixel circuits which are arrayed in the transfer direction increases as a whole. Accordingly, white stripes (smear) occur in eventually obtained image data along the transfer direction. In contrast, in the amplified image sensor, in a case where strong light is incident on a portion of pixel circuits, even if the overflow of charges into peripheral pixel circuits (blooming) may occur, charges do not overflow along a specific direction. Therefore, in principle, smear does not occur.

However, in the amplified image sensor, if strong light is incident on a portion of pixel circuits, other pixel circuits belonging to the same control group, where the pixel circuits in the portion belong, are affected, and therefore a defect (hereinafter, referred to as "pseudo-smear") similar to smear may occur in eventually obtained image data.

A cause of the occurrence of pseudo-smear will be described with reference to the accompanying drawings. FIG. 31 is a circuit diagram of a pixel circuit illustrating a cause of pseudo-smear occurring in a solid-state imaging device in the related art. FIG. 32 is a timing chart illustrating the operation of the pixel circuit illustrated in FIG. 31, on which weak light is incident. FIG. 33 is a timing chart illustrating the operation of the pixel circuit illustrated in FIG. 31, on which strong light is incident.

As illustrated in FIG. 31, the effective pixel circuit $P_N$ and the OB pixel circuit $P_{OB}$ have a similar configuration. Each of the effective pixel circuit $P_N$ and the OB pixel circuit $P_{OB}$ includes a photodiode PD that generates charges via photoelectric conversion; a floating diffusion area FD that retains charges transferred from the photodiode PD; a transfer gate 101 through which charges are transferred from the photodiode PD to the floating diffusion area FD; an output transistor 102 that outputs a signal (voltage) corresponding to the amount of charges retained by the floating diffusion area FD; and a reset transistor 103 that discharges charges in the photodiode PD and the floating diffusion area FD to the outside of the effective pixel circuit $P_N$ and the OB pixel circuit $P_{OB}$. In the effective pixel circuit $P_N$ and the OB pixel circuit $P_{OB}$ illustrated in FIG. 31, charges accumulated by the photodiode PD and retained by the floating diffusion area FD are electrons, and each transistor is an N-channel field effect transistor (FET).

An anode of the photodiode PD is grounded. The transfer gate 101 is connected to a transfer control line TX, and is a gate of a transistor, the drain of which is the floating diffusion area FD, and the source of which is a cathode of the photodiode PD. The output transistor 102 has a gate connected to the floating diffusion area FD, a drain connected to a common power supply line VD, and a source connected to an output signal line VS. The reset transistor 103 has a gate connected to a reset control line RST, a drain connected to a reset power supply line VR, and a source connected to the floating diffusion area FD.

The effective pixel circuit $P_N$ and the OB pixel circuit $P_{OB}$ illustrated in FIG. 31 belong to the same control group. Accordingly, the transfer control line TX, the reset control line RST, and the reset power supply line VR are common to the pixel circuits $P_N$ and $P_{OB}$. The common power supply line VD is common to all the pixel circuits $P_N$ and $P_{OB}$ in the pixel array 100.

As illustrated in FIG. 31, the effective pixel circuit $P_N$ includes a parasitic capacitor CP1 between the output signal line VS and the transfer control line TX. The OB pixel circuit $P_{OB}$ includes a parasitic capacitor CP2 between the floating diffusion area FD and the transfer control line TX.

In FIG. 31, only the parasitic capacitors CP1 and CP2 specifically related to the aforementioned problem are illustrated, and the illustration of other parasitic capacitors is omitted.

The effective pixel circuit $P_N$ and the OB pixel circuit $P_{OB}$ perform correlated double sampling (CDS) by which a difference between the voltage of the output signal line VS when the floating diffusion area FD is reset and the voltage of the output signal line VS when charges are transferred from the photodiode PD to the floating diffusion area FD. Effective pixel data for image data and OB pixel data are obtained by performing analog-to-digital (A/D) conversion on the differences obtained from the effective pixel circuit $P_N$ and the OB pixel circuit $P_{OB}$.

Specifically, as illustrated in FIGS. 32 and 33, first, during a period Tin, the reset control line RST goes to a high voltage H, and therefore the reset transistor 103 enters an ON mode (state in which a gate-to-source voltage is higher than a threshold voltage, and this is the same in the following description), and charges retained by the floating diffusion area FD are discharged to the outside of the pixel circuits $P_N$ and $P_{OB}$ via the reset power supply line VR at the high voltage H. Subsequently, during a period $T_{102}$, the reset control line RST goes to a low voltage L, and therefore the reset transistor 103 enters an OFF mode (contrary to an ON mode, a state in which the gate-to-source voltage is lower than or equal to the threshold voltage, and which may include a case where leak current or the like flows, and this is the same in the following description). At the end of the period $T_{102}$, a voltage $V_{rN}$ of the output signal line VS in a state where charges are not retained in the floating diffusion area FD of the effective pixel circuit $P_N$ and a voltage $V_{rOB}$ of the output signal line VS in a state where charges are not retained in the floating diffusion area FD of the OB pixel circuit $P_{OB}$ are sampled. Subsequently, during a period $T_{103}$, the transfer control line TX goes to the high voltage H, and therefore a transistor including the transfer gate 101 as a gate enters an ON mode, and charges in the photodiode PD are transferred to the floating diffusion area FD. Subsequently, during a period $T_{104}$, the transfer control line TX goes to the low voltage L, and therefore the transistor including the transfer gate 101 as a gate enters an OFF mode. At the end of the period $T_{104}$, a voltage $V_{sN}$ of the output signal line VS which corresponds to charges retained in the floating diffusion area FD of the effective pixel circuit $P_N$ and a voltage $V_{sOB}$ of the output signal line VS which corresponds to charges retained in the floating diffusion area FD of the OB pixel circuit $P_{OB}$ are sampled. In this case, a correlated double sampled difference obtained from the effective pixel circuit $P_N$ is $V_{rN}-V_{sN}$, and a correlated double sampled difference obtained from the OB pixel circuit $P_{OB}$ is $V_{rOB}-V_{sOB}$. Effective pixel data for image data and OB pixel data are obtained by performing A/D conversion on the differences.

In FIGS. 32 and 33, the voltage of the output signal line VS of the OB pixel circuit $P_{OB}$ fluctuates during the period $T_{104}$. The reason for this is that a fluctuation in the voltage of the output signal line VS of the effective pixel circuit $P_N$ is transmitted to the floating diffusion area FD of the OB pixel circuit $P_{OB}$ via the parasitic capacitor CP1, the transfer control line TX, and the parasitic capacitor CP2. In FIGS. 32 and 33, a fluctuation in the voltage of the output signal line VS is illustrated in an emphasized manner, and the illustration of noise superimposed on the transfer control line TX or the reset control line RST is omitted.

As illustrated in FIG. 32, if light incident on the effective pixel circuit $P_N$ is weak, and a fluctuation in the voltage of the output signal line VS is small, a fluctuation in the voltage of the output signal line VS of the OB pixel circuit $P_{OB}$ also is small. Accordingly, the correlated double sampled difference $V_{rOB}-V_{sOB}$ is close to zero, and obtained OB pixel data is close to the minimum value. Since OB pixel data is data obtained from the OB pixel circuit $P_{OB}$ which is shielded from light as described above, in an ideal mode in which there is no dark current, noise, or the like, the OB pixel data is data that has to be the minimum value.

In contrast, as illustrated in FIG. 33, if light incident on the effective pixel circuit $P_N$ is strong, and a fluctuation in the voltage of the output signal line VS of the effective pixel circuit $P_N$ is large, a fluctuation in the voltage of the output signal line VS of the OB pixel circuit $P_{OB}$ also is large. Accordingly, the correlated double sampled difference $V_{rOB}-V_{sOB}$ increases, and obtained OB pixel data also increases.

Although FIG. 33 illustrates mainly the OB pixel circuit $P_{OB}$, other effective pixel circuits $P_N$, on which strong light is not incident and which belong to the same control group as that of the effective pixel circuit $P_N$ on which strong light is incident, receive the same effect as that on the OB pixel circuit $P_{OB}$. That is, effective pixel data obtained from the other effective pixel circuits $P_N$ also increases from original unaffected values. Accordingly, there is an increase as a whole in effective pixel data and OB pixel data obtained from the pixel circuits $P_N$ and $P_{OB}$ belonging to the same control group as that of the effective pixel circuit $P_N$ on which strong light is incident. An increase in data of the effective pixels and the OB pixels along the control group appears as white (bright) pseudo-smear in image data.

In a case where pseudo-smear has occurred as described above, each of effective pixel data and OB pixel data increases. Therefore, it is possible to reduce or eliminate pseudo-smear by performing an offset correction process on the effective pixel data based on the OB pixel data. The offset correction process will be described with reference to the accompanying drawings. FIGS. 34 and 35 are schematic views illustrating an offset correction process in a case where pseudo-smear has occurred. FIGS. 34(a) and 35(a) illustrate image data on which an offset correction process is not performed. FIGS. 34(b) and 35(b) illustrate image data on which an offset correction process is performed.

Since strong light is incident on the effective pixel circuits $P_N$ at the center of the pixel array 100, a high-luminance area occurs at a position (center) corresponding to the effective pixel circuits $P_N$ in the image data illustrated in FIG. 34(a). As a result, pseudo-smear has occurred in a lateral direction (row direction) in FIG. 34(a). If an offset correction process (for example, a correction process of subtracting OB pixel data from effective pixel data) is performed on effective pixel data containing pseudo-smear such that an OB pixel containing the pseudo-smear illustrated in FIG. 34(a) become a black pixel, as illustrated in FIG. 34(b), it is possible to reduce or eliminate the pseudo-smear via cancellation.

However, in a case where an offset correction process is performed, it may not be possible to reduce or eliminate pseudo-smear, and image data may be adversely affected. The image data illustrated in FIG. 35(a) contains a high-luminance area at the same position as that in the image data illustrated in FIG. 34(a), and pseudo-smear appears stronger than that in the image data illustrated in FIG. 34(a) (that is, the amount of increase in data due to pseudo-smear is large). In this case, if an offset correction process is performed, the effective pixel is over-corrected based on the OB image data which is excessively large. As a result, pseudo-smear which is more black (darker) than the surrounding area may remain, which is a problem (a black pseudo-smear will be described later with reference to FIG. 3).

In order to reduce the occurrence of pseudo-smear, PTL 1 proposes a solid-state image sensor that performs correction by promptly absorbing a fluctuation in the output of an OB pixel circuit via a decrease in OB clamp time constant in a case where an AGC gain is greater than a predetermined value, and a high-luminance object detecting circuit detects a high-luminance object. PTL 2 proposes a solid-state image sensor that sets a voltage based on a pixel reset potential and, performs correction in correspondence with the threshold voltage of an element of control means so as to clip a lower limit of the potential of a vertical signal line at a clip potential slightly lower than a saturation potential.

PTL 3 proposes a solid-state image sensor that not only sequentially performs the operation of an electronic shutter (start of the accumulation of charges), the accumulation of charges, and the reading of charges (transfer of charges accumulated in a photodiode to a floating diffusion area), but also clears charges accumulated by a photodiode after the reading of charges and during a stand-by period before the operation of the electronic shutter so as to prevent charges, which are accumulated by the photodiode, from overflowing into adjacent pixel circuits and the like (blooming).

CITATION LIST

Patent Literature

PTL 1: Japanese Unexamined Patent Application Publication No. 2009-5169
PTL 2: Japanese Unexamined Patent Application Publication No. 2009-278454
PTL 3: Japanese Unexamined Patent Application Publication No. 2012-19492

SUMMARY OF INVENTION

Technical Problem

However, since the solid-state image sensor proposed in PTL 1 requires a separate circuit for detecting a high-luminance object, the configuration and operation of the solid-state image sensor become complicated. In the solid-state image sensor, even if the OB clamp time constant is decreased, it may not be possible to absorb a fluctuation in the output of an OB pixel circuit. In this case, over-correction is performed, and thus, black stripes (pseudo-smear) may occur. That is, the solid-state image sensor proposed in PTL 1 has a problem in that the configuration and operation are complicated, and it is difficult to effectively reduce the occurrence of pseudo-smear. Since the solid-state image sensor proposed in PTL 2 requires a separate circuit for clipping the vertical signal line, the configuration and operation of the solid-state image sensor become complicated. If the voltage of the vertical signal line decreases to a voltage close to the clip voltage during a normal imaging operation, current leaks from a clip circuit. As a result, correlated double sampling is not accurately performed, and obtained image data may degrade, which is a problem.

In the solid-state image sensor proposed in PTL 3, the occurrence of blooming during the stand-by period can be prevented, but charges are generated and accumulated after the operation of the electronic shutter. Accordingly, if strong light is incident on the solid-state image sensor, a large amount of charges is generated by the photodiode, and the large amount of charges is all transferred to the floating diffusion area. As a result, in the solid-state image sensor, the occurrence of pseudo-smear cannot be reduced.

An object of the present invention is to provide a solid-state image sensor and an electronic information device that are capable of effectively reducing the occurrence of pseudo-smear with a simple configuration and operation.

Solution to Problem

In order to achieve that object, according to an aspect of the present invention, there is provided a solid-state image sensor including: multiple pixel circuit units, each including a photoelectric conversion unit that generates charges via photoelectric conversion and accumulates the generated charges, a floating diffusion unit that retains charges transferred from the photoelectric conversion unit, a transfer unit through which charges accumulated by the photoelectric conversion unit are transferred to the floating diffusion unit, an output unit that outputs a signal corresponding to the amount of charges retained by the floating diffusion unit, and a reset unit that discharges charges retained by the floating diffusion unit to the outside; and an A/D conversion unit that acquires a signal output from the output unit, and performs A/D conversion on the acquired signal using a set gain. At least one of the pixel circuit units is configured such that charges transferred from the photoelectric conversion unit to the floating diffusion unit and retained by the floating diffusion unit are limited so as not to exceed an upper limit amount which is set to be smaller by the extent of an increase in the gain.

In the solid-state image sensor with the aforementioned features, at least one of the pixel circuit units may be configured to perform at least one of a first upper limit amount limiting operation in which charges retained by the floating diffusion unit are limited so as not to exceed the upper limit amount, and a second upper limit amount limiting operation in which charges accumulated by the photoelectric conversion unit are limited so as not to exceed the upper limit amount.

The solid-state image sensor with the aforementioned features may further include a charge retaining unit that temporarily retains charges before being transferred from the photoelectric conversion unit to the floating diffusion unit. The transfer unit may include a first transfer unit through which charges accumulated by the photoelectric conversion unit are transferred to the charge retaining unit, and a second transfer unit through which charges retained by the charge retaining unit are transferred to the floating diffusion unit. At least one of the pixel circuit units may be configured to perform at least one of a first upper limit amount limiting operation in which charges retained by the floating diffusion unit are limited so as not to exceed the upper limit amount, a second upper limit amount limiting operation in which charges accumulated by the photoelectric conversion unit are limited so as not to exceed the upper limit amount, and a third upper limit amount limiting operation in which charges retained by the charge retaining unit are limited so as not to exceed the upper limit amount.

In the solid-state image sensor with the aforementioned features, at least one of the pixel circuit units may be configured such that the second upper limit amount limiting operation is performed in such a way that the transfer unit transfers charges exceeding the upper limit amount from the photoelectric conversion unit to the floating diffusion unit, and the reset unit discharges charges which are transferred from the photoelectric conversion unit to the floating diffusion unit.

The solid-state image sensor with the aforementioned features preferably further includes an intermediate voltage generation unit configured to generate an intermediate voltage of a magnitude between a first voltage and a second voltage in correspondence with the gain. In at least one of the pixel circuit units, preferably, the transfer unit forms a control terminal of a transistor which enters an ON mode if the first voltage is applied thereto, and enters an OFF mode if the second voltage is applied thereto, and when the second upper limit amount limiting operation is performed, the intermediate voltage is applied to the transfer unit.

In the solid-state image sensor with the aforementioned features, at least one of the pixel circuit units may be configured such that the third upper limit amount limiting operation is performed in such a way that the second transfer unit transfers charges exceeding the upper limit amount from the charge retaining unit to the floating diffusion unit, and the reset unit discharges charges which are transferred from the charge retaining unit to the floating diffusion unit.

The solid-state image sensor with the aforementioned features preferably further includes an intermediate voltage generation unit configured to generate an intermediate voltage of a magnitude between a first voltage and a second voltage in correspondence with the gain. In at least one of the pixel circuit units, preferably, the second transfer unit forms a control terminal of a transistor which enters an ON mode if the first voltage is applied thereto, and enters an OFF mode if the second voltage is applied thereto, and when the third upper limit amount limiting operation is performed, the intermediate voltage is applied to the second transfer unit.

In the solid-state image sensor with the aforementioned features, at least one of the pixel circuit units may be configured such that the first upper limit amount limiting operation is performed in such a way that the reset unit discharges charges exceeding the upper limit amount from the floating diffusion unit, and the transfer unit transfers charges accumulated by the photoelectric conversion unit to the floating diffusion unit.

The solid-state image sensor with the aforementioned features preferably further includes an intermediate voltage generation unit configured to generate an intermediate voltage of a magnitude between a first voltage and a second voltage in correspondence with the gain. In at least one of the pixel circuit units, preferably, the reset unit includes a transistor which enters an ON mode if the first voltage is applied to a control terminal of the transistor, and enters an OFF mode if the second voltage is applied to the control terminal, and when the first upper limit amount limiting operation is performed, the intermediate voltage is applied to the control terminal of the transistor of the reset unit.

In the solid-state image sensor with the aforementioned features, at least one of the pixel circuit units may be configured to include a discharge unit that discharges charges accumulated by the photoelectric conversion unit to the outside, and the second upper limit amount limiting operation is performed such that the discharge unit discharges charges, which exceed the upper limit amount, from the photoelectric conversion unit.

The solid-state image sensor with the aforementioned features preferably further includes an intermediate voltage generation unit configured to generate an intermediate voltage of a magnitude between a first voltage and a second voltage in correspondence with the gain. In at least one of the pixel circuit units, preferably, the discharge unit includes a transistor which enters an ON mode if the first voltage is applied to a control terminal of the transistor, and enters an OFF mode if the second voltage is applied to the control terminal, and when the second upper limit amount limiting operation is performed, the intermediate voltage is applied to the control terminal of the transistor of the discharge unit.

In the solid-state image sensor with the aforementioned features, all the transistors are preferably configured such that the first voltage, the intermediate voltage, and the second voltage are selectively applied to the control terminals.

The solid-state image sensor with the aforementioned features preferably further includes an offset correction processing unit that performs an offset correction process on data obtained by performing A/D conversion on signal, which is output from a pixel circuit unit exposed to light, by the A/D conversion unit, based on data obtained by performing A/D conversion on a signal, which is output from a pixel circuit unit shielded from light, by the A/D conversion unit.

In the solid-state image sensor with the aforementioned features, a period during which the second voltage is applied to the control terminal of the transistor preferably accounts for 90% or greater of a period that is the sum of the period during which the second voltage is applied to the control terminal of the transistor and a period during which the intermediate voltage is applied to the control terminal of the transistor.

In the solid-state image sensor with the aforementioned features, the polarity of the second voltage is preferably different from that of the first voltage.

In the solid-state image sensor with the aforementioned features, the intermediate voltage generation unit preferably generates the intermediate voltage, which has a polarity different from that of the first voltage, in correspondence with the magnitude of the gain.

In the solid-state image sensor with the aforementioned features, the upper limit amount is preferably larger than or equal to the lower limit amount of charges at which data obtained via A/D conversion using the gain set by the A/D conversion unit has the maximum value, and the upper limit amount is smaller than or equal to 1.5 times the lower limit amount.

An electronic information device of the present invention includes the aforementioned solid-state image sensor.

Advantageous Effects of Invention

According to the solid-state image sensor and the electronic information device with the aforementioned features, it is possible to directly reduce a fluctuation in the output of each of the pixel circuit units belonging to the same control group, which is a cause of pseudo-smear, by limiting the upper limit amount of charges which are transferred from the photoelectric conversion unit to the floating diffusion unit and are retained in the floating diffusion unit. As a result, it is possible to effectively reduce the occurrence of pseudo-smear by adopting a simple configuration and operation in which the upper limit amount of charges eventually retained in the floating diffusion unit is limited.

According to the solid-state image sensor and the electronic information device with the aforementioned features, the upper limit amount of charges eventually retained in the floating diffusion unit is further decreased to the extent corresponding to the condition in which pseudo-smear is likely to appear due to a high A/D conversion gain. As a result, it is possible to effectively reduce the occurrence of pseudo-smear as necessary.

BRIEF DESCRIPTION OF DRAWINGS

FIG. 35 is a schematic view illustrating an offset correction process in a case where pseudo-smear has occurred.

DESCRIPTION OF EMBODIMENTS

<<Solid-State Image Sensor>>

Hereinafter, solid-state image sensors of embodiments of the present invention will be described with reference to the accompanying drawings. Hereinafter, for illustrative and descriptive purposes, a CMOS image sensor, which generates and accumulates electrons and includes multiple pixel circuits including N-channel FETs, will be described as a specific example of the solid-state image sensor of each embodiment of the present invention.

<First Embodiment>

Figure 1:
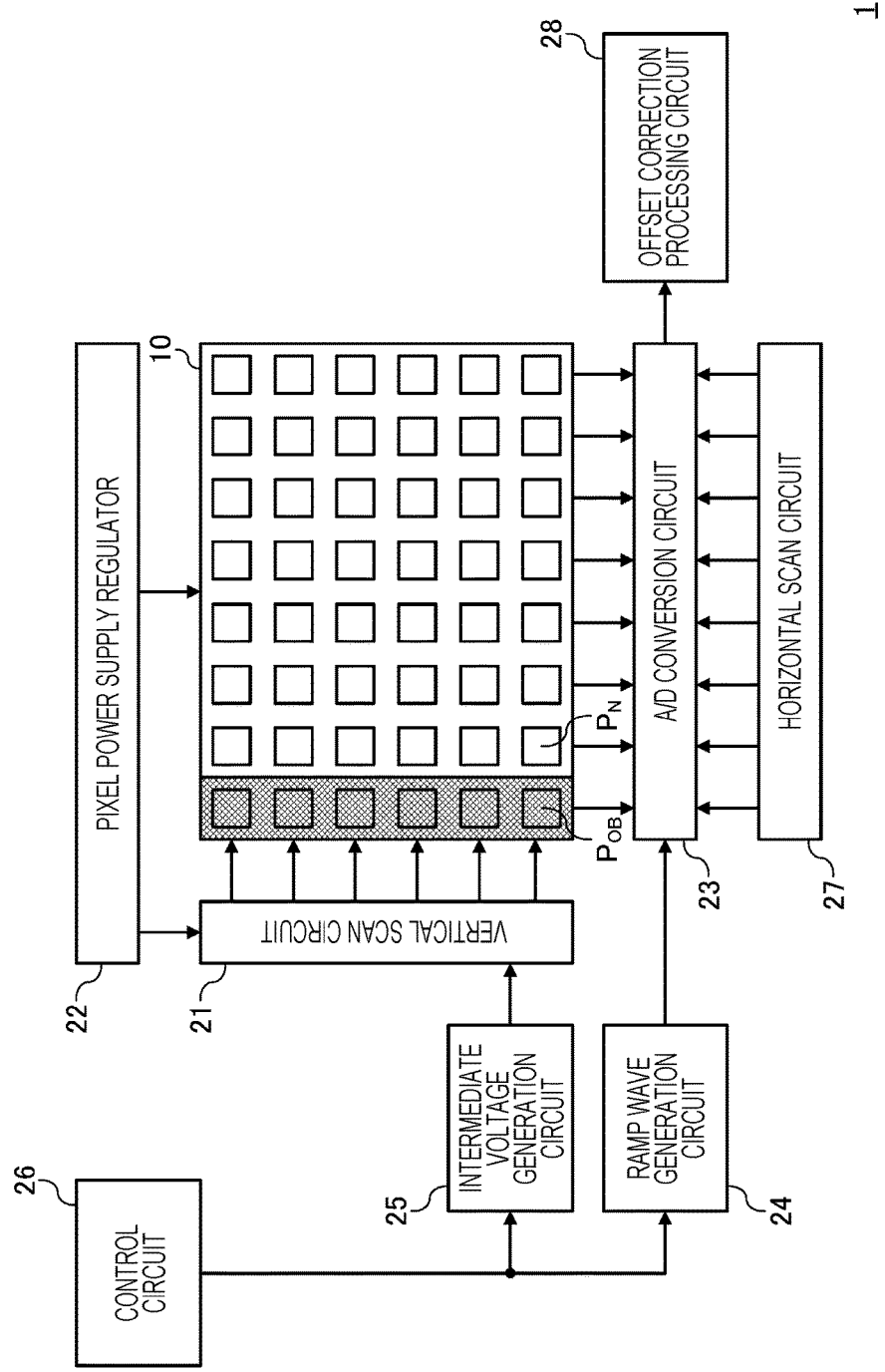
FIG. 1 is a block diagram illustrating the configuration of a solid-state image sensor of a first embodiment of the present invention.
Figure 2:
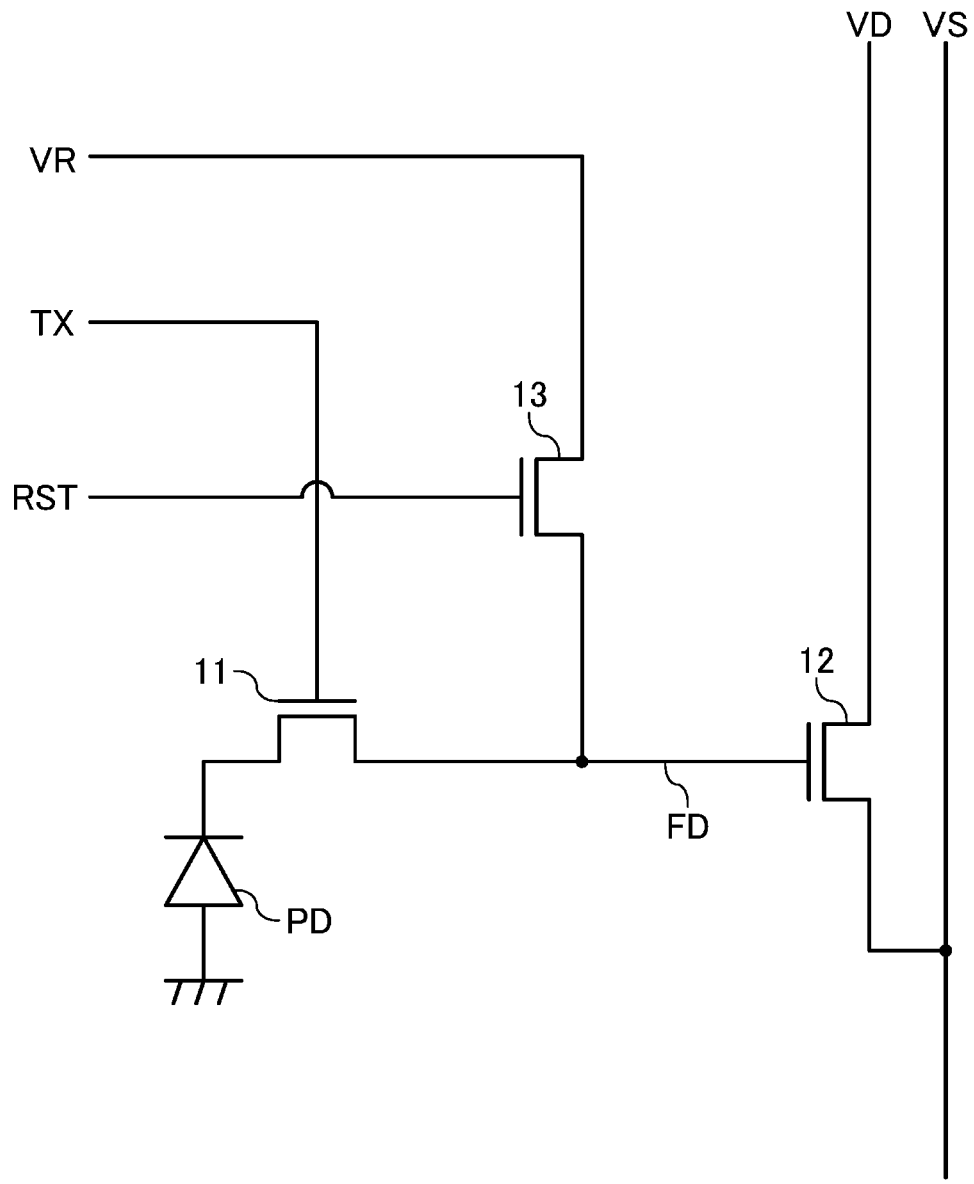
FIG. 2 is a circuit diagram of a pixel circuit of the solid-state image sensor illustrated in FIG. 1.

A solid-state image sensor of a first embodiment of the present invention will be described with reference to the accompanying drawings. FIG. 1 is a block diagram illustrating the configuration of the solid-state image sensor of the first embodiment of the present invention. FIG. 2 is a circuit diagram of a pixel circuit of the solid-state image sensor illustrated in FIG. 1.

As illustrated in FIG. 1, a solid-state image sensor 1 includes a pixel array 10; a vertical scan circuit 21; a pixel power supply regulator 22; an A/D conversion circuit (A/D conversion unit) 23; a ramp wave generation circuit 24; an intermediate voltage generation circuit (intermediate voltage generation unit) 25; a control circuit 26; a horizontal scan circuit 27; and an offset correction processing circuit (offset correction processing unit) 28.

The pixel array 10 includes multiple pixel circuits (pixel circuit units) $P_N$ and $P_{OB}$ which are arrayed in a matrix pattern. Specific, the pixel array 10 includes multiple effective pixel circuits $P_N$ and multiple OB pixel circuits $P_{OB}$. The effective pixel circuit $P_N$ is a pixel circuit of an effective pixel on which light is incident (which is exposed to light). The OB pixel circuit $P_{OB}$ is an optically black pixel circuit that is shielded from light. In FIG. 1, for illustrative and descriptive purposes, a small number of the pixel circuits $P_N$ and $P_{OB}$ of the pixel array 10 are illustrated on a very large scale.

Figure 31:
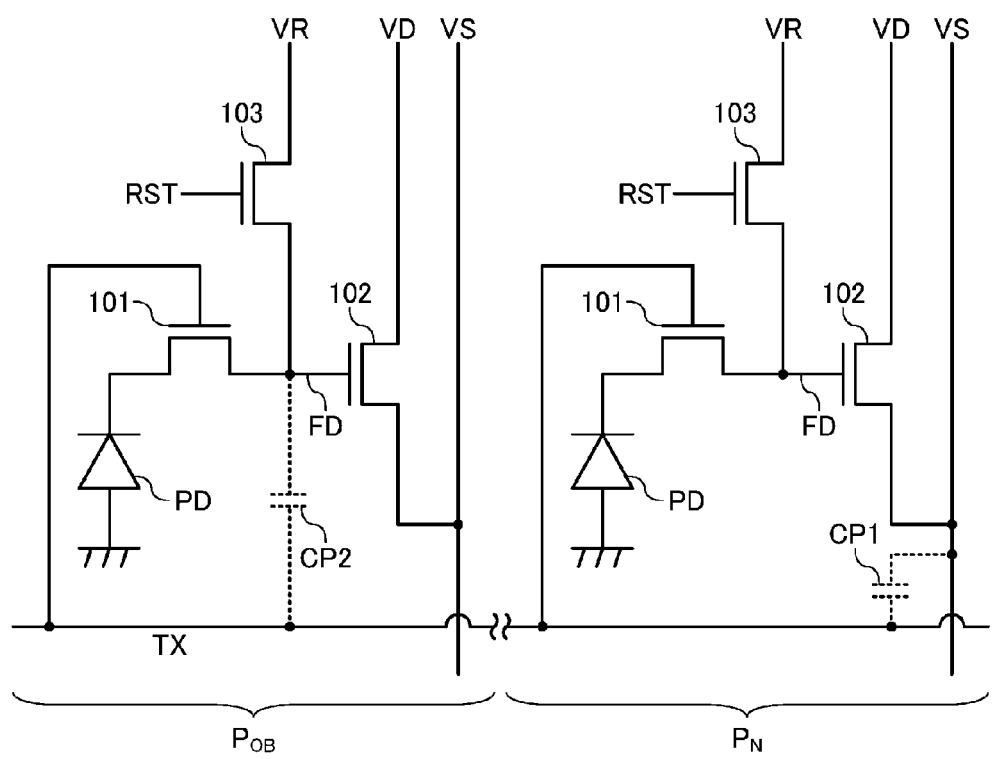
FIG. 31 is a circuit diagram of a pixel circuit illustrating a cause of pseudo-smear occurring in a solid-state imaging device in the related art.

Any one of the effective pixel circuits $P_N$ and the OB pixel circuits $P_{OB}$ has a circuit configuration illustrated in FIG. 2. As illustrated in FIG. 31, at least a transfer control line TX is common to the effective pixel circuits $P_N$ and the OB pixel circuit $P_{OB}$ which belong to the same control group. A reset control line RST or a reset power supply line VR may be common to the effective pixel circuits $P_N$ and the OB pixel circuit $P_{OB}$ which belong to the same control group.

As illustrated in FIG. 2, each of the effective pixel circuit $P_N$ and the OB pixel circuit $P_{OB}$ includes a photodiode (photoelectric conversion unit) PD that generates charges via photoelectric conversion; a floating diffusion area (floating diffusion unit) FD that retains charges transferred from the photodiode PD; a transfer gate (transfer unit) 11 through which charges are transferred from the photodiode PD to the floating diffusion area FD; an output transistor (output unit) 12 that outputs a signal (voltage) corresponding to the amount of charges retained by the floating diffusion area FD; and a reset transistor (reset unit) 13 that discharges charges in the photodiode PD and the floating diffusion area FD to the outside of the effective pixel circuit $P_N$ and the OB pixel circuit $P_{OB}$.

An anode of the photodiode PD is grounded. The transfer gate 11 is connected to the transfer control line TX, and is a gate of a transistor, the drain of which is the floating diffusion area FD, and the source of which is a cathode of the photodiode PD. The output transistor 12 has a gate connected to the floating diffusion area FD, a drain connected to a common power supply line VD, and a source connected to an output signal line VS. The reset transistor 13 has a gate connected to the reset control line RST, a drain connected to the reset power supply line VR, and a source connected to the floating diffusion area FD.

The vertical scan circuit 21 outputs a signal (voltage) to control the operation of the pixel circuits $P_N$ and $P_{OB}$ in the pixel array 10. As described above, signal lines (for example, the transfer control line TX, the reset control line RST, and the reset power supply line VR) for controlling the operation of the pixel circuits $P_N$ and $P_{OB}$ are common to the pixel circuits $P_N$ and $P_{OB}$ (for example, the pixel circuits $P_N$ and $P_{OB}$ in the same row of the pixel array 10 which are arrayed in a lateral direction in FIG. 1) which belong to the same control group in the pixel array 10. If the vertical scan circuit 21 applies a signal (voltage) to a common signal line, the pixel circuits $P_N$ and $P_{OB}$ belonging to the same control group are controlled such that the pixel circuits $P_N$ and $P_{OB}$ perform the same operation at the same timing.

The pixel power supply regulator 22 supplies power for operation of all the pixel circuits $P_N$ and $P_{OB}$ in the pixel array 10. The common power supply line VD is common to all the pixel circuits $P_N$ and $P_{OB}$ in the pixel array 10. The pixel power supply regulator 22 supplies a certain magnitude of voltage to the common power supply line VD. The pixel power supply regulator 22 supplies power to the vertical scan circuit 21 so as to generate a voltage to control the operation of the pixel circuits $P_N$ and $P_{OB}$.

The A/D conversion circuit 23 acquires the voltage of the output signal line VS, and performs A/D conversion on the acquired voltage using a set gain. For example, after the A/D conversion circuit 23 obtains a difference between the voltage of the output signal line VS when the floating diffusion area FD is reset and the voltage of the output signal line VS when charges are transferred from the photodiode PD to the floating diffusion area FD via correlated double sampling, the A/D conversion circuit 23 performs A/D conversion on the voltage difference.

The ramp wave generation circuit 24 generates a ramp wave (sawtooth wave) of a slope corresponding to a gain set by the control circuit 26, and applies the generated ramp wave to the A/D conversion circuit 23. For example, the A/D conversion circuit 23 performs A/D conversion in such a way as to count the time from when a ramp wave applied from the ramp wave generation circuit 24 has risen to when the ramp wave has increased to a voltage (correlated double sampled difference), which is an A/D conversion target, or higher. In this case, the number of counts decreases to the extent of a decrease in gain (the slope of the ramp wave is steep), and thus the value of A/D converted data is small. In contrast, the number of counts increases to the extent of an increase in gain (the slope of the ramp wave is gradual), and thus the value of A/D converted data is large.

The intermediate voltage generation circuit 25 generates an intermediate voltage of a magnitude corresponding to the gain set by the control circuit 26, and applies the generated intermediate voltage to the vertical scan circuit 21. The vertical scan circuit 21 controls the operation of at least a portion of transistors of the pixel circuits $P_N$ and $P_{OB}$ using the intermediate voltage applied from the intermediate voltage generation circuit 25 (details will be described later).

The control circuit 26 sets a gain, and applies a signal or data indicating the magnitude of the gain to the ramp wave generation circuit 24 and the intermediate voltage generation circuit 25. For example, the control circuit 26 sets a gain higher by the extent of the darkness of an object (that is, light incident on the pixel array 10 is weak as a whole, and thus by the extent of a decrease in the amount of charges generated by the photodiode PD and retained in the floating diffusion area FD). Alternatively, for example, the control circuit 26 sets a gain (a gain corresponding to an imaging mode such as "clear weather" or "night scene" selected by a user, a gain as a numeric value directly specified by the user, or the like) as instructed by the user of an electronic information device in which the solid-state image sensor 1 is mounted.

The horizontal scan circuit 27 controls the timing when the A/D conversion circuit 23 outputs A/D converted data. Specifically, the horizontal scan circuit 27 controls the data output timing of the A/D conversion circuit 23 such that one item of data or multiple items of data are selectively input to the offset correction processing circuit 28.

The offset correction processing circuit 28 performs an offset correct process on data output from the A/D conversion circuit 23. Specifically, the offset correction processing circuit 28 performs an offset correction process on data which is obtained by performing A/D conversion on an output signal (voltage) of the effective pixel circuit $P_N$ via the A/D conversion circuit 23, based on data which is obtained by performing A/D conversion on an output signal (voltage) of the OB pixel circuit $P_{OB}$ via the A/D conversion circuit 23. Specifically, the offset correction processing circuit 28 subtracts A/D converted data of an output signal (voltage) of an OB pixel circuit $P_{OB}$ from A/D converted data of an output signal (voltage) of the effective pixel circuit $P_N$ belonging to the same control group as that of the OB pixel circuit $P_{OB}$.

Figure 3:
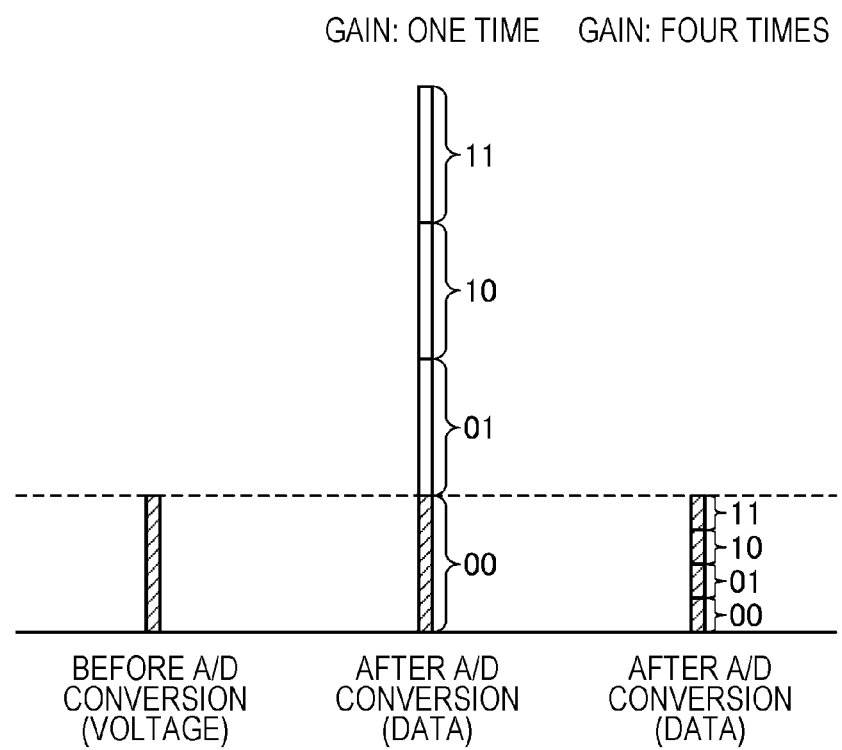
FIG. 3 is a diagram illustrating an example of an effect of a gain on A/D conversion.

A relationship between an A/D conversion gain and pseudo-smear will be described with reference to the accompanying drawings. FIG. 3 is a diagram illustrating the relationship between the A/D conversion gain and the pseudo-smear. FIG. 3 illustrates a signal (voltage) before A/D conversion, data that is obtained by performing A/D conversion on the signal using one times the gain, and data that is obtained by performing A/D conversion on the signal using four times the gain. FIG. 3 illustrates a very simple case where A/D converted data is two bits.

As illustrated in FIG. 3, even if a voltage before A/D conversion is such a low level that data obtained by performing A/D conversion thereon using one times the gain becomes the minimum value [00], if A/D conversion is performed on the voltage using four times the gain, data becomes the maximum value [11]. As such, if the gain is increased, even if a voltage before A/D conversion is a low level, A/D converted data can be substantially increased.

Figure 33:
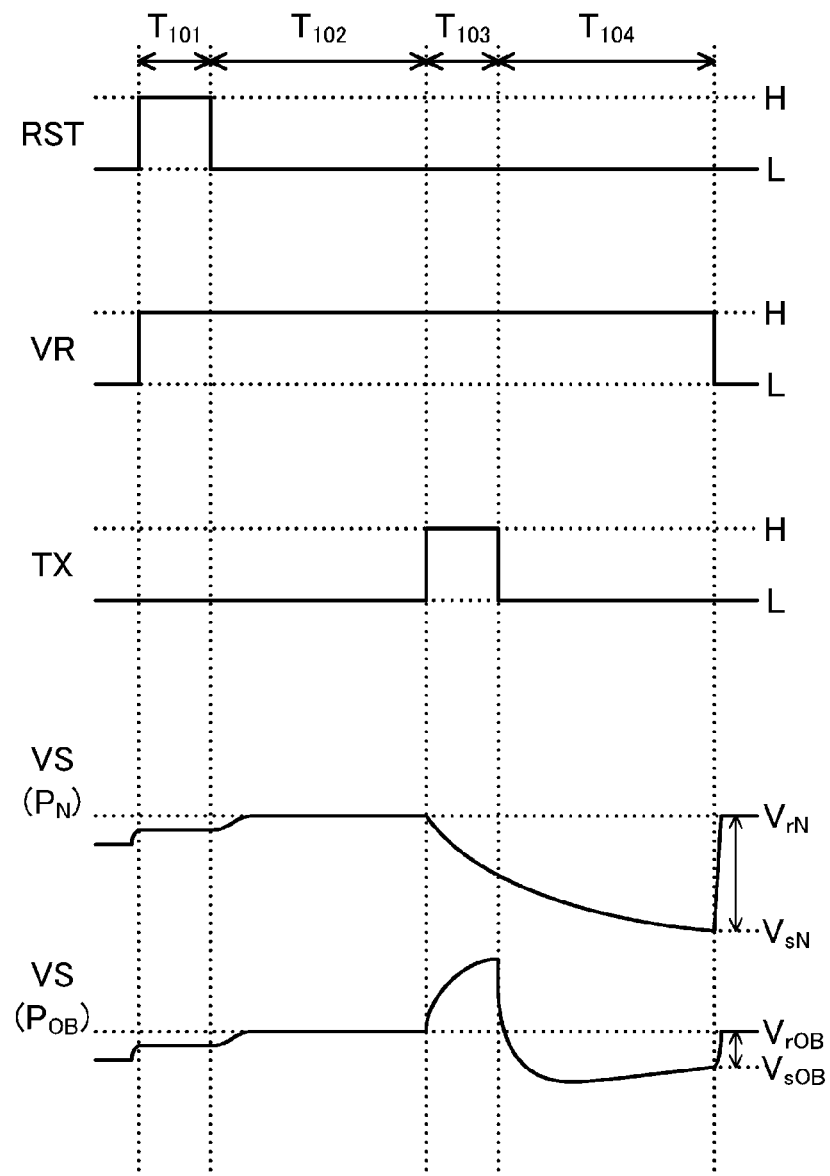
FIG. 33 is a timing chart illustrating the operation of the pixel circuit illustrated in FIG. 31, on which strong light is incident.

Accordingly, if the gain is increased, in a case where strong light is incident on an effective pixel circuit $P_N$, and an output signal (voltage) of other pixel circuits $P_N$ and $P_{OB}$ belonging to the same control group as that of the effective pixel circuit $P_N$ is increased (refer to FIGS. 31 and 33), data obtained from the pixel circuits $P_N$ and $P_{OB}$ can be substantially increased.

Figure 34:
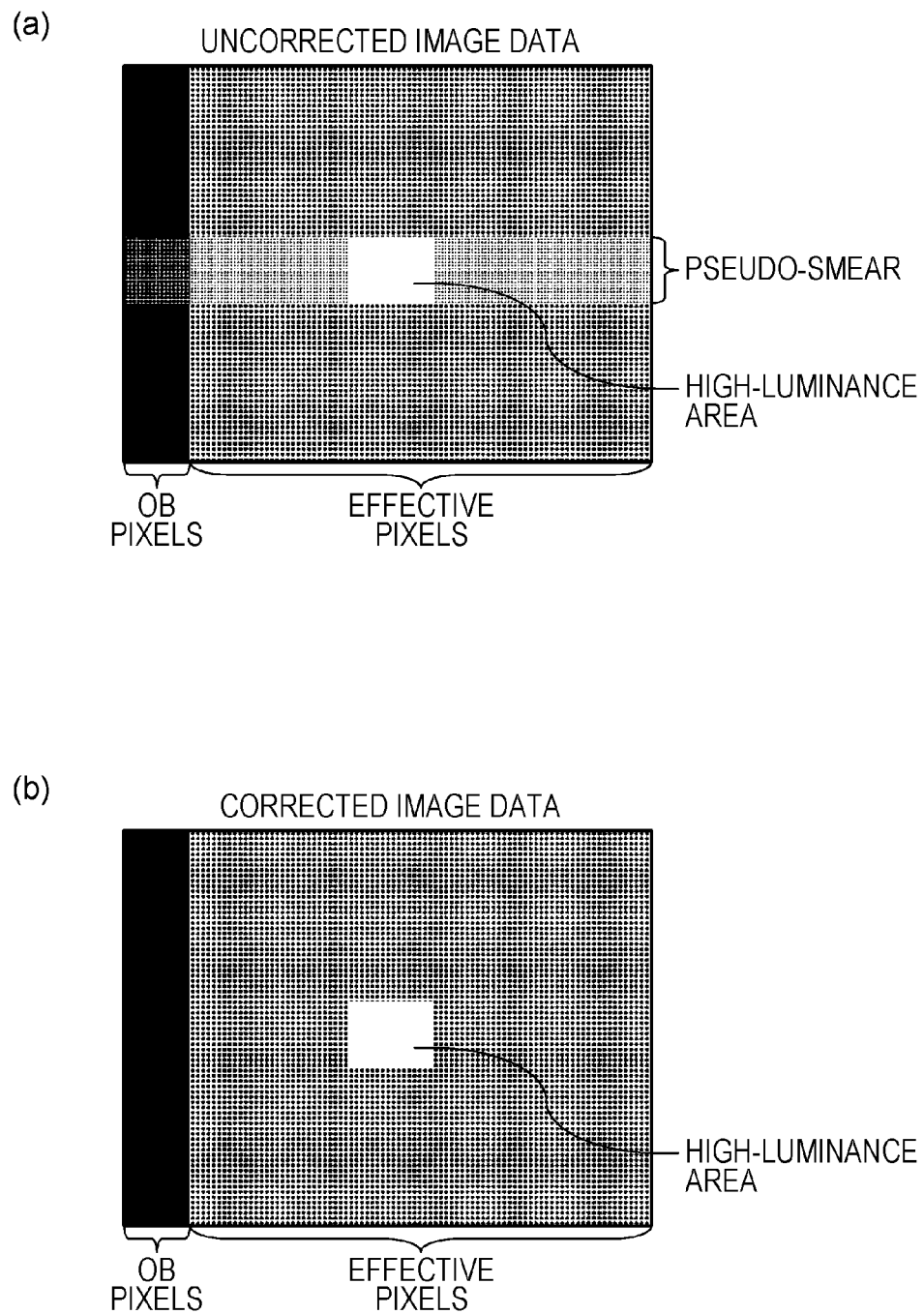
FIG. 34 is a schematic view illustrating an offset correction process in a case where pseudo-smear has occurred.

As described above, if an effect of an effective pixel circuit $P_N$, on which strong light is incident, on other pixel circuits $P_N$ and $P_{OB}$ is large, it is difficult to cancel out the effect well, and thus, pseudo-smear is likely to appear in image data, which is a problem (refer to FIGS. 34 and 35).

Figure 32:
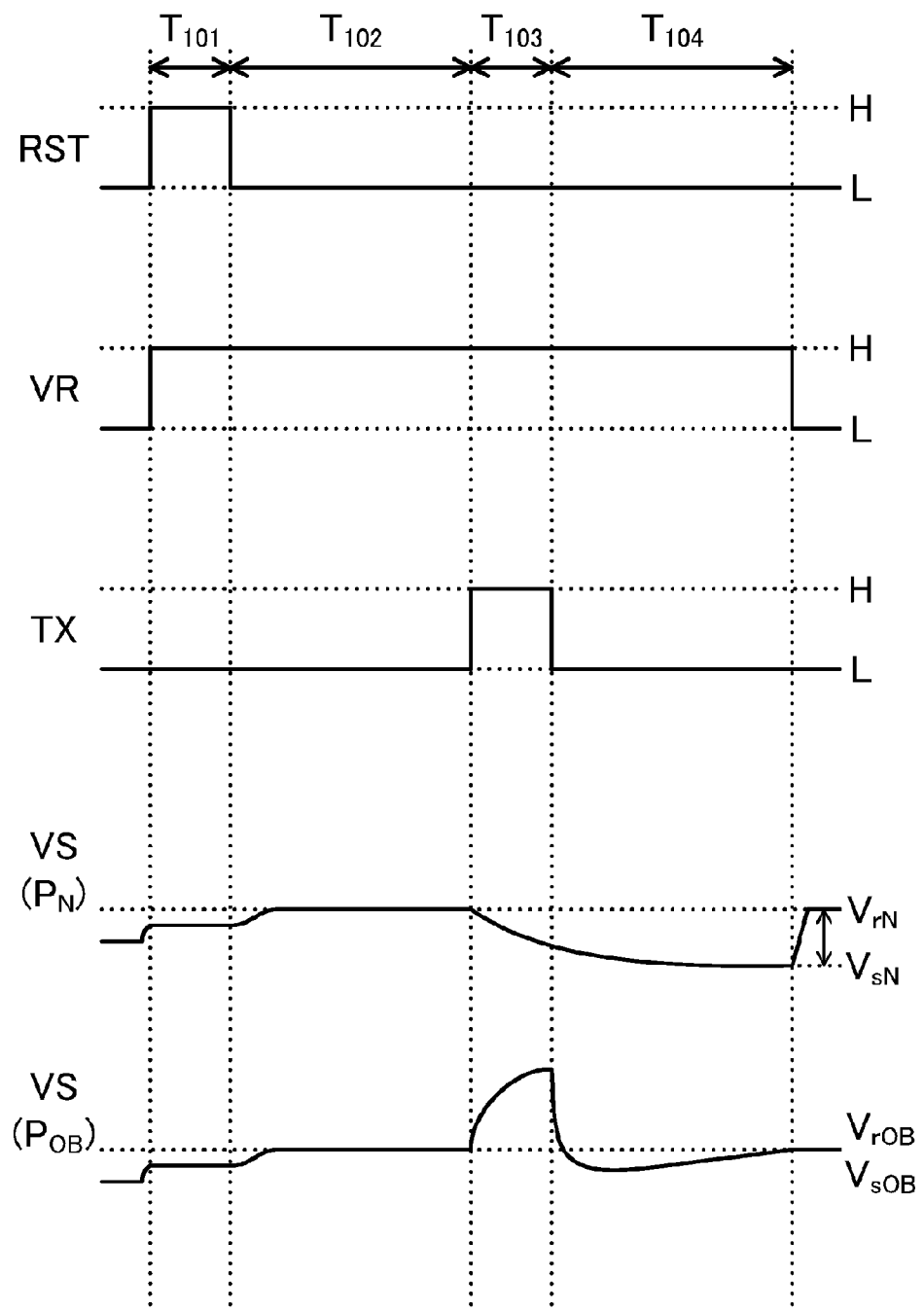
FIG. 32 is a timing chart illustrating the operation of the pixel circuit illustrated in FIG. 31, on which weak light is incident.

Hereinafter, this problem will be continuously described with reference to FIG. 3. In the following description, the voltage before A/D conversion illustrated in FIG. 3 is assumed to be a correlated double sampled difference $(V_{rOB}-V_{sOB})$ (refer to FIGS. 32 and 33) between signals (voltages) obtained from the OB pixel circuit $P_{OB}$ affected by the effective pixel circuit $P_N$ on which strong light is incident. A/D converted data for gains is assumed to be data obtained by performing A/D conversion on the correlated double sampled difference using each gain.

As illustrated in FIG. 3, if A/D conversion is performed on the difference, which is obtained from the OB pixel circuit $P_{OB}$, using one times the gain, resultant data becomes the minimum value [00]. Accordingly, even if an offset correction process is performed on A/D converted data of the difference, which is obtained from the effective pixel circuit $P_N$, based on that data, the A/D converted data is not corrected at all, or is slightly corrected. That is, if the gain is low, pseudo-smear is unlikely to appear in image data (refer to FIG. 34).

In contrast, if A/D conversion is performed on the difference, which is obtained from the OB pixel circuit $P_{OB}$, using four times the gain, resultant data becomes the maximum value [11]. Accordingly, even if an offset correction process is performed on A/D converted data of the difference, which is obtained from the effective pixel circuit $P_N$, based on that data, the A/D converted data is substantially corrected. That is, if the gain is high, pseudo-smear is likely to appear in image data. Particularly, in the very simple example illustrated in FIG. 3, an offset correction process is performed in such a way as to subtract the maximum value [11], which is the A/D converted data of the difference obtained from the OB pixel circuit $P_{OB}$, from the A/D converted data of the difference obtained from the effective pixel circuit $P_N$. Accordingly, regardless of the value of the A/D converted data of the difference obtained from the effective pixel circuit $P_N$, the A/D converted data is forcibly corrected to the minimum value [00], and thus black pseudo-smear appears in image data (refer to FIG. 35).

Since the solid-state image sensor 1 of the first embodiment of the present invention includes the pixel circuits $P_N$ and $P_{OB}$ which perform an operation described below, the occurrence of pseudo-smear is effectively reduced.

Hereinafter, a specific operation of the pixel circuits $P_N$ and $P_{OB}$ will be described with reference to the accompanying drawings. Particularly, herein, two relative cases in which a set gain is high or low are described; however, the operation of the solid-state image sensor 1 of the first embodiment of the present invention is not limited to these two types.

Figure 4:
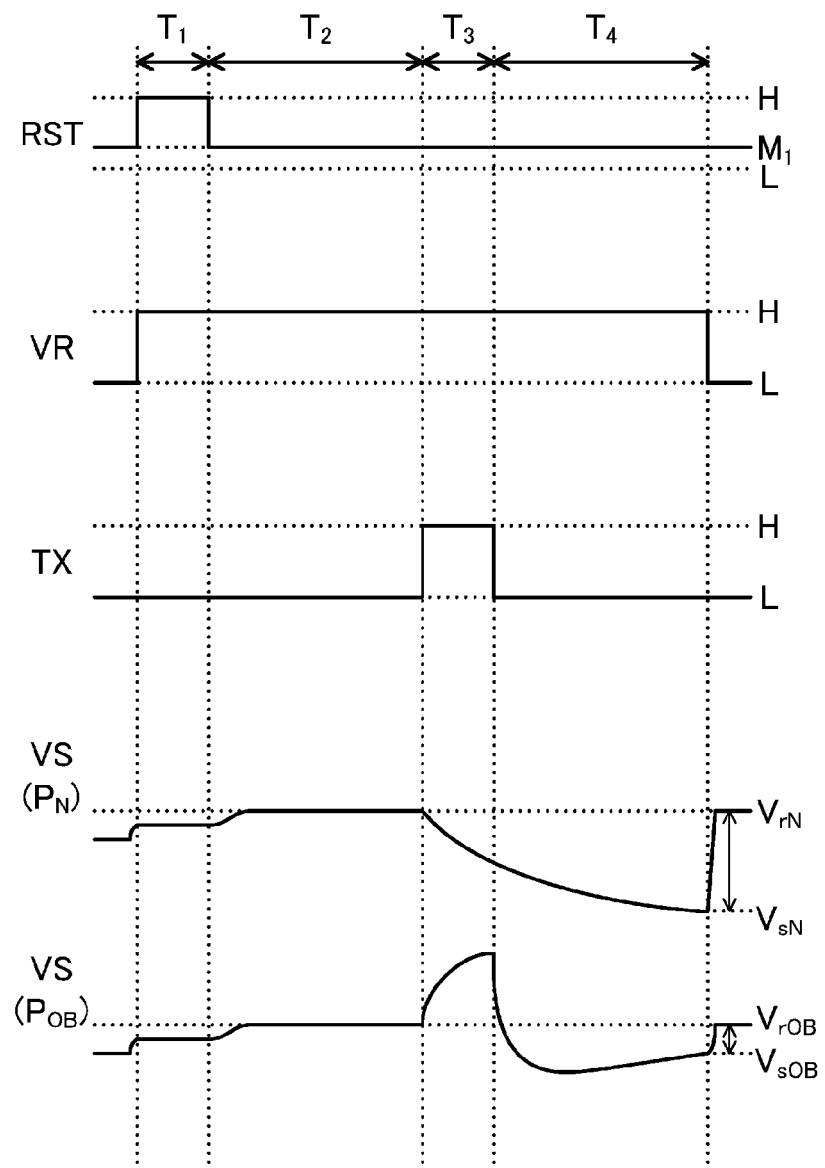
FIG. 4 is a timing chart illustrating the operation of a pixel circuit on which strong light is incident in a case where a set gain is low.
Figure 5:
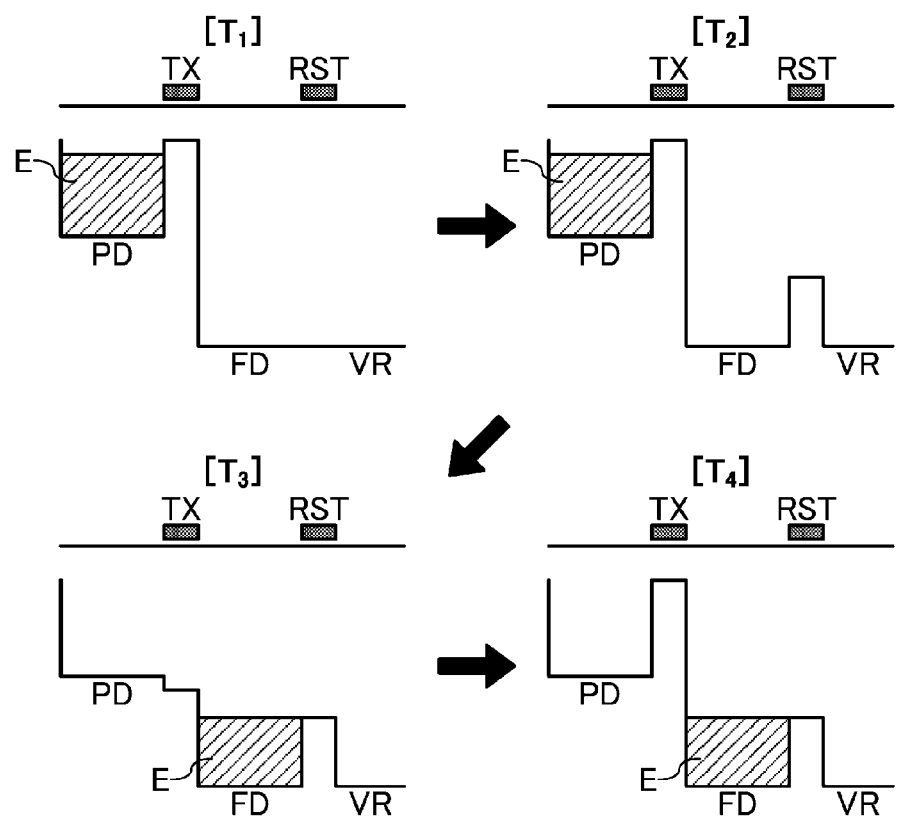
FIG. 5 is a potential diagram of an effective pixel circuit that performs the operation illustrated in FIG. 4.
Figure 6:
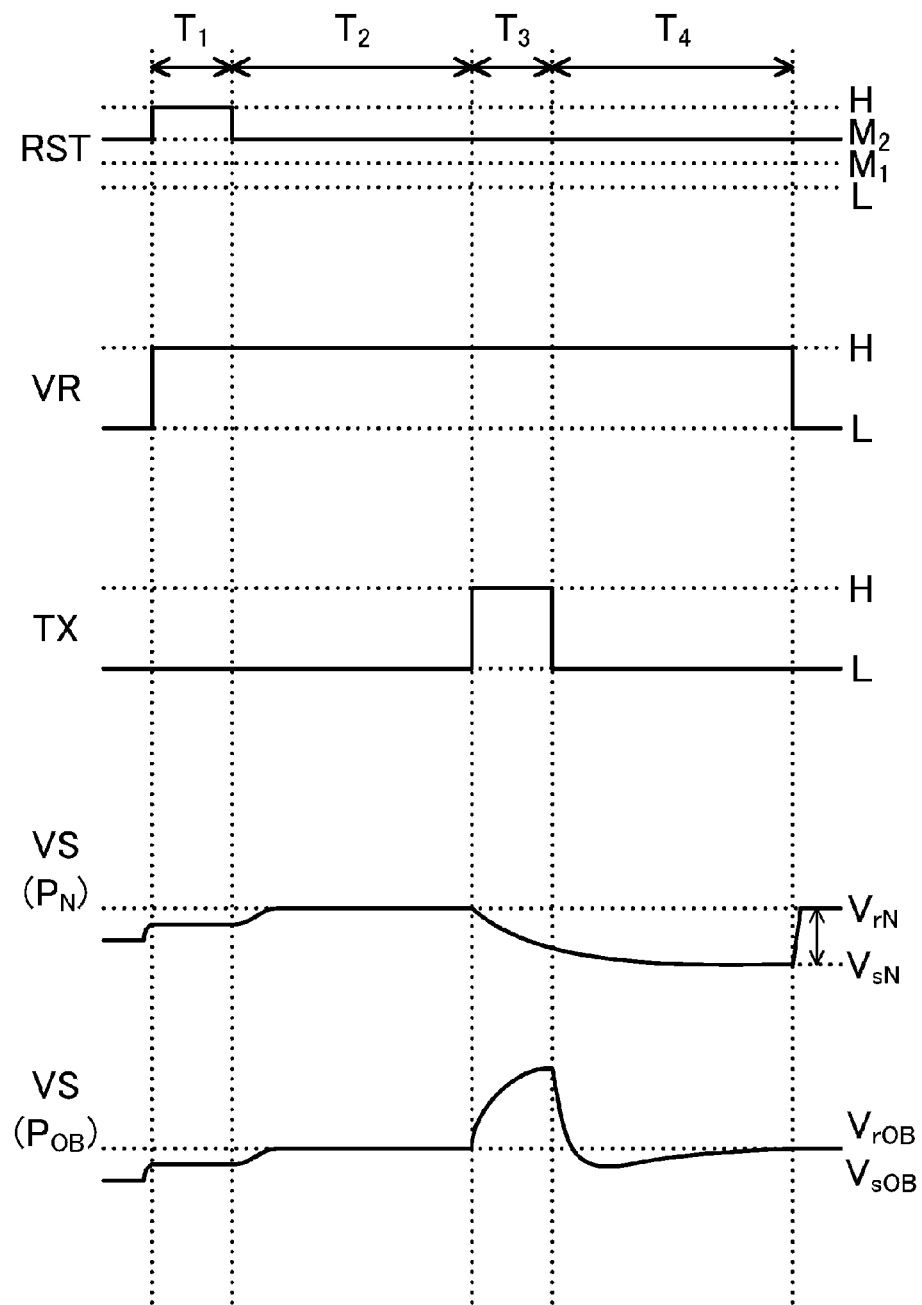
FIG. 6 is a timing chart illustrating the operation of a pixel circuit on which strong light is incident in a case where a set gain is high.
Figure 7:
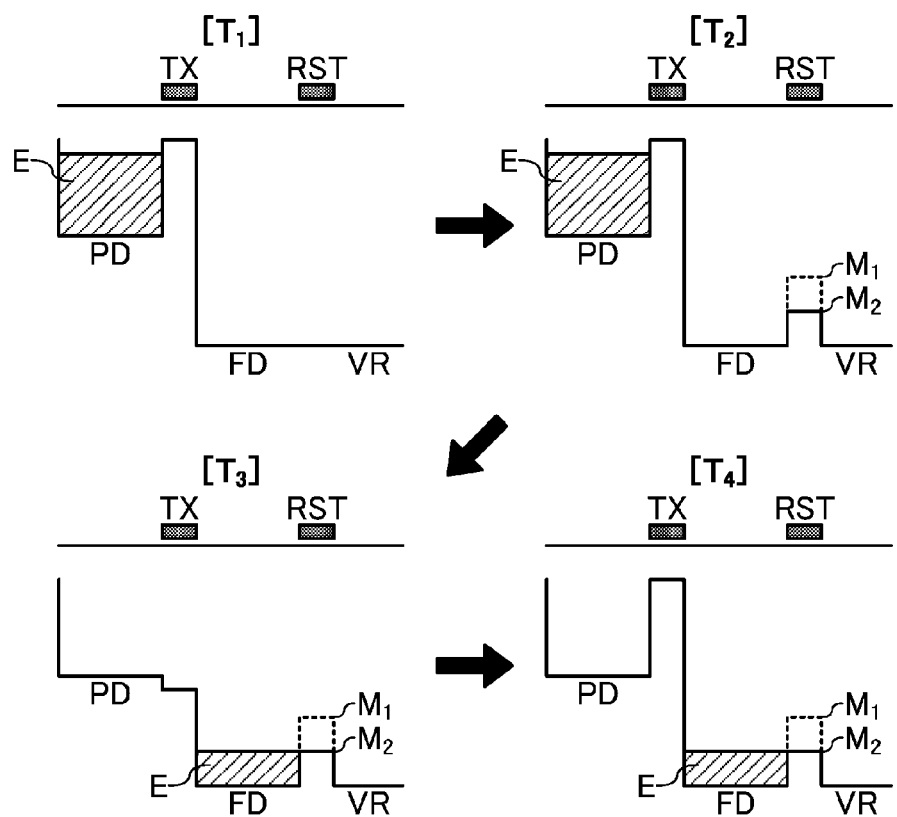
FIG. 7 is a potential diagram of an effective pixel circuit that performs the operation illustrated in FIG. 6.

FIG. 4 is a timing chart illustrating the operation of a pixel circuit on which strong light is incident in a case where a set gain is low. FIG. 5 is a potential diagram of an effective pixel circuit that performs the operation illustrated in FIG. 4. FIG. 6 is a timing chart illustrating the operation of a pixel circuit on which strong light is incident in a case where a set gain is high. FIG. 7 is a potential diagram of an effective pixel circuit that performs the operation illustrated in FIG. 6. FIGS. 5 and 7 are potential diagrams of the effective pixel circuit $P_N$. Since the only difference between the effective pixel circuit $P_N$ and the OB pixel circuit $P_{OB}$ is the existence and non-existence of charges E generated via photoelectric conversion, the potential diagrams illustrated in FIGS. 5 and 7 are suitable for the OB pixel circuit $P_{OB}$ if the existence of the charges E is removed. In FIGS. 4 and 6, a fluctuation in the voltage of the output signal line VS is illustrated in an emphasized manner, and the illustration of noise superimposed on the transfer control line TX or the reset control line RST is omitted.

Although in FIGS. 4 to 7 illustration starts from a period $T_1$, the accumulation of the charges E in the photodiode PD is assumed to start at a certain timing before the period $T_1$ (electronic shutter). At this time, initially, both the transfer control line TX and the reset control line RST go to a high voltage H (first voltage), and both the transistor including the transfer gate 11 as a gate and the reset transistor 13 enter an ON mode. Therefore, charges in the photodiode PD are discharged to the outside of the pixel circuits $P_N$ and $P_{OB}$ via the floating diffusion area FD and the reset power supply line VR. The transfer control line TX goes to a low voltage L (second voltage), the transistor including the transfer gate 11 as a gate enters an OFF mode, the reset control line RST goes to an intermediate voltage, and the accumulation of the charges E in the photodiode PD starts. Since light is not incident on the OB pixel circuit $P_{OB}$, the generation of charges via photoelectric conversion does not occur, and charges are not accumulated in the photodiode PD, but charges may be accumulated due to dark current or the like.

Initially, the case where a set gain is low will be described with reference to FIGS. 4 and 5. As illustrated in FIGS. 4 and 5, first, if the reset control line RST goes to the high voltage H during the period $T_1$, a potential barrier under a gate of the reset transistor 13 decreases, the reset transistor 13 enters an ON mode, and charges in the floating diffusion area FD are discharged to the outside of the pixel circuits $P_N$ and $P_{OB}$ via the reset power supply line VR at the high voltage H.

Subsequently, the reset control line RST goes to an intermediate voltage $M_1$ during a period $T_2$. The intermediate voltage $M_1$ is a voltage generated by the intermediate voltage generation unit 25, and is a voltage of a magnitude between the high voltage H and the low voltage L. If the reset control line RST goes to the intermediate voltage $M_1$, a potential barrier under the gate of the reset transistor 13 increases to a level between an ON mode and an OFF mode.

At the end of the period $T_2$ (after a settling time has elapsed), the A/D conversion circuit 23 samples a voltage $V_{rN}$ of the output signal line VS in a state where charges are not retained in the floating diffusion area FD of the effective pixel circuit $P_N$, and a voltage $V_{rOB}$ of the output signal line VS in a state where charges are not retained in the floating diffusion area FD of the OB pixel circuit $P_{OB}$.

Subsequently, if the transfer control line TX goes to the high voltage H during a period $T_3$, a potential barrier under the transfer gate 11 decreases, the transistor including the transfer gate 11 as a gate enters an ON mode, and the charges E in the photodiode PD are transferred to the floating diffusion area FD. At this time, the charges E exceeding the potential barrier (that is, an upper limit amount of charges retained by the floating diffusion area FD) under the gate of the reset transistor 13 are discharged to the outside of the effective pixel circuit $P_N$ via the reset power supply line VR at the high voltage H. As such, if the intermediate voltage $M_1$ is applied to the gate, the reset transistor 13 is capable of entering both states, that is, an ON mode and an OFF mode in correspondence with a fluctuation in charges of the source (the floating diffusion area FD) (hereinafter, this is the same for other transistors including gates to which the intermediate voltage is applied). Since photoelectric conversion is not performed in the OB pixel circuit $P_{OB}$, almost no charges are transferred, and the voltage of the output signal line VS increases due to an effect of the transfer control line TX going to the high voltage H (refer to FIG. 4).

Subsequently, if the transfer control line TX goes to the low voltage L during a period $T_4$, a potential barrier under the transfer gate 11 increases, the transistor including the transfer gate 11 as a gate enters an OFF mode, and the transfer of charges from the photodiode PD to the floating diffusion area FD stops. At the end of the period $T_{14}$ (after a settling time has elapsed), the A/D conversion circuit 23 samples a voltage $V_{sN}$ of the output signal line VS which corresponds to charges retained in the floating diffusion area FD of the effective pixel circuit $P_N$, and a voltage $V_{sOB}$ of the output signal line VS which corresponds to charges retained in the floating diffusion area FD of the OB pixel circuit $P_{OB}$.

The A/D conversion circuit 23 generates effective pixel data of image data by performing A/D conversion on a correlated double sampled difference $V_{rN}-V_{sN}$ for the effective pixel circuit $P_N$. The A/D conversion circuit 23 generates OB pixel data of image data by performing A/D conversion on a correlated double sampled difference $V_{rOB}-V_{sOB}$ for the OB pixel circuit $P_{OB}$.

The case where a set gain is high will be described with reference to FIGS. 6 and 7. The magnitude of a generated intermediate voltage is the only difference between the operation of the pixel circuits $P_N$ and $P_{OB}$ in a case where a gain is high illustrated in FIGS. 6 and 7 and the operation of the pixel circuits $P_N$ and $P_{OB}$ in a case where a gain is low illustrated in FIGS. 4 and 5.

Hereinafter, a difference in operation will be described based on a difference in generated intermediate voltage. For clear illustration of the difference from the operation illustrated in FIGS. 4 and 5, in FIGS. 6 and 7, reference sign "$M_1$" is assigned to an intermediate voltage or a potential barrier in a case where a gain is low illustrated in FIGS. 4 and 5, and reference sign "$M_2$" is assigned to an intermediate voltage or a potential barrier in a case where a gain is high.

As illustrated in FIGS. 6 and 7, in a case where a high gain is set, the reset control line RST goes to an intermediate voltage $M_2$ during periods $T_2$ to $T_4$. The intermediate voltage $M_2$ is a voltage higher than the intermediate voltage $M_1$. Accordingly, a potential barrier under the gate of the reset transistor 13 is smaller than that at the intermediate voltage $M_1$. That is, an upper limit amount of charges retained by the floating diffusion area FD is smaller than that at the intermediate voltage $M_1$.

As illustrated in FIGS. 4 to 7, the intermediate voltage generation unit 25 of the solid-state image sensor 1 generates an intermediate voltage higher by the extent of an increase in A/D conversion gain set by the control circuit 26. Accordingly, in a case where a low gain is set, the upper limit amount of the charges E eventually retained in the floating diffusion area FD is large. In a case where a high gain is set, the upper limit amount of the charges E eventually retained in the floating diffusion area FD is small.

As described with reference to FIG. 3, in a case where a low gain is set, pseudo-smear is unlikely to appear in image data. Therefore, as illustrated in FIG. 4, it is possible to allow a somewhat increase in the correlated double sampled difference $V_{rOB}-V_{sOB}$ for the OB pixel circuit $P_{OB}$. Accordingly, in this case, even if the upper limit amount of the charges E eventually retained in the floating diffusion area FD is somewhat large, it is possible to satisfactorily reduce the occurrence of pseudo-smear by generating a somewhat low intermediate voltage $M_1$.

In contrast, in a case where a high gain is set, pseudo-smear is likely to appear in image data. Therefore, as illustrated in FIG. 6, the correlated double sampled difference $V_{rOB}-V_{sOB}$ for the OB pixel circuit $P_{OB}$ preferably is as small as possible. Accordingly, in this case, the upper limit amount of the charges E eventually retained in the floating diffusion area FD is decreased by generating a high intermediate voltage $M_2$. As a result, the occurrence of pseudo-smear is satisfactorily reduced.

As described above, in the solid-state image sensor 1 of the first embodiment of the present invention, it is possible to directly reduce a fluctuation in the output of the pixel circuits $P_N$ and $P_{OB}$ belonging to the same control group, which is a cause of pseudo-smear, by limiting the upper limit amount of the charges E retained in the floating diffusion area FD. As a result, it is possible to effectively reduce the occurrence of pseudo-smear by adopting a simple configuration and operation in which the upper limit amount of the charges E eventually retained in the floating diffusion area FD is limited.

In the solid-state image sensor 1 of the first embodiment of the present invention, the upper limit amount of the charges E eventually retained in the floating diffusion area FD is further decreased to the extent corresponding to the condition in which pseudo-smear is likely to appear due to a high A/D conversion gain. As a result, it is possible to effectively reduce the occurrence of pseudo-smear as necessary.

<Second Embodiment>

Hereinafter, a solid-state image sensor of a second embodiment of the present invention will be described. The only difference between the solid-state image sensor of the second embodiment of the present invention and the solid-state image sensor of the first embodiment of the present invention is a portion of the operation of the pixel circuits $P_N$ and $P_{OB}$. Hereinafter, the points of difference between the solid-state image sensor of the second embodiment of the present invention and the solid-state image sensor of the first embodiment of the present invention will be described with reference to the accompanying drawings.

Figure 8:
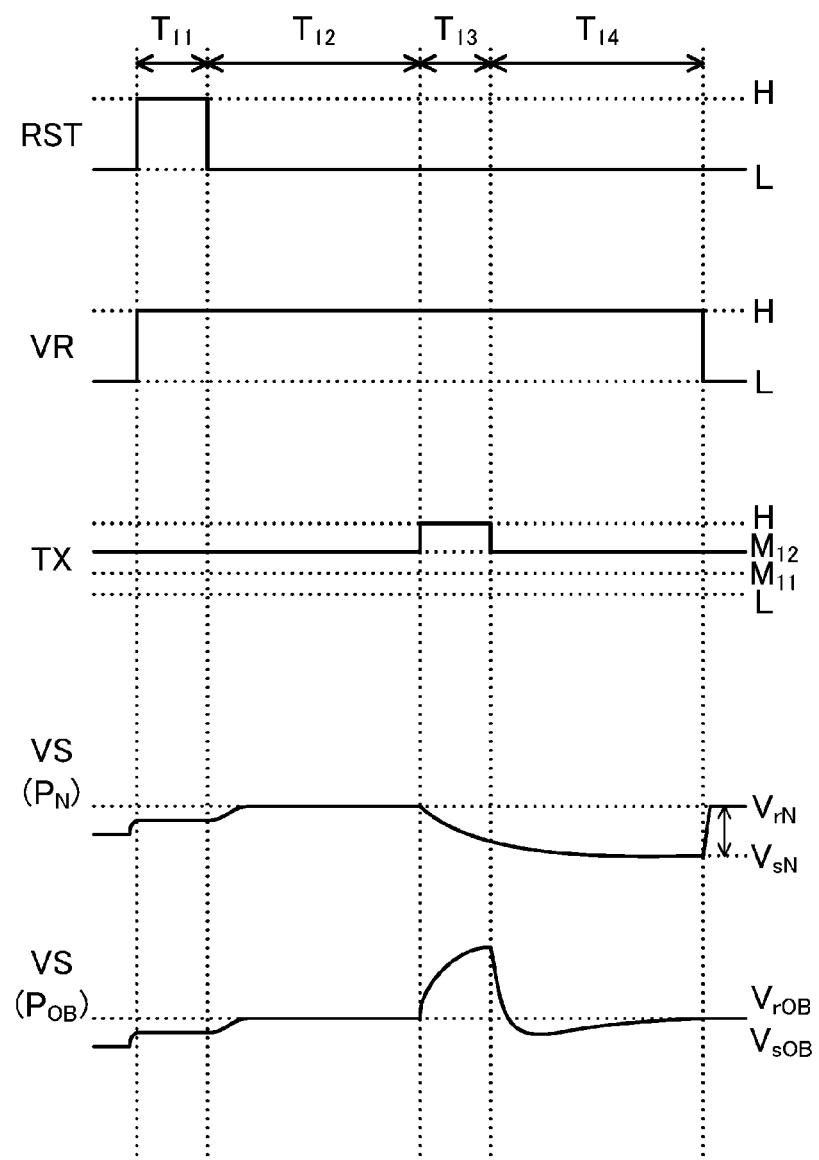
FIG. 8 is a timing chart illustrating the operation of a pixel circuit of a solid-state image sensor of a second embodiment of the present invention.
Figure 9:
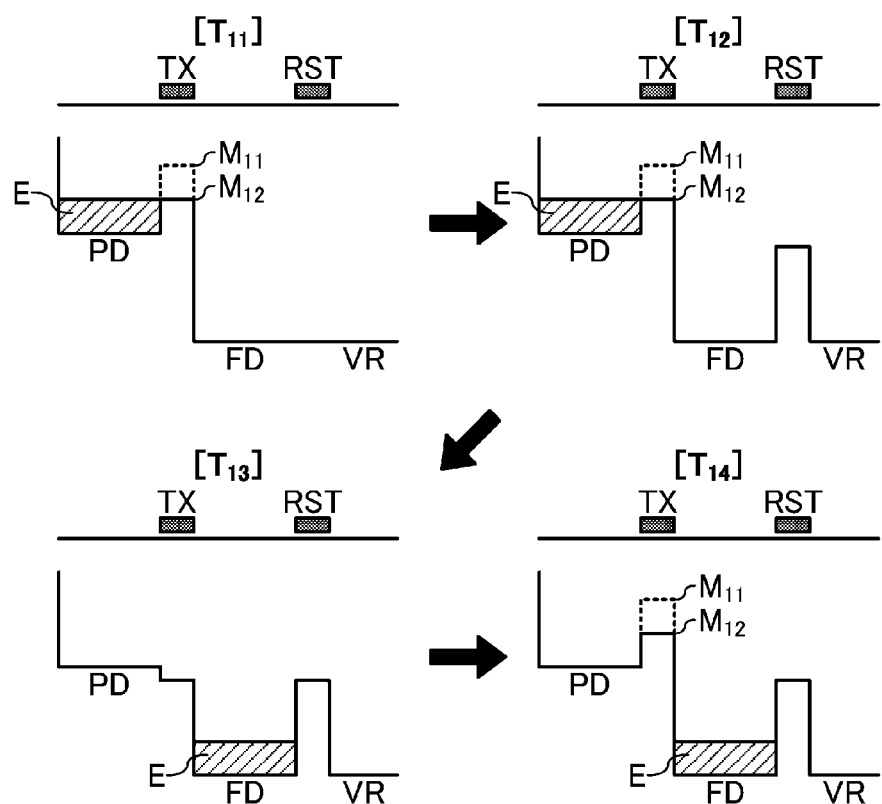
FIG. 9 is a potential diagram of an effective pixel circuit that performs the operation illustrated in FIG. 8.

FIG. 8 is a timing chart illustrating the operation of a pixel circuit of the solid-state image sensor of the second embodiment of the present invention. FIG. 9 is a potential diagram of an effective pixel circuit that performs the operation illustrated in FIG. 8. FIGS. 8 and 9 respectively correspond to FIGS. 6 and 7 which illustrate the operation of the solid-state image sensor of the first embodiment of the present invention in a case where a set gain is high. Similar to FIGS. 6 and 7, reference sign "$M_{11}$" is assigned to an intermediate voltage or a potential barrier in a case where a gain is low, and reference sign "$M_{12}$" is assigned to an intermediate voltage or a potential barrier in a case where a gain is high. In FIG. 8, a fluctuation in the voltage of the output signal line VS is illustrated in an emphasized manner, and the illustration of noise superimposed on the transfer control line TX or the reset control line RST is omitted.

Although in FIGS. 8 to 9 illustration starts from a period $T_{11}$, the accumulation of the charges E in the photodiode PD is assumed to start at a certain timing before the period $T_{11}$ (electronic shutter). At this time, initially, both the transfer control line TX and the reset control line RST go to the high voltage H, and both the transistor including the transfer gate 11 as a gate and the reset transistor 13 enter an ON mode. Therefore, charges in the photodiode PD are discharged to the outside of the pixel circuits $P_N$ and $P_{OB}$ via the floating diffusion area FD and the reset power supply line VR. The transfer control line TX goes to an intermediate voltage $M_{12}$, and the reset control line RST goes to the low voltage L. Therefore, the accumulation of the charges E in the photodiode PD starts. Since light is not incident on the OB pixel circuit $P_{OB}$, the generation of charges via photoelectric conversion does not occur, and charges are not accumulated in the photodiode PD, but charges may be accumulated due to dark current or the like.

After the transfer control line TX goes to the intermediate voltage $M_{12}$, a potential barrier under the transfer gate 11 is present between an ON mode and an OFF mode. Accordingly, charges are being accumulated in the photodiode PD, and charges exceeding the potential barrier (that is, the upper limit amount of charges accumulated by the photodiode PD) under the transfer gate 11 flow into the floating diffusion area FD without being accumulated in the photodiode PD. In a case where a set gain is low, the transfer control line TX goes to an intermediate voltage $M_{11}$ lower than the intermediate voltage $M_{12}$, and a potential barrier under the transfer gate 11 is larger than that at the intermediate voltage $M_{12}$.

As illustrated in FIGS. 8 and 9, if the reset control line RST goes to the high voltage H during the period $T_{11}$, a potential barrier under the gate of the reset transistor 13 decreases, the reset transistor 13 enters an ON mode, and charges in the floating diffusion area FD are discharged to the outside of the pixel circuits $P_N$ and $P_{OB}$ via the reset power supply line VR at the high voltage H.

Subsequently, the reset control line RST goes to the low voltage L during a period $T_{12}$. At the end of the period $T_{12}$ (after a settling time has elapsed), the A/D conversion circuit 23 samples the voltage $V_{rN}$ of the output signal line VS in a state where charges are not retained in the floating diffusion area FD of the effective pixel circuit $P_N$, and the voltage $V_{rOB}$ of the output signal line VS in a state where charges are not retained in the floating diffusion area FD of the OB pixel circuit $P_{OB}$.

Subsequently, if the transfer control line TX goes to the high voltage H during a period $T_{13}$, a potential barrier under the transfer gate 11 decreases, the transistor including the transfer gate 11 as a gate enters an ON mode, and the charges E in the photodiode PD are transferred to the floating diffusion area FD. In this case, as described above, the charges E transferred from the photodiode PD to the floating diffusion area FD are the charges E which are accumulated in the photodiode PD as the result of limiting the upper limit amount by applying the intermediate voltage $M_{12}$ to the transfer control line TX. Since photoelectric conversion is not performed in the OB pixel circuit $P_{OB}$, almost no charges are transferred, and the voltage of the output signal line VS increases due to an effect of the transfer control line TX going to the high voltage H (refer to FIG. 8).

Subsequently, if the transfer control line TX goes to the intermediate voltage $M_{12}$ during a period $T_{14}$, a potential barrier under the transfer gate 11 increases to a level between an ON mode and an OFF mode, and the transfer of charges from the photodiode PD to the floating diffusion area FD stops. At the end of the period $T_{14}$ (after a settling time has elapsed), the A/D conversion circuit 23 samples the voltage $V_{sN}$ of the output signal line VS which corresponds to charges retained in the floating diffusion area FD of the effective pixel circuit $P_N$, and the voltage $V_{sOB}$ of the output signal line VS which corresponds to charges retained in the floating diffusion area FD of the OB pixel circuit $P_{OB}$.

As described above, in the solid-state image sensor 1 of the second embodiment of the present invention, it is possible to directly reduce a fluctuation in the output of the pixel circuits $P_N$ and $P_{OB}$ belonging to the same control group, which is a cause of pseudo-smear, by limiting the upper limit amount of the charges E accumulated in the photodiode PD. As a result, it is possible to effectively reduce the occurrence of pseudo-smear by adopting a simple configuration and operation in which the upper limit amount of the charges E eventually retained in the floating diffusion area FD is limited.

In the solid-state image sensor 1 of the second embodiment of the present invention, the upper limit amount of the charges E eventually retained in the floating diffusion area FD is further decreased to the extent corresponding to the condition in which pseudo-smear is likely to appear due to a high A/D conversion gain. As a result, it is possible to effectively reduce the occurrence of pseudo-smear as necessary.

<Third Embodiment>

Hereinafter, a solid-state image sensor of a third embodiment of the present invention will be described. The solid-state image sensor of the third embodiment of the present invention is equivalent to a modification example of the solid-state image sensor of the second embodiment of the present invention. Hereinafter, the points of difference between the solid-state image sensor of the third embodiment of the present invention and the solid-state image sensor of the second embodiment of the present invention will be described with reference to the accompanying drawings.

Figure 10:
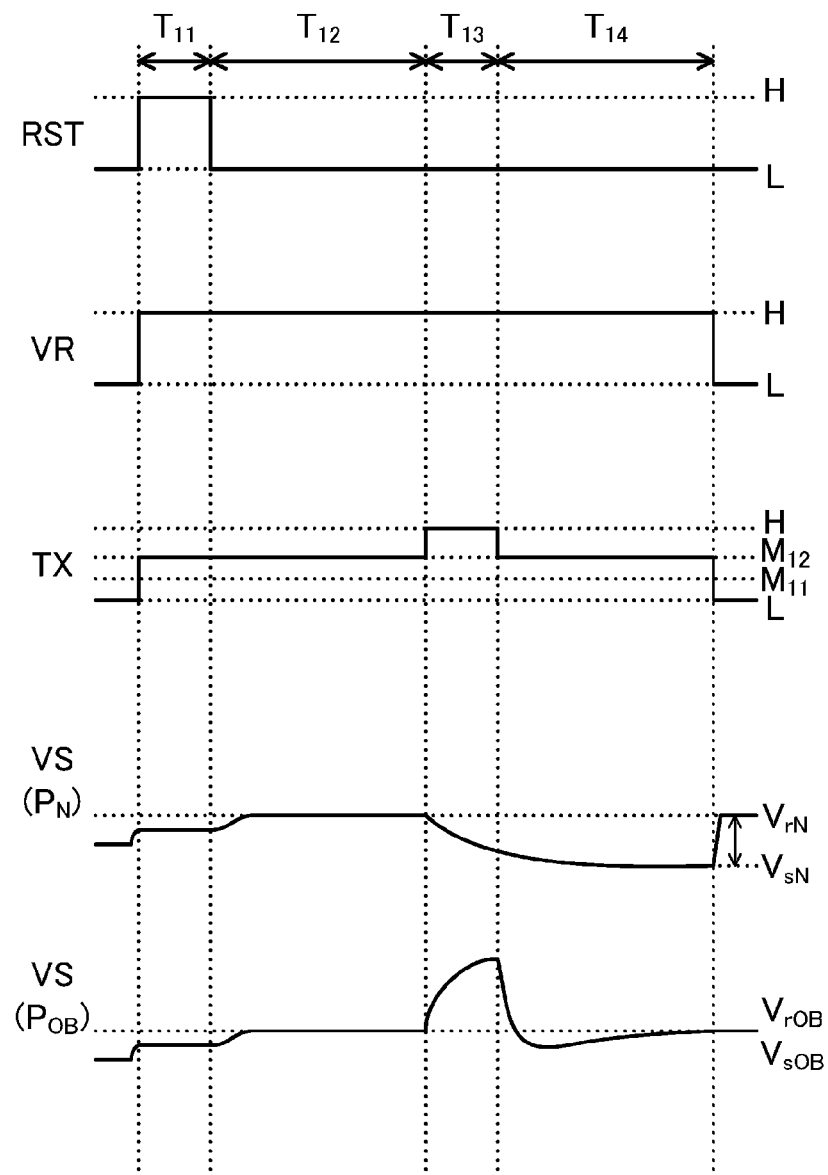
FIG. 10 is a timing chart illustrating the operation of a pixel circuit of a solid-state image sensor of a third embodiment of the present invention.

FIG. 10 is a timing chart illustrating the operation of a pixel circuit of the solid-state image sensor of the third embodiment of the present invention. FIG. 10 corresponds to FIG. 8 which illustrates the operation of the solid-state image sensor of the second embodiment of the present invention. Similar to FIG. 8, reference sign "$M_{11}$" is assigned to an intermediate voltage in a case where a gain is low, and reference sign "$M_{12}$" is assigned to an intermediate voltage in a case where a gain is high. In FIG. 10, a fluctuation in the voltage of the output signal line VS is illustrated in an emphasized manner, and the illustration of noise superimposed on the transfer control line TX or the reset control line RST is omitted.

As illustrated in FIG. 10, in the solid-state image sensor 1 of the third embodiment of the present invention, the transfer control line TX goes to the low voltage L or the intermediate voltage $M_{12}$ during periods apart from a period during which the transfer control line TX goes to the high voltage H. Particularly, during periods apart from the periods $T_{11}$ to $T_{14}$, the transfer control line TX goes to the low voltage L, and thus the transistor including the transfer gate 11 as a gate enters an OFF mode.

As such, if the transistor including the transfer gate 11 as a gate enters an OFF mode, the concentration of charges (positive holes) having polarity opposite to that of charges (electrons) accumulated in the photodiode PD may increase under the transfer gate 11. Accordingly, charges generated due to dark current can be reduced from flowing into the photodiode PD.

A period during which the transfer control line TX goes to the low voltage L (period during which the low voltage L is applied to the transfer gate 11) may account for 90% or greater of a period that is the sum of the period during which the transfer control line TX goes to the low voltage L (period during which the low voltage L is applied to the transfer gate 11) and periods during which the transfer control line TX goes to the intermediate voltages $M_{11}$ and $M_{12}$ (period during which the intermediate voltages $M_{11}$ and $M_{12}$ are applied to the transfer gate 11).

In this configuration, dark current which increases due to the intermediate voltages $M_{11}$ and $M_{12}$ being used instead of the low voltage L can be reduced to one tenth or less.

<Fourth Embodiment>

Hereinafter, a solid-state image sensor of a fourth embodiment of the present invention will be described. The only difference between the solid-state image sensor of the fourth embodiment of the present invention and the solid-state image sensor of the first embodiment of the present invention is a portion of the configuration and operation of the pixel circuits $P_N$ and $P_{OB}$. Hereinafter, the points of difference between the solid-state image sensor of the fourth embodiment of the present invention and the solid-state image sensor of the first embodiment of the present invention will be described with reference to the accompanying drawings.

Figure 11:
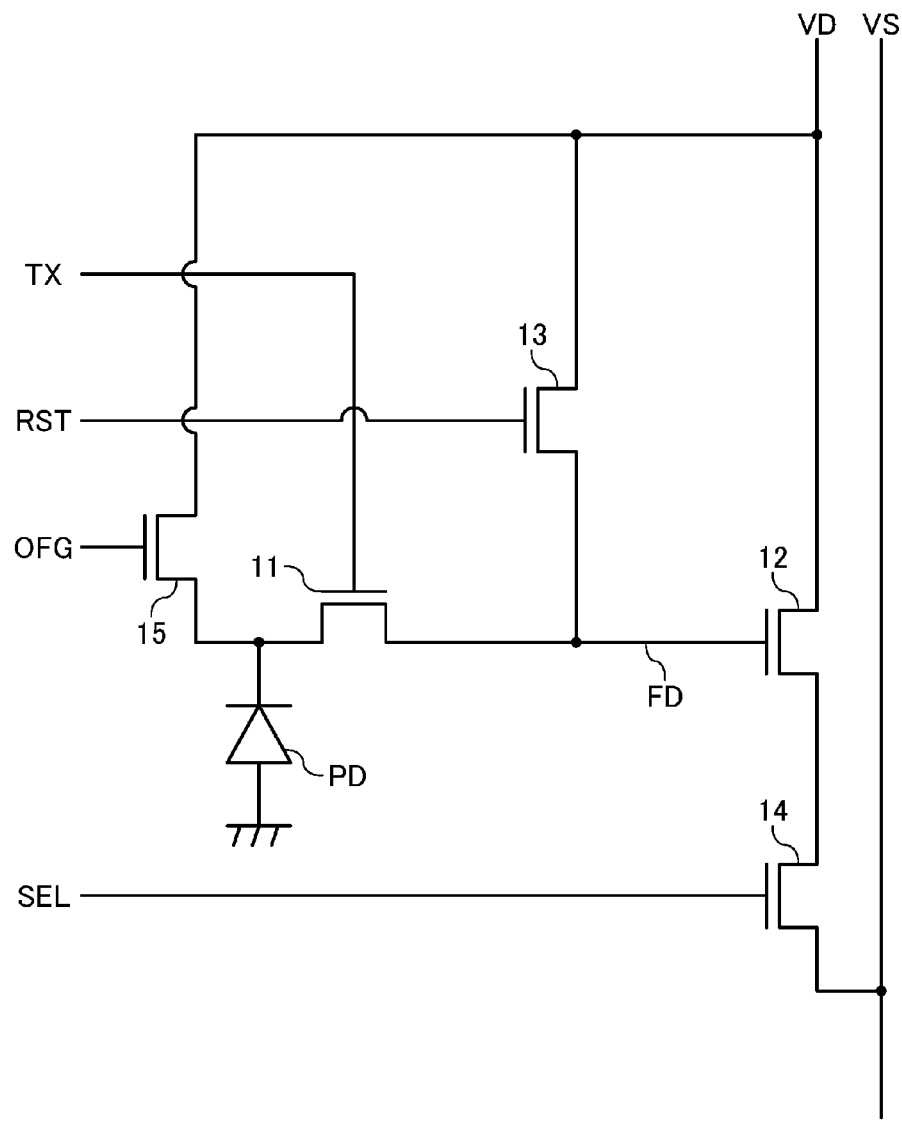
FIG. 11 is a circuit diagram of a pixel circuit of a solid-state image sensor of a fourth embodiment of the present invention.

FIG. 11 is a circuit diagram of a pixel circuit of the solid-state image sensor of the fourth embodiment of the present invention. As illustrated in FIG. 11, each of the effective pixel circuit $P_N$ and the OB pixel circuit $P_{OB}$ includes the photodiode PD; the floating diffusion area FD; the transfer gate 11; the output transistor 12; the reset transistor 13; a selective transistor 14 that is connected in series to the output transistor 12; and a discharge transistor 15 that discharges charges in the photodiode PD to the outside of the effective pixel circuit $P_N$ and the OB pixel circuit $P_{OB}$.

The anode of the photodiode PD is grounded. The transfer gate 11 is connected to the transfer control line TX, and is a gate of a transistor, the drain of which is the floating diffusion area FD, and the source of which is the cathode of the photodiode PD. The output transistor 12 has a gate connected to the floating diffusion area FD, a drain connected to the common power supply line VD, and a source connected to a drain of the selective transistor 14. The reset transistor 13 has a gate connected to the reset control line RST, a drain connected to the common power supply line VD, and a source connected to the floating diffusion area FD. The selective transistor 14 has a gate connected to a selection control line SEL, and a source connected to the output signal line VS. The discharge transistor 15 has a gate connected to a discharge control line OFG, a drain connected to the common power supply line VD, and a source connected to the cathode of the photodiode PD.

The reset control line RST and the selection control line SEL are common to the pixel circuits $P_N$ and $P_{OB}$ which belong to the same control group in the pixel array 10. The transfer control line TX, the discharge control line OFG, and the common power supply line VD are common to all the pixel circuits $P_N$ and $P_{OB}$ in the pixel array 10.

Figure 12:
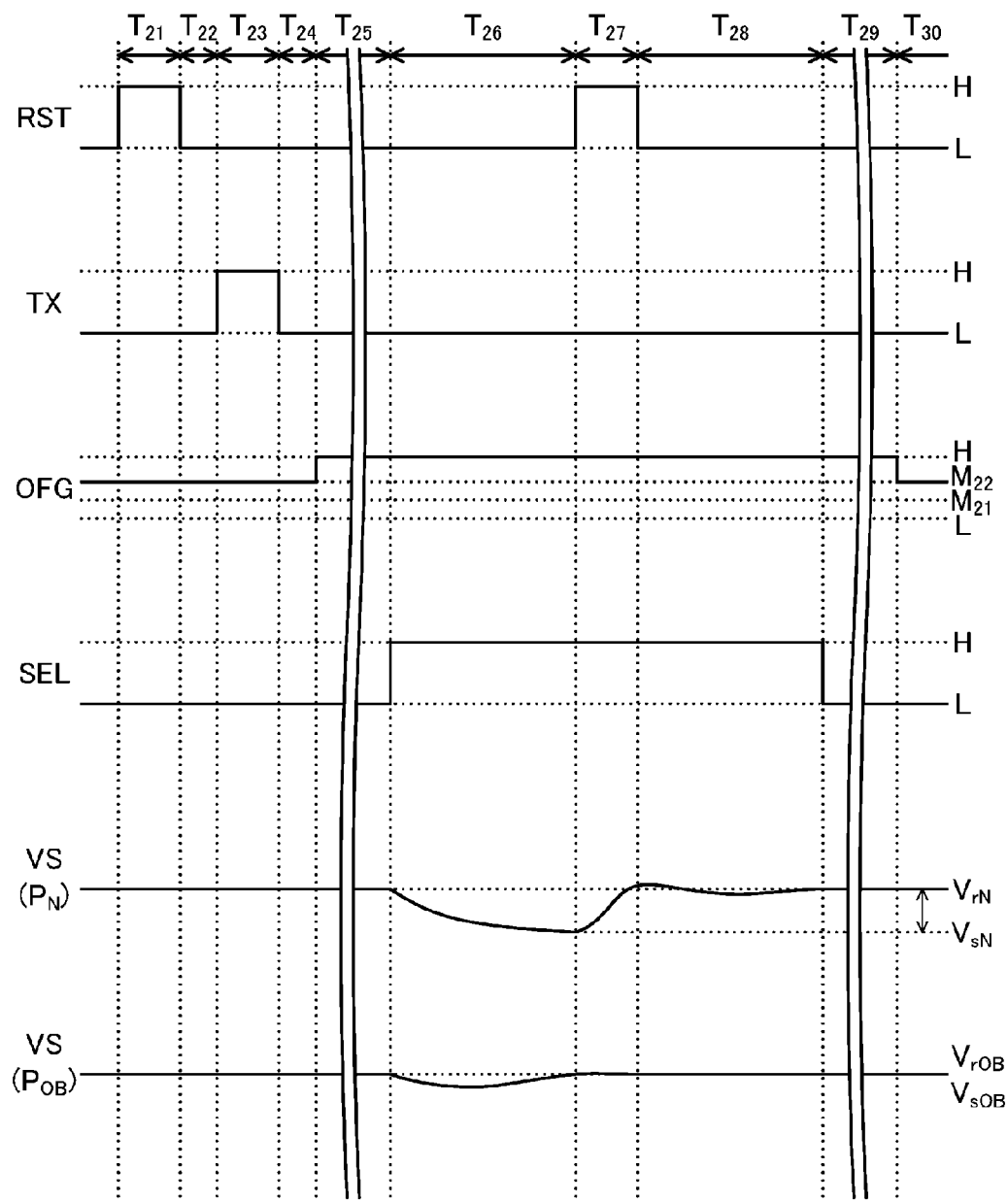
FIG. 12 is a timing chart illustrating the operation of the pixel circuit of the solid-state image sensor of the fourth embodiment of the present invention.
Figure 13:
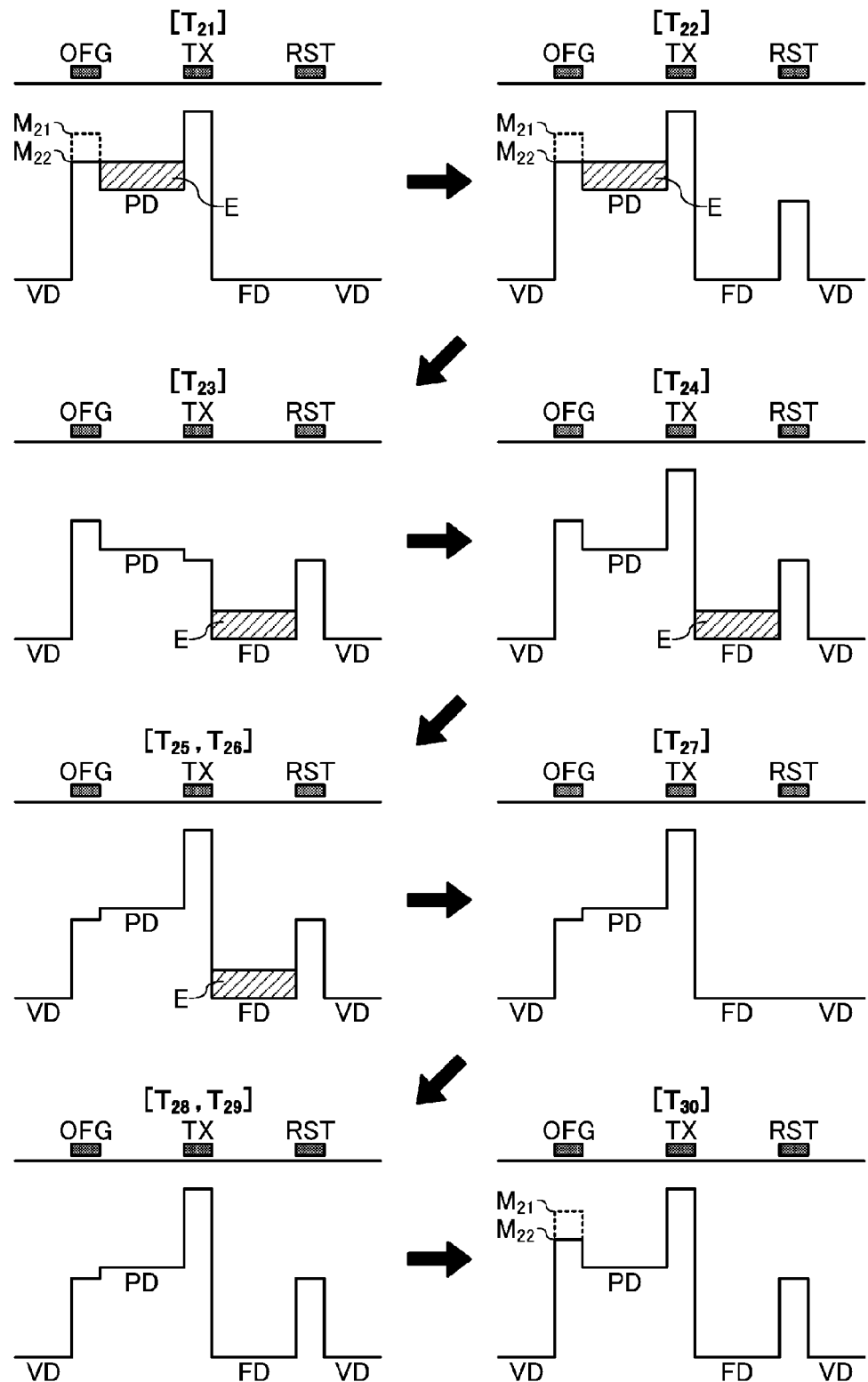
FIG. 13 is a potential diagram of an effective pixel circuit that performs the operation illustrated in FIG. 12.

FIG. 12 is a timing chart illustrating the operation of the pixel circuit of the solid-state image sensor of the fourth embodiment of the present invention. FIG. 13 is a potential diagram of an effective pixel circuit that performs the operation illustrated in FIG. 12. FIGS. 12 and 13 respectively correspond to FIGS. 6 and 7 which illustrate the operation of the solid-state image sensor of the first embodiment of the present invention in a case where a set gain is high. Similar to FIGS. 6 and 7, reference sign "$M_{21}$" is assigned to an intermediate voltage or a potential barrier in a case where a gain is low, and reference sign "$M_{22}$" is assigned to an intermediate voltage or a potential barrier in a case where a gain is high. In FIG. 12, a fluctuation in the voltage of the output signal line VS is illustrated in an emphasized manner, and the illustration of noise superimposed on the transfer control line TX or the reset control line RST is omitted.

Although in FIGS. 12 to 13 illustration starts from a period $T_{21}$, the accumulation of the charges E in the photodiode PD is assumed to start at a certain timing before the period $T_{21}$ (electronic shutter). At this time, initially, the discharge control line OFG goes to the high voltage H, and the discharge transistor 15 enters an ON mode. Therefore, charges in the photodiode PD are discharged to the outside of the pixel circuits $P_N$ and $P_{OB}$ via the common power supply line VD. The discharge control line OFG goes to an intermediate voltage $M_{22}$, and thus the accumulation of the charges E in the photodiode PD starts. Since light is not incident on the OB pixel circuit $P_{OB}$, the generation of charges via photoelectric conversion does not occur, and charges are not accumulated in the photodiode PD, but charges may be accumulated due to dark current or the like.

After the discharge control line OFG goes to the intermediate voltage $M_{22}$, a potential barrier under the gate of the discharge transistor 15 is present between an ON mode and an OFF mode. Accordingly, charges are being accumulated in the photodiode PD, and charges exceeding the potential barrier (that is, the upper limit amount of charges accumulated by the photodiode PD) under the gate of the discharge transistor 15 are discharged to the outside of the pixel circuits $P_N$ and $P_{OB}$ via the common power supply line VD instead of being accumulated in the photodiode PD. In a case where a set gain is low, the discharge control line OFG goes to an intermediate voltage $M_{21}$ lower than the intermediate voltage $M_{22}$, and a potential barrier under the gate of the discharge transistor 15 is larger than that at the intermediate voltage $M_{22}$.

In the aforementioned example, an electronic shutter can be operated using the discharge transistor 15 independent of the floating diffusion area FD, and thus an electronic shutter can be operated for all the pixel circuits $P_N$ and $P_{OB}$ in the pixel array 10 (global shutter). In this case, the charges E can be simultaneously transferred from the photodiodes PD to the floating diffusion areas FD in all the pixel circuits $P_N$ and $P_{OB}$ in the pixel array 10. It is possible to acquire signals (voltages) of all the pixel circuits $P_N$ and $P_{OB}$ in the pixel array 10 by sequentially turning on the selective transistors 14 of the pixel circuits $P_N$ and $P_{OB}$ in the pixel array 10 in the unit of the control group.

As illustrated in FIGS. 12 and 13, if the reset control line RST goes to the high voltage H during the period $T_{21}$, a potential barrier under the gate of the reset transistor 13 decreases, the reset transistor 13 enters an ON mode, and charges in the floating diffusion area FD are discharged to the outside of the pixel circuits $P_N$ and $P_{OB}$ via the common power supply line VD.

Subsequently, if the reset control line RST goes to the low voltage L during a period $T_{22}$, a potential barrier under the gate of the reset transistor 13 increases, and the reset transistor 13 enters an OFF mode.

Subsequently, if the transfer control line TX goes to the high voltage H during a period $T_{23}$, a potential barrier under the transfer gate 11 decreases, the transistor including the transfer gate 11 as a gate enters an ON mode, and the charges E in the photodiode PD are transferred to the floating diffusion area FD. In this case, as described above, the charges E transferred from the photodiode PD to the floating diffusion area FD are the charges E which are accumulated in the photodiode PD as the result of limiting the upper limit amount by applying the intermediate voltage $M_{22}$ to the discharge control line OFG. Since photoelectric conversion is not performed in the OB pixel circuit $P_{OB}$, almost no charges are transferred.

Subsequently, if the transfer control line TX goes to the low voltage L during a period $T_{24}$, a potential barrier under the transfer gate 11 increases, the transistor including the transfer gate 11 as a gate enters an OFF mode, and the transfer of charges from the photodiode PD to the floating diffusion area FD stops.

Subsequently, if the discharge control line OFG goes to the high voltage H during a period $T_{25}$, a potential barrier under the gate of the discharge transistor 15 decreases, and the discharge transistor 14 enters an ON mode. Therefore, the charges E in the photodiode PD are discharged to the outside of the pixel circuits $P_N$ and $P_{OB}$ via the common power supply line VD. The aforementioned operations performed during the periods $T_{21}$ to $T_{25}$ can be simultaneously performed by all the pixel circuits $P_N$ and $P_{OB}$ in the pixel array 10.

Subsequently, if the selection control line SEL goes to the high voltage H during a period $T_{26}$, the selective transistor 14 enters an ON mode, and a signal (voltage) output from the output transistor 12 is applied to the output signal line VS. At the end of the period $T_{26}$ (after a settling time has elapsed), the A/D conversion circuit 23 samples the voltage $V_{sN}$ of the output signal line VS which corresponds to charges retained in the floating diffusion area FD of the effective pixel circuit $P_N$, and the voltage $V_{sOB}$ of the output signal line VS which corresponds to charges retained in the floating diffusion area FD of the OB pixel circuit $P_{OB}$.

Subsequently, if the reset control line RST goes to the high voltage H during a period $T_{27}$, a potential barrier under the gate of the reset transistor 13 decreases, and the reset transistor 13 enters an ON mode. Therefore, charges in the floating diffusion area FD are discharged to the outside of the pixel circuits $P_N$ and $P_{OB}$ via the common power supply line VD.

Subsequently, if the reset control line RST goes to the low voltage L during a period $T_{28}$, a potential barrier under the gate of the reset transistor 13 increases, and the reset transistor 13 enters an OFF mode. At the end of the period $T_{28}$ (after a settling time has elapsed), the A/D conversion circuit 23 samples the voltage $V_{rN}$ of the output signal line VS in a state where charges are not retained in the floating diffusion area FD of the effective pixel circuit $P_N$, and the voltage $V_{rOB}$ of the output signal line VS in a state where charges are not retained in the floating diffusion area FD of the OB pixel circuit $P_{OB}$.

Subsequently, if the selection control line SEL goes to the low voltage L during a period $T_{29}$, the selective transistor 14 enters an OFF mode. The aforementioned operations performed during the periods $T_{26}$ to $T_{29}$ can be performed by the pixel circuits $P_N$ and $P_{OB}$ in each control group of the pixel array 10.

Subsequently, if the discharge control line OFG goes to the intermediate voltage $M_{22}$ during a period $T_{30}$, a potential barrier under the gate of the discharge transistor 15 increases to a level between an ON mode and an OFF mode. Therefore, the discharge of charges from the photodiode PD stops. The operation performed during the period $T_{30}$ can be simultaneously performed by all the pixel circuits $P_N$ and $P_{OB}$ in the pixel array 10. The accumulation of charges in the photodiode PD may start from the period $T_{30}$. In this case, the timing when the discharge control line OFG goes to the intermediate voltage $M_{22}$ during the period $T_{30}$ is the timing of an electronic shutter (particularly, global shutter). In addition, in this case, in all the control groups, the period $T_{30}$ is not necessarily required to start after the completion of the operations performed during the periods $T_{26}$ to $T_{29}$ as illustrated in FIGS. 12 and 13, and there may be a control group in which the period $T_{30}$ starts before the start of the operations performed during the periods $T_{26}$ to $T_{29}$ or in the middle of the operations performed during the periods $T_{26}$ to $T_{29}$.

As described above, in the solid-state image sensor 1 of the fourth embodiment of the present invention, it is possible to directly reduce a fluctuation in the output of the pixel circuits $P_N$ and $P_{OB}$ belonging to the same control group, which is a cause of pseudo-smear, by limiting the upper limit amount of the charges E accumulated in the photodiode PD. As a result, it is possible to effectively reduce the occurrence of pseudo-smear by adopting a simple configuration and operation in which the upper limit amount of the charges E eventually retained in the floating diffusion area FD is limited.

In the solid-state image sensor 1 of the fourth embodiment of the present invention, the upper limit amount of the charges E eventually retained in the floating diffusion area FD is further decreased to the extent corresponding to the condition in which pseudo-smear is likely to appear due to a high A/D conversion gain. As a result, it is possible to effectively reduce the occurrence of pseudo-smear as necessary.

<Fifth Embodiment>

Hereinafter, a solid-state image sensor of a fifth embodiment of the present invention will be described. The solid-state image sensor of the fifth embodiment of the present invention is equivalent to a modification example of the solid-state image sensor of the fourth embodiment of the present invention. Hereinafter, the points of difference between the solid-state image sensor of the fifth embodiment of the present invention and the solid-state image sensor of the fourth embodiment of the present invention will be described with reference to the accompanying drawings.

Figure 14:
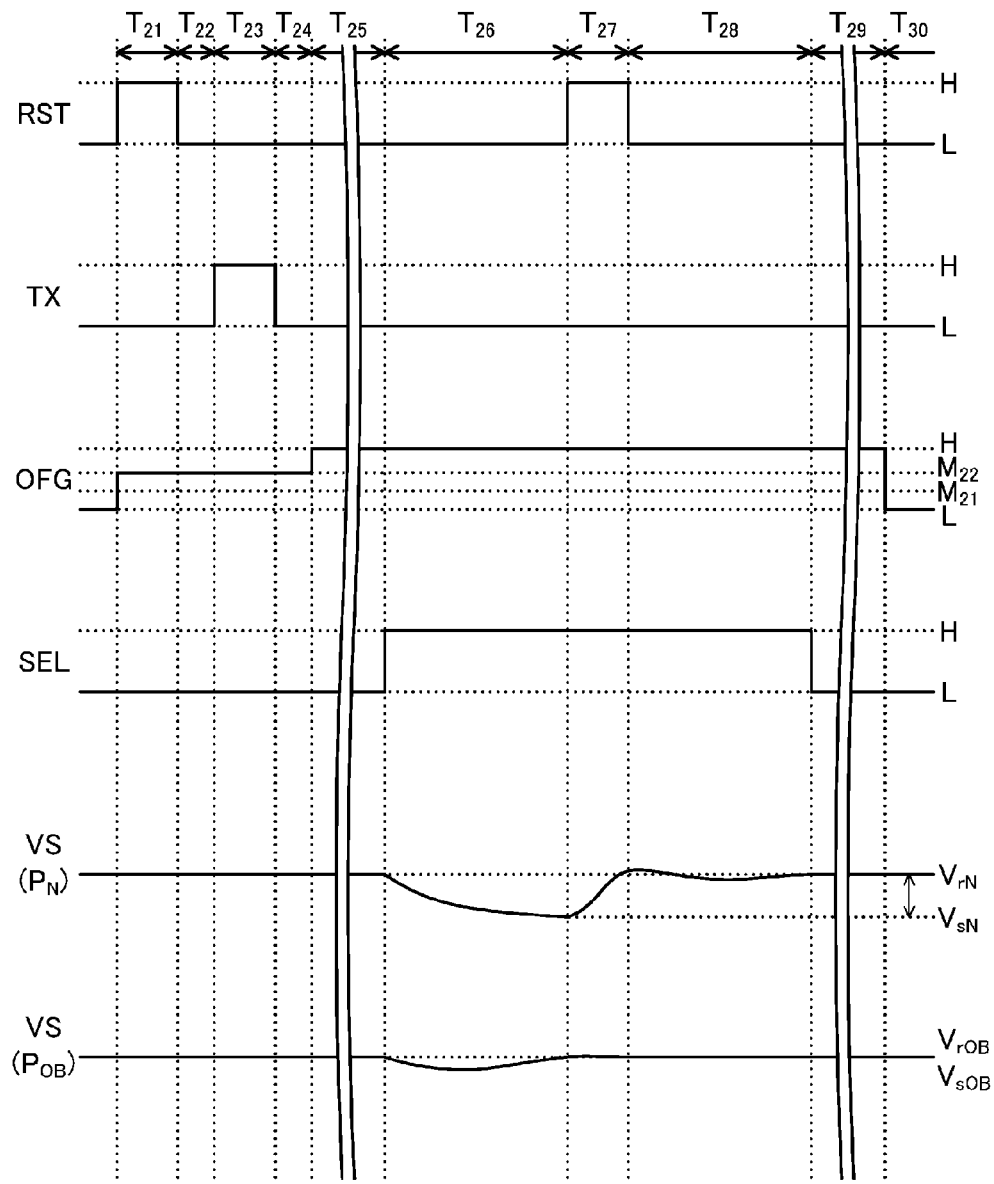
FIG. 14 is a timing chart illustrating the operation of a pixel circuit of a solid-state image sensor of a fifth embodiment of the present invention.

FIG. 14 is a timing chart illustrating the operation of a pixel circuit of the solid-state image sensor of the fifth embodiment of the present invention. FIG. 14 corresponds to FIG. 12 which illustrates the operation of the solid-state image sensor of the fourth embodiment of the present invention. Similar to FIG. 12, reference sign "$M_{21}$" is assigned to an intermediate voltage in a case where a gain is low, and reference sign "$M_{22}$" is assigned to an intermediate voltage in a case where a gain is high. In FIG. 14, a fluctuation in the voltage of the output signal line VS is illustrated in an emphasized manner, and the illustration of noise superimposed on the transfer control line TX or the reset control line RST is omitted.

As illustrated in FIG. 14, in the solid-state image sensor 1 of the fifth embodiment of the present invention, the discharge control line OFG goes to the low voltage L or the intermediate voltage $M_{22}$ during periods apart from a period during which the discharge control line OFG goes to the high voltage H. Particularly, during periods apart from the periods $T_{21}$ to $T_{29}$, the discharge control line OFG goes to the low voltage L, and thus the discharge transistor 15 enters an OFF mode.

As such, if the discharge transistor 15 enters an OFF mode, the concentration of charges (positive holes) having polarity opposite to that of charges (electrons) accumulated in the photodiode PD may increase under the gate of the discharge transistor 15. Accordingly, charges generated due to dark current can be inhibited from flowing into the photodiode PD.

A period during which the discharge control line OFG goes to the low voltage L (period during which the low voltage L is applied to the gate of the discharge transistor 15) may account for 90% or greater of a period that is the sum of the period during which the discharge control line OFG goes to the low voltage L (period during which the low voltage L is applied to the gate of the discharge transistor 15) and periods during which the discharge control line OFG goes to the intermediate voltages $M_{21}$ and $M_{22}$ (periods during which the intermediate voltages $M_{21}$ and $M_{22}$ are applied to the gate of the discharge transistor 15).

In this configuration, dark current which increases due to the intermediate voltages $M_{21}$ and $M_{22}$ being used instead of the low voltage L can be reduced to one tenth or less.

<Sixth Embodiment>

Hereinafter, a solid-state image sensor of a sixth embodiment of the present invention will be described. The only difference between the solid-state image sensor of the sixth embodiment of the present invention and the solid-state image sensor of the fourth embodiment of the present invention is a portion of the configuration and operation of the pixel circuits $P_N$ and $P_{OB}$. Hereinafter, the points of difference between the solid-state image sensor of the sixth embodiment of the present invention and the solid-state image sensor of the fourth embodiment of the present invention will be described with reference to the accompanying drawings.

Figure 15:
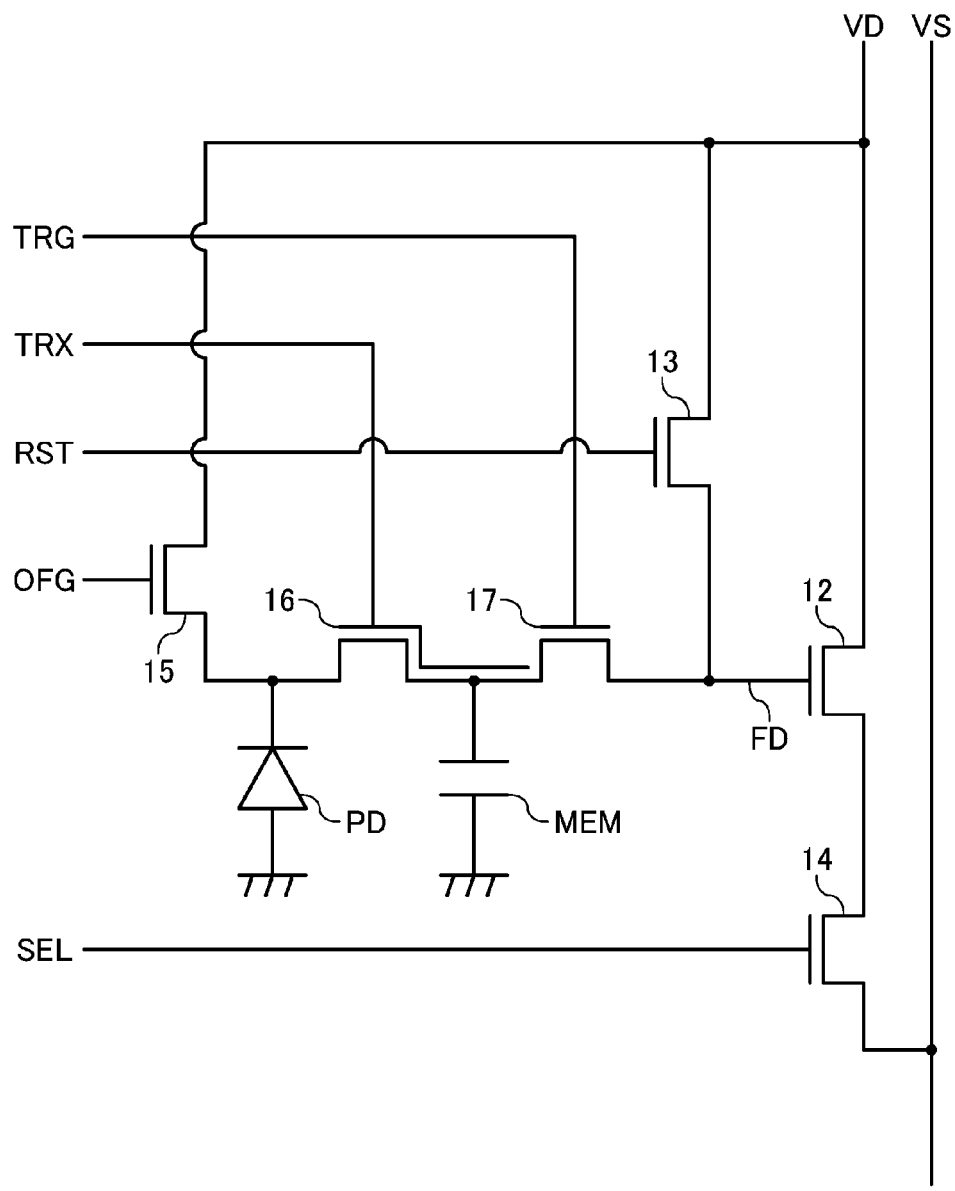
FIG. 15 is a circuit diagram of a pixel circuit of a solid-state image sensor of a sixth embodiment of the present invention.

FIG. 15 is a circuit diagram of a pixel circuit of the solid-state image sensor of the sixth embodiment of the present invention. As illustrated in FIG. 15, each of the effective pixel circuit $P_N$ and the OB pixel circuit $P_{OB}$ includes the photodiode PD; the floating diffusion area FD; the output transistor 12; the reset transistor 13; the selective transistor 14; the discharge transistor 15; a memory area (charge retaining unit) MEM that temporarily retains charges before being transferred from the photodiode PD to the floating diffusion area FD; a first transfer gate (first transfer unit) 16 through which charges are transferred from the photodiode PD to the memory area MEM; and a second transfer gate (second transfer unit) 17 through which charges retained by the memory area MEM are transferred to the floating diffusion area FD.

Since charges accumulated by the photodiode PD are transferred to the floating diffusion area FD via the first transfer gate 16 and the second transfer gate 17, it can be said that the first transfer gate 16 and the second transfer gate 17 are equivalent to the transfer gate 11 of the solid-state image sensor of the first to fifth embodiments. The first transfer gate 16 and the second transfer gate 17 are different from the transfer gate 11 of the solid-state image sensor of the first to fifth embodiments in that the first transfer gate 16 and the second transfer gate 17 can be individually controlled, and are capable of temporarily retaining charges in the memory area MEM in the middle of transferring charges from the photodiode PD to the floating diffusion area FD.

The anode of the photodiode PD is grounded. The first transfer gate 16 is connected to a first transfer control line TRX. The second transfer gate 17 is connected to a second transfer control line TRG. The output transistor 12 has a gate connected to the floating diffusion area FD, a drain connected to the common power supply line VD, and a source connected to the drain of the selective transistor 14. The reset transistor 13 has a gate connected to the reset control line RST, a drain connected to the common power supply line VD, and a source connected to the floating diffusion area FD. The selective transistor 14 has a gate connected to a selection control line SEL, and a source connected to the output signal line VS. The discharge transistor 15 has a gate connected to the discharge control line OFG, a drain connected to the common power supply line VD, and a source connected to the cathode of the photodiode PD.

The reset control line RST, the selection control line SEL, and the second transfer control line TRG are common to the pixel circuits $P_N$ and $P_{OB}$ which belong to the same control group in the pixel array 10. The first transfer control line TRX, the discharge control line OFG, and the common power supply line VD are common to all the pixel circuits $P_N$ and $P_{OB}$ in the pixel array 10.

Figure 16:
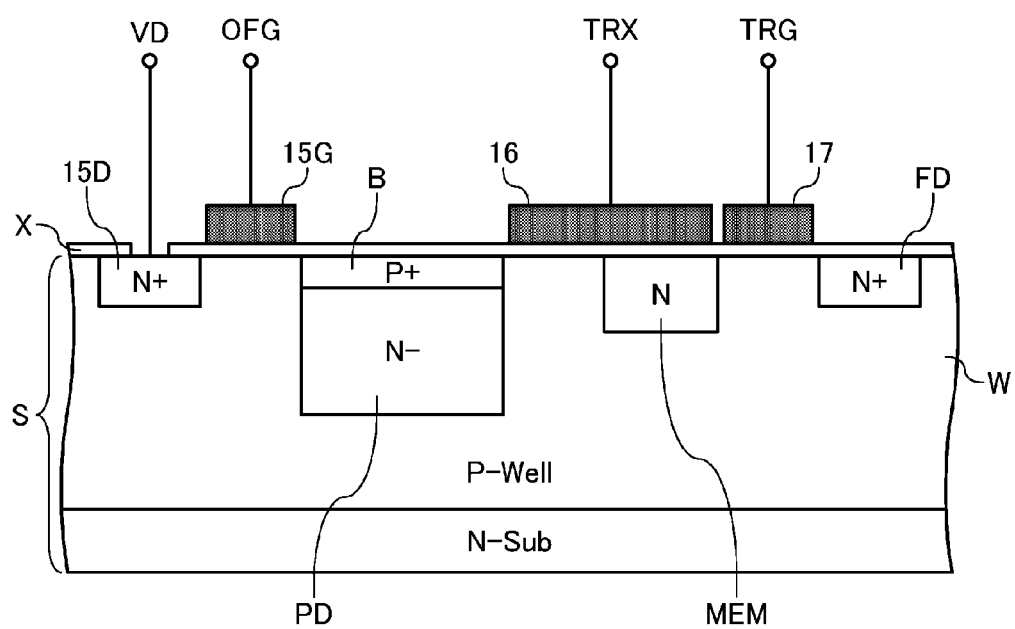
FIG. 16 is a schematic sectional view illustrating an example of the configuration of a portion of the pixel circuit illustrated in FIG. 15.

FIG. 16 is a schematic sectional view illustrating an example of the configuration of a portion of the pixel circuit illustrated in FIG. 15. FIG. 16 illustrates a section of the path from the discharge transistor 15 to the floating diffusion area FD in the pixel circuit illustrated in FIG. 15.

As illustrated in FIG. 16, each portion of the pixel circuit is provided in a P-well W that is formed inside of and on an upper surface side (upper side in FIG. 16, and hereinafter, referred to as an "upper side") of an N-substrate S. A gate oxide film X is provided on an upper surface of the substrate S (well W), and various gates such as a gate 15G of the discharge transistor, the first transfer gate 16, and the second transfer gate 17 are provided on an upper surface of the gate oxide film X.

The photodiode PD includes an N-type (N−) area that is formed inside of the P-well W. The photodiode PD accumulates charges (electrons), which are generated via photoelectric conversion, in this area. Strictly speaking, the photodiode is formed of a combination of a P-well which is a cathode and an N-type (N−) area which is an anode; however, herein, the photodiode PD refers to only the N-type (N−) area in which charges are accumulated.

A P-type (P+) embedded area B is formed on the upper side of the photodiode PD and in the vicinity of an upper surface of the inside of the substrate S (well W). Since the embedded area B is formed, the photodiode PD accumulates charges at a position spaced from the upper surface of the substrate S which may have many defects. As a result, dark current is reduced.

A drain 15D of the discharge transistor and the floating diffusion area FD are N-type (N+) areas which are formed in the vicinity of the upper surface of the inside of the substrate S (well W). The gate 15G of the discharge transistor is formed on the uppers surface of the gate oxide film X at a position at which the gate 15G covers an area between the drain 15D of the discharge transistor and the photodiode PD. The photodiode PD is equivalent to the source of the discharge transistor.

The memory area MEM is an N-type (N) area that is formed in the vicinity of the upper surface of the inside of the substrate S (well W). The memory area MEM is provided in an area between the photodiode PD and the floating diffusion area FD.

The first transfer gate 16 is formed on the upper surface of the gate oxide film X at a position at which the first transfer gate 16 covers an area between the photodiode PD and the memory area MEM, and a portion or the entirety of the memory area MEM. The second transfer gate 17 is formed on the upper surface of the gate oxide film X at a position at which the second transfer gate 17 covers an area between the memory area MEM and the floating diffusion area FD.

Figure 17:
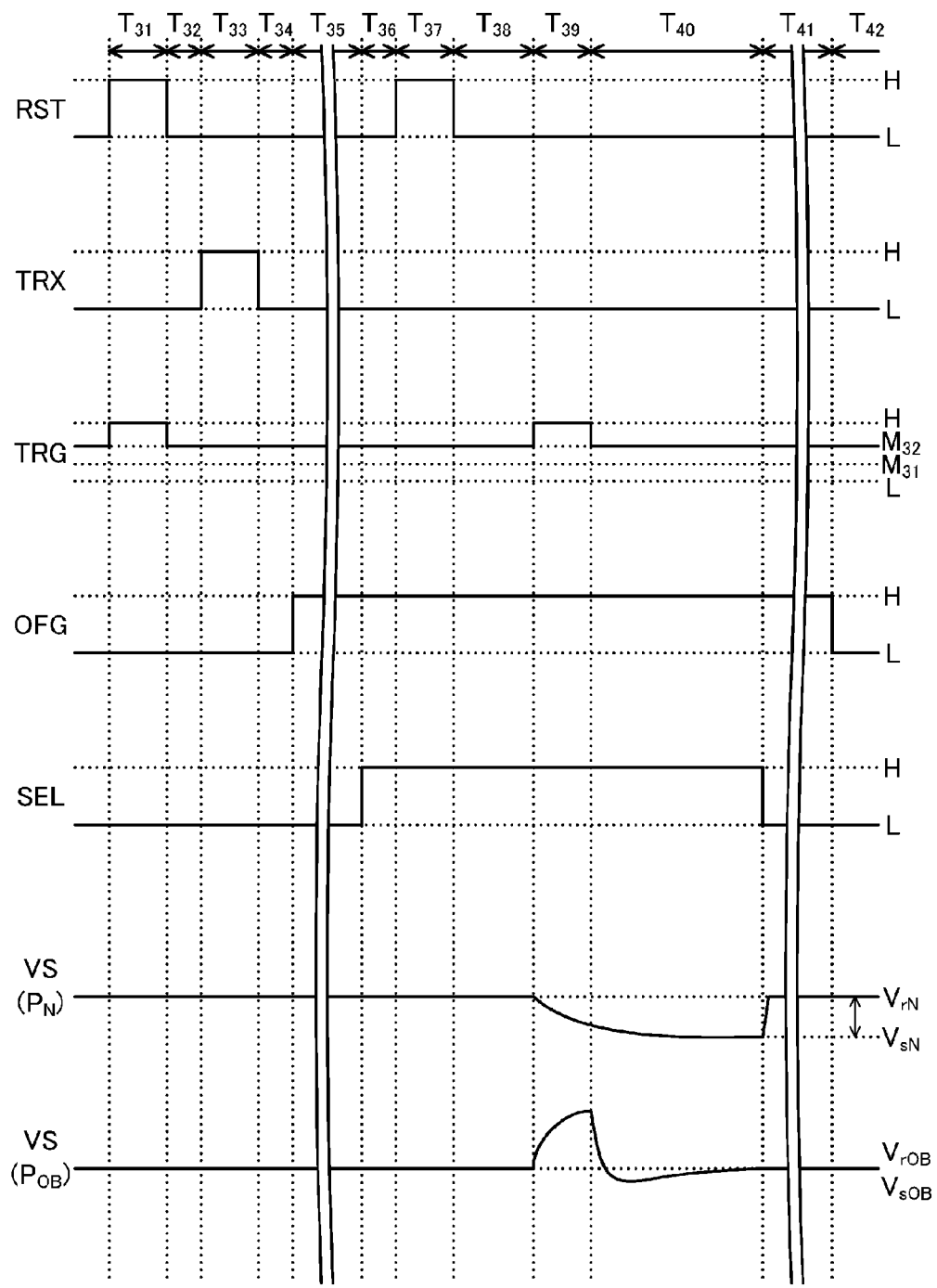
FIG. 17 is a timing chart illustrating the operation of the pixel circuit of the solid-state image sensor of the sixth embodiment of the present invention.
Figure 18:
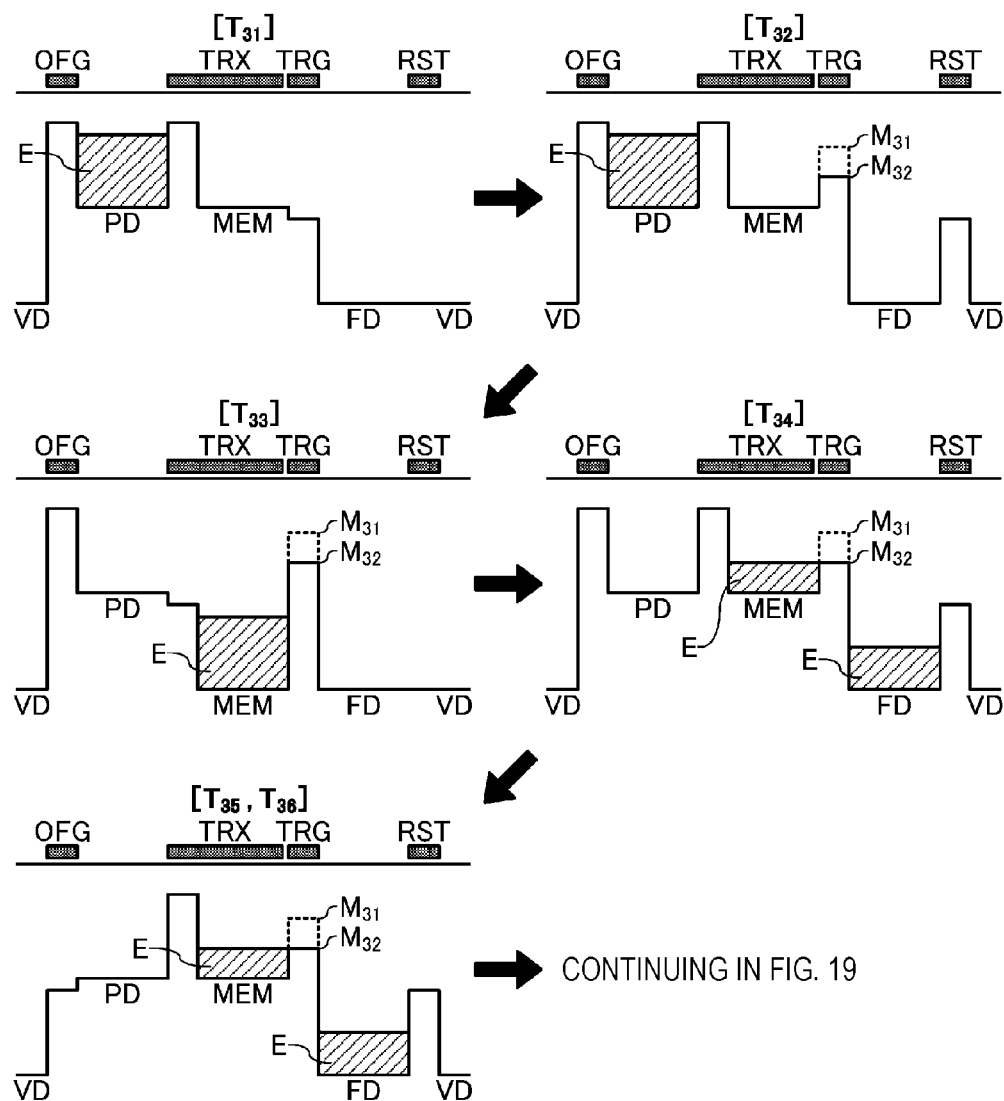
FIG. 18 is a potential diagram of an effective pixel circuit that performs the operation illustrated in FIG. 17.
Figure 19:
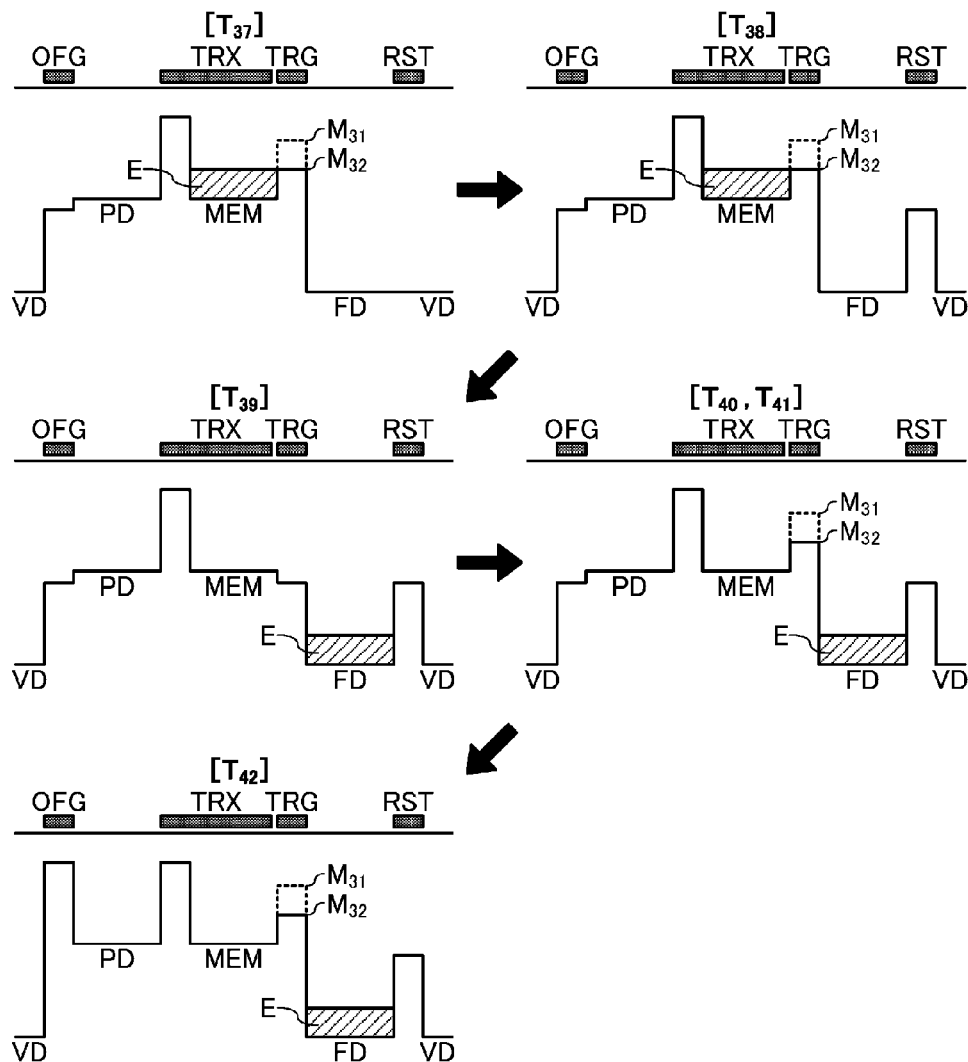
FIG. 19 is a potential diagram of the effective pixel circuit that performs the operation illustrated in FIG. 17.

FIG. 17 is a timing chart illustrating the operation of the pixel circuit of the solid-state image sensor of the sixth embodiment of the present invention. FIGS. 18 and 19 are potential diagrams of an effective pixel circuit that performs the operation illustrated in FIG. 17. FIGS. 17 to 19 correspond to FIGS. 12 and 13 which illustrate the operation of the solid-state image sensor of the fourth embodiment of the present invention. Similar to FIGS. 12 and 13, reference sign "$M_{31}$" is assigned to an intermediate voltage or a potential barrier in a case where a gain is low, and reference sign "$M_{32}$" is assigned to an intermediate voltage or a potential barrier in a case where a gain is high. In FIG. 17, a fluctuation in the voltage of the output signal line VS is illustrated in an emphasized manner, and the illustration of noise superimposed on the second transfer control line TRG or the reset control line RST is omitted.

Although in FIGS. 17 to 19 illustration starts from a period $T_{31}$, the accumulation of the charges E in the photodiode PD is assumed to start at a certain timing before the period $T_{31}$ (electronic shutter). At this time, initially, the discharge control line OFG goes to the high voltage H, and the discharge transistor 15 enters an ON mode. Therefore, charges in the photodiode PD are discharged to the outside of the pixel circuits $P_N$ and $P_{OB}$ via the common power supply line VD. The discharge control line OFG goes to the low voltage L, and thus the accumulation of the charges E in the photodiode PD starts. Since light is not incident on the OB pixel circuit $P_{OB}$, the generation of charges via photoelectric conversion does not occur, and charges are not accumulated in the photodiode PD, but charges may be accumulated due to dark current or the like.

As illustrated in FIGS. 17 to 19, first, both the second transfer control line TRG and the reset control line RST go to the high voltage H during the period $T_{31}$, and both the transistor including the second transfer gate 17 as a gate and the reset transistor 13 enter an ON mode. Therefore, charges in the memory area MEM and the floating diffusion area FD are discharged to the common power supply line VD.

Subsequently, if the reset control line RST goes to the low voltage L during a period $T_{32}$, a potential barrier under the gate of the reset transistor 13 increases, and the reset transistor 13 enters an OFF mode. If the second transfer control line TRG goes to an intermediate voltage $M_{32}$ at the same time, a potential barrier under the second transfer gate 17 is present between an ON mode and an OFF mode.

Subsequently, if the first transfer control line TRX goes to the high voltage H during a period $T_{33}$, a potential barrier under the first transfer gate 16 decreases. That is, the potential barrier of the area between the photodiode PD and the memory area MEM decreases, and the potential of the memory area MEM decreases. Accordingly, the charges E in the photodiode PD are transferred to the memory area MEM. Since photoelectric conversion is not performed in the OB pixel circuit $P_{OB}$, almost no charges are transferred to the memory area MEM.

Subsequently, if the first transfer control line TRX goes to the low voltage L during a period $T_{34}$, a potential barrier under the first transfer gate 16 increases. That is, the potential barrier of the area between the photodiode PD and the memory area MEM increases, and the potential of the memory area MEM increases. Accordingly, the transfer of the charges E from the photodiode PD to the memory area MEM stops. In this case, the charges E exceeding the potential barrier (that is, the upper limit amount of charges retained by the memory area MEM) under the second transfer gate 17 overflow from the memory area MEM, and are discharged to the floating diffusion area FD. In a case where a set gain is low, the second control line TRG goes to an intermediate voltage $M_{31}$ lower than the intermediate voltage $M_{32}$, and a potential barrier under the second transfer gate 17 is larger than that at the intermediate voltage $M_{32}$.

Subsequently, if the discharge control line OFG goes to the high voltage H during a period $T_{35}$, a potential barrier under the gate 15G of the discharge transistor 15 decreases, and the discharge transistor 15 enters an ON mode. Therefore, the charges E in the photodiode PD are discharged to the outside of the pixel circuits $P_N$ and $P_{OB}$ via the common power supply line VD. The aforementioned operations performed during the periods $T_{31}$ to $T_{35}$ can be simultaneously performed by all the pixel circuits $P_N$ and $P_{OB}$ in the pixel array 10.

Subsequently, if the selection control line SEL goes to the high voltage H during a period $T_{36}$, the selective transistor 14 enters an ON mode, and a signal (voltage) output from the output transistor 12 is applied to the output signal line VS.

Subsequently, if the reset control line RST goes to the high voltage H during a period $T_{37}$, a potential barrier under the gate of the reset transistor 13 decreases, and the reset transistor 13 enters an ON mode. Therefore, charges in the floating diffusion area FD are discharged to the outside of the pixel circuits $P_N$ and $P_{OB}$ via the common power supply line VD.

Subsequently, if the reset control line RST goes to the low voltage L during a period $T_{38}$, a potential barrier under the gate of the reset transistor 13 increases, and the reset transistor 13 enters an OFF mode. At the end of the period $T_{38}$ (after a settling time has elapsed), the A/D conversion circuit 23 samples the voltage $V_{rN}$ of the output signal line VS in a state where charges are not retained in the floating diffusion area FD of the effective pixel circuit $P_N$, and the voltage $V_{rOB}$ of the output signal line VS in a state where charges are not retained in the floating diffusion area FD of the OB pixel circuit $P_{OB}$.

Subsequently, if the second transfer control line TRG goes to the high voltage H during a period $T_{39}$, a potential barrier under the second transfer gate 17 decreases, and the transistor including the second transfer gate 17 as a gate enters an ON mode. Therefore, the charges E in the memory area MEM are transferred to the floating diffusion area FD. In this case, as described above, the charges E transferred from the memory area MEM to the floating diffusion area FD are the charges E which are accumulated in the memory area MEM as the result of limiting the upper limit amount by applying the intermediate voltage $M_{32}$ to the second transfer control line TRG. Since as described above, the OB pixel circuit $P_{OB}$ retains almost no charges to be transferred to and accumulated in the memory area MEM, almost no charges are transferred to the floating diffusion area FD.

Subsequently, if the second transfer control line TRG goes to the intermediate voltage $M_{32}$ during a period $T_{40}$, a potential barrier under the second transfer gate 17 increases to a level between an ON mode and an OFF mode. Therefore, the transfer of charges from the memory area MEM to the floating diffusion area FD stops. At the end of the period $T_{40}$ (after a settling time has elapsed), the A/D conversion circuit 23 samples the voltage $V_{sN}$ of the output signal line VS which corresponds to charges retained in the floating diffusion area FD of the effective pixel circuit $P_N$, and the voltage $V_{sOB}$ of the output signal line VS which corresponds to charges retained in the floating diffusion area FD of the OB pixel circuit $P_{OB}$.

Subsequently, if the selection control line SEL goes to a low voltage during a period $T_{41}$, the selective transistor 14 enters an OFF mode. The aforementioned operations performed during the periods $T_{36}$ to $T_{41}$ can be performed by the pixel circuits $P_N$ and $P_{OB}$ in each control group of the pixel array 10.

Subsequently, if the discharge control line OFG goes to the low voltage L during a period $T_{42}$, a potential barrier under the gate 15G of the discharge transistor 15 increases, and the discharge transistor 15 enters an OFF mode. Therefore, the discharge of charges from the photodiode PD stops. The operation performed during the period $T_{42}$ can be simultaneously performed by all the pixel circuits $P_N$ and $P_{OB}$ in the pixel array 10. The accumulation of charges in the photodiode PD may start from the period $T_{42}$. In this case, the timing when the discharge control line OFG goes to the low voltage L during the period $T_{42}$ is the timing of an electronic shutter (particularly, global shutter). In addition, in this case, in all the control groups, the period $T_{42}$ is not necessarily required to start after the completion of the operations performed during the periods $T_{36}$ to $T_{41}$ as illustrated in FIGS. 17 to 19, and there may be a control group in which the period $T_{42}$ starts before the start of the operations performed during the periods $T_{36}$ to $T_{41}$ or in the middle of the operations performed during the periods $T_{36}$ to $T_{41}$.

As described above, in the solid-state image sensor 1 of the sixth embodiment of the present invention, it is possible to directly reduce a fluctuation in the output of the pixel circuits $P_N$ and $P_{OB}$ belonging to the same control group, which is a cause of pseudo-smear, by limiting the upper limit amount of the charges E retained in the memory area MEM. As a result, it is possible to effectively reduce the occurrence of pseudo-smear by adopting a simple configuration and operation in which the upper limit amount of the charges E eventually retained in the floating diffusion area FD is limited.

In the solid-state image sensor 1 of the sixth embodiment of the present invention, the upper limit amount of the charges E eventually retained in the floating diffusion area FD is further decreased to the extent corresponding to the condition in which pseudo-smear is likely to appear due to a high A/D conversion gain. As a result, it is possible to effectively reduce the occurrence of pseudo-smear as necessary.

<Seventh Embodiment>

Hereinafter, a solid-state image sensor of a seventh embodiment of the present invention will be described. The only difference between the solid-state image sensor of the seventh embodiment of the present invention and the solid-state image sensor of the sixth embodiment of the present invention is a portion of an operation. Hereinafter, the points of difference between the solid-state image sensor of the seventh embodiment of the present invention and the solid-state image sensor of the sixth embodiment of the present invention will be described with reference to the accompanying drawings.

Figure 20:
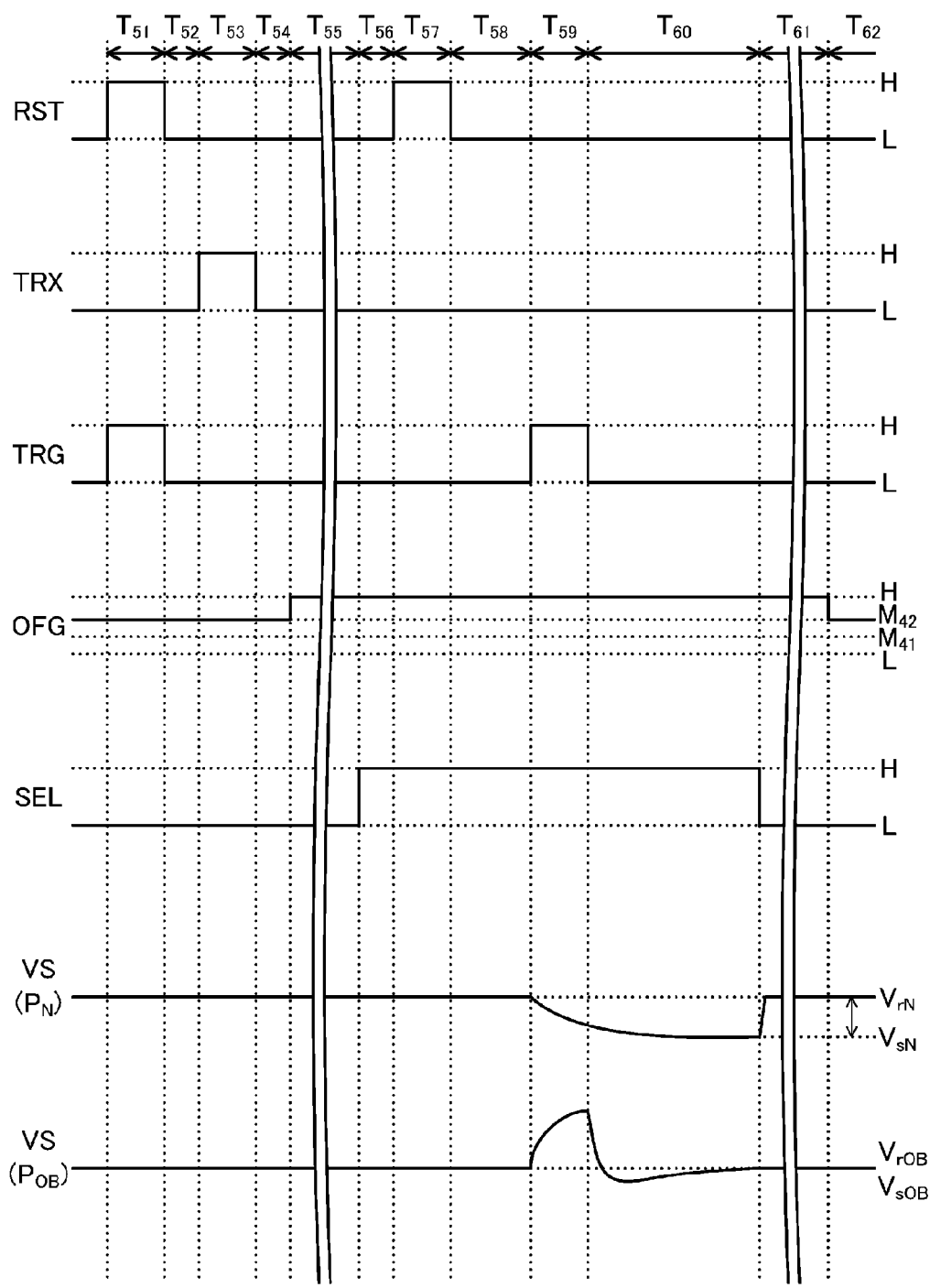
FIG. 20 is a timing chart illustrating the operation of a pixel circuit of a solid-state image sensor of a seventh embodiment of the present invention.
Figure 21:
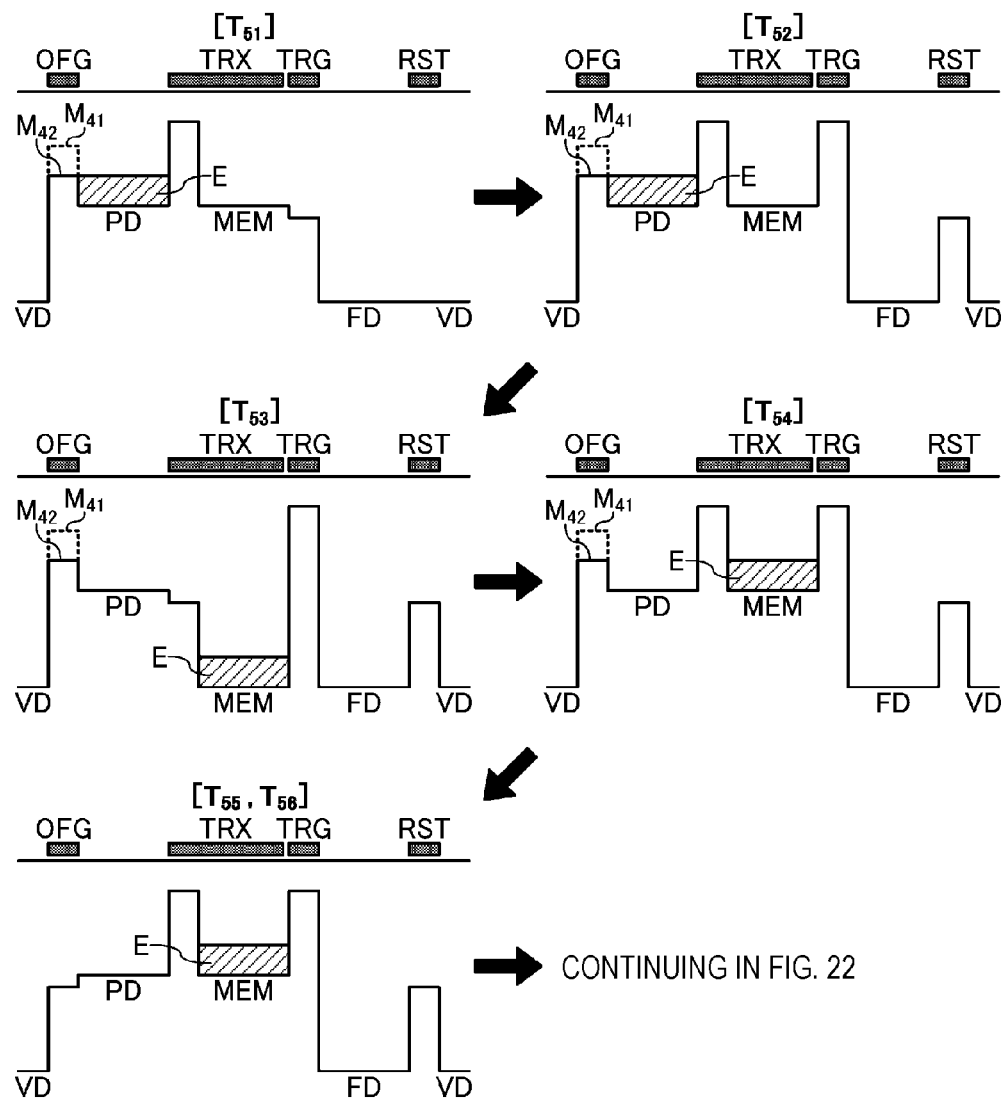
FIG. 21 is a potential diagram of an effective pixel circuit that performs the operation illustrated in FIG. 20.
Figure 22:
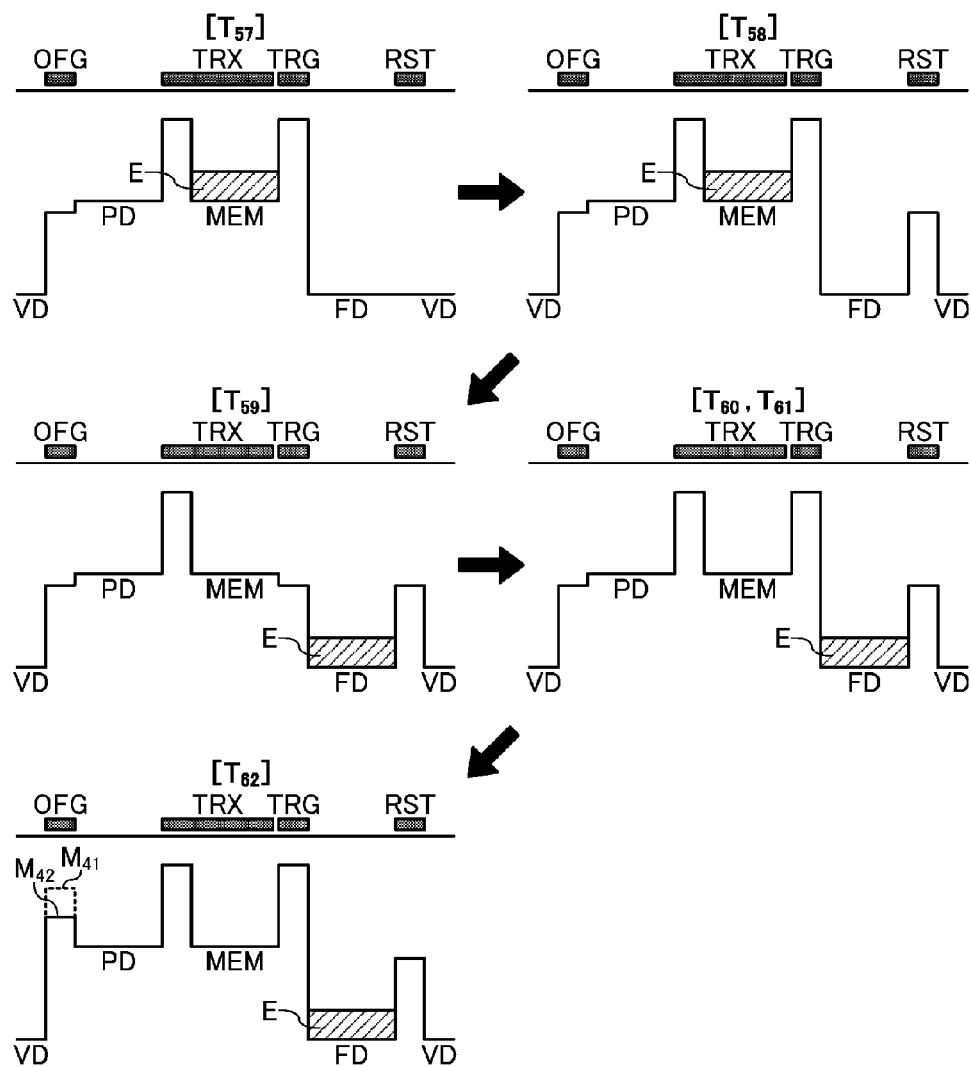
FIG. 22 is a potential diagram of the effective pixel circuit that performs the operation illustrated in FIG. 20.

FIG. 20 is a timing chart illustrating the operation of a pixel circuit of the solid-state image sensor of the seventh embodiment of the present invention. FIGS. 21 and 22 are potential diagrams of an effective pixel circuit that performs the operation illustrated in FIG. 20. FIGS. 20 to 22 respectively correspond to FIGS. 17 to 19 which illustrate the operation of the solid-state image sensor of the sixth embodiment of the present invention in a case where a set gain is high. Similar to FIGS. 17 to 19, reference sign "$M_{41}$" is assigned to an intermediate voltage or a potential barrier in a case where a gain is low, and reference sign "$M_{42}$" is assigned to an intermediate voltage or a potential barrier in a case where a gain is high. In FIG. 20, a fluctuation in the voltage of the output signal line VS is illustrated in an emphasized manner, and the illustration of noise superimposed on the second transfer control line TRG or the reset control line RST is omitted.

Although in FIGS. 20 to 22 illustration starts from a period $T_{51}$, the accumulation of the charges E in the photodiode PD is assumed to start at a certain timing before the period $T_{51}$ (electronic shutter). At this time, initially, the discharge control line OFG goes to the high voltage H, and the discharge transistor 15 enters an ON mode. Therefore, charges in the photodiode PD are discharged to the outside of the pixel circuits $P_N$ and $P_{OB}$ via the common power supply line VD. The discharge control line OFG goes to an intermediate voltage $M_{42}$, and thus the accumulation of the charges E in the photodiode PD starts. Since light is not incident on the OB pixel circuit $P_{OB}$, the generation of charges via photoelectric conversion does not occur, and charges are not accumulated in the photodiode PD, but charges may be accumulated due to dark current or the like.

After the discharge control line OFG goes to the intermediate voltage $M_{42}$, a potential barrier under the gate 15G of the discharge transistor 15 is present between an ON mode and an OFF mode. Accordingly, charges are being accumulated in the photodiode PD, and charges exceeding the potential barrier (that is, the upper limit amount of charges accumulated by the photodiode PD) under the gate 15G of the discharge transistor 15 are discharged to the outside of the pixel circuits $P_N$ and $P_{OB}$ via the common power supply line VD instead of being accumulated in the photodiode PD. In a case where a set gain is low, the discharge control line OFG goes to an intermediate voltage $M_{41}$ lower than the intermediate voltage $M_{42}$, and a potential barrier under the gate 15G of the discharge transistor 15 is larger than that at the intermediate voltage $M_{42}$.

As illustrated in FIGS. 20 to 22, both the second transfer control line TRG and the reset control line RST go to the high voltage H during the period $T_{51}$, and both the transistor including the second transfer gate 17 as a gate and the reset transistor 13 enter an ON mode. Therefore, charges in the memory area MEM and the floating diffusion area FD are discharged to the common power supply line VD.

Subsequently, if the reset control line RST goes to the low voltage L during a period $T_{52}$, a potential barrier under the gate of the reset transistor 13 increases, and the reset transistor 13 enters an OFF mode. If the second transfer control line TRG goes to the low voltage L at the same time, a potential barrier under the second transfer gate 17 increases, and the transistor including the second transfer gate 17 as a gate enters an OFF mode.

Subsequently, if the first transfer control line TRX goes to the high voltage H during a period $T_{53}$, a potential barrier under the first transfer gate 16 decreases. That is, the potential barrier of the area between the photodiode PD and the memory area MEM decreases, and the potential of the memory area MEM decreases. Accordingly, the charges E in the photodiode PD are transferred to the memory area MEM. In this case, as described above, the charges E transferred from the photodiode PD to the memory area MEM are the charges E which are accumulated in the photodiode PD as the result of limiting the upper limit amount by applying the intermediate voltage $M_{42}$ to the discharge control line OFG. Since photoelectric conversion is not performed in the OB pixel circuit $P_{OB}$, almost no charges are transferred to the memory area MEM.

Subsequently, if the first transfer control line TRX goes to the low voltage L during a period $T_{54}$, a potential barrier under the first transfer gate 16 increases. That is, the potential barrier of the area between the photodiode PD and the memory area MEM increases, and the potential of the memory area MEM increases. Accordingly, the transfer of the charges E from the photodiode PD to the memory area MEM stops.

Subsequently, if the discharge control line OFG goes to the high voltage H during a period $T_{55}$, a potential barrier under the gate 15G of the discharge transistor 15 decreases, and the discharge transistor 15 enters an ON mode. Therefore, the charges E in the photodiode PD are discharged to the outside of the pixel circuits $P_N$ and $P_{OB}$ via the common power supply line VD. The aforementioned operations performed during the periods $T_{51}$ to $T_{55}$ can be simultaneously performed by all the pixel circuits $P_N$ and $P_{OB}$ in the pixel array 10.

Subsequently, if the selection control line SEL goes to the high voltage H during a period $T_{56}$, the selective transistor 14 enters an ON mode, and a signal (voltage) output from the output transistor 12 is applied to the output signal line VS.

Subsequently, if the reset control line RST goes to the high voltage H during a period $T_{57}$, a potential barrier under the gate of the reset transistor 13 decreases, and the reset transistor 13 enters an ON mode. Therefore, charges in the floating diffusion area FD are discharged to the outside of the pixel circuits $P_N$ and $P_{OB}$ via the common power supply line VD.

Subsequently, if the reset control line RST goes to the low voltage L during a period $T_{58}$, a potential barrier under the gate of the reset transistor 13 increases, and the reset transistor 13 enters an OFF mode. At the end of the period $T_{58}$ (after a settling time has elapsed), the A/D conversion circuit 23 samples the voltage $V_{rN}$ of the output signal line VS in a state where charges are not retained in the floating diffusion area FD of the effective pixel circuit $P_N$, and the voltage $V_{rOB}$ of the output signal line VS in a state where charges are not retained in the floating diffusion area FD of the OB pixel circuit $P_{OB}$.

Subsequently, if the second transfer control line TRG goes to the high voltage H during a period $T_{59}$, a potential barrier under the second transfer gate 17 decreases, and the transistor including the second transfer gate 17 as a gate enters an ON mode. Therefore, the charges E in the memory area MEM are transferred to the floating diffusion area FD. Since as described above, the OB pixel circuit $P_{OB}$ retains almost no charges to be transferred to and accumulated in the memory area MEM, almost no charges are transferred to the floating diffusion area FD.

Subsequently, if the second transfer control line TRG goes to the low voltage L during a period $T_{60}$, a potential barrier under the second transfer gate 17 increases, and the transistor including the second transfer gate 17 as a gate enters an OFF mode. Therefore, the transfer of charges from the memory area MEM to the floating diffusion area FD stops.

At the end of the period $T_{60}$ (after a settling time has elapsed), the A/D conversion circuit 23 samples the voltage $V_{sN}$ of the output signal line VS which corresponds to charges retained in the floating diffusion area FD of the effective pixel circuit $P_N$, and the voltage $V_{sOB}$ of the output signal line VS which corresponds to charges retained in the floating diffusion area FD of the OB pixel circuit $P_{OB}$.

Subsequently, if the selection control line SEL goes to a low voltage during a period $T_{61}$, the selective transistor 14 enters an OFF mode. The aforementioned operations performed during the periods $T_{56}$ to $T_{61}$ can be performed by the pixel circuits $P_N$ and $P_{OB}$ in each control group of the pixel array 10.

Subsequently, if the discharge control line OFG goes to the intermediate voltage $M_{42}$ during a period $T_{62}$, a potential barrier under the gate 15G of the discharge transistor 15 increases to a level between an ON mode and an OFF mode. Therefore, the discharge of charges from the photodiode PD stops. The operation performed during the period $T_{62}$ can be simultaneously performed by all the pixel circuits $P_N$ and $P_{OB}$ in the pixel array 10. The accumulation of charges in the photodiode PD may start from the period $T_{62}$. In this case, the timing when the discharge control line OFG goes to the intermediate voltage $M_{42}$ during the period $T_{62}$ is the timing of an electronic shutter (particularly, global shutter). In addition, in this case, in all the control groups, the period $T_{62}$ is not necessarily required to start after the completion of the operations performed during the periods $T_{56}$ to $T_{61}$ as illustrated in FIGS. 20 to 22, and there may be a control group in which the period $T_{62}$ starts before the start of the operations performed during the periods $T_{56}$ to $T_{61}$ or in the middle of the operations performed during the periods $T_{56}$ to $T_{61}$.

As described above, in the solid-state image sensor 1 of the seventh embodiment of the present invention, it is possible to directly reduce a fluctuation in the output of the pixel circuits $P_N$ and $P_{OB}$ belonging to the same control group, which is a cause of pseudo-smear, by limiting the upper limit amount of the charges E retained in the photodiode PD. As a result, it is possible to effectively reduce the occurrence of pseudo-smear by adopting a simple configuration and operation in which the upper limit amount of the charges E eventually retained in the floating diffusion area FD is limited.

In the solid-state image sensor 1 of the seventh embodiment of the present invention, the upper limit amount of the charges E eventually retained in the floating diffusion area FD is further decreased to the extent corresponding to the condition in which pseudo-smear is likely to appear due to a high A/D conversion gain. As a result, it is possible to effectively reduce the occurrence of pseudo-smear as necessary.

<Eighth Embodiment>

Hereinafter, a solid-state image sensor of an eighth embodiment of the present invention will be described. The solid-state image sensor of the eighth embodiment of the present invention is equivalent to a modification example of the solid-state image sensor of the seventh embodiment of the present invention. Hereinafter, the points of difference between the solid-state image sensor of the eighth embodiment of the present invention and the solid-state image sensor of the seventh embodiment of the present invention will be described with reference to the accompanying drawings.

Figure 23:
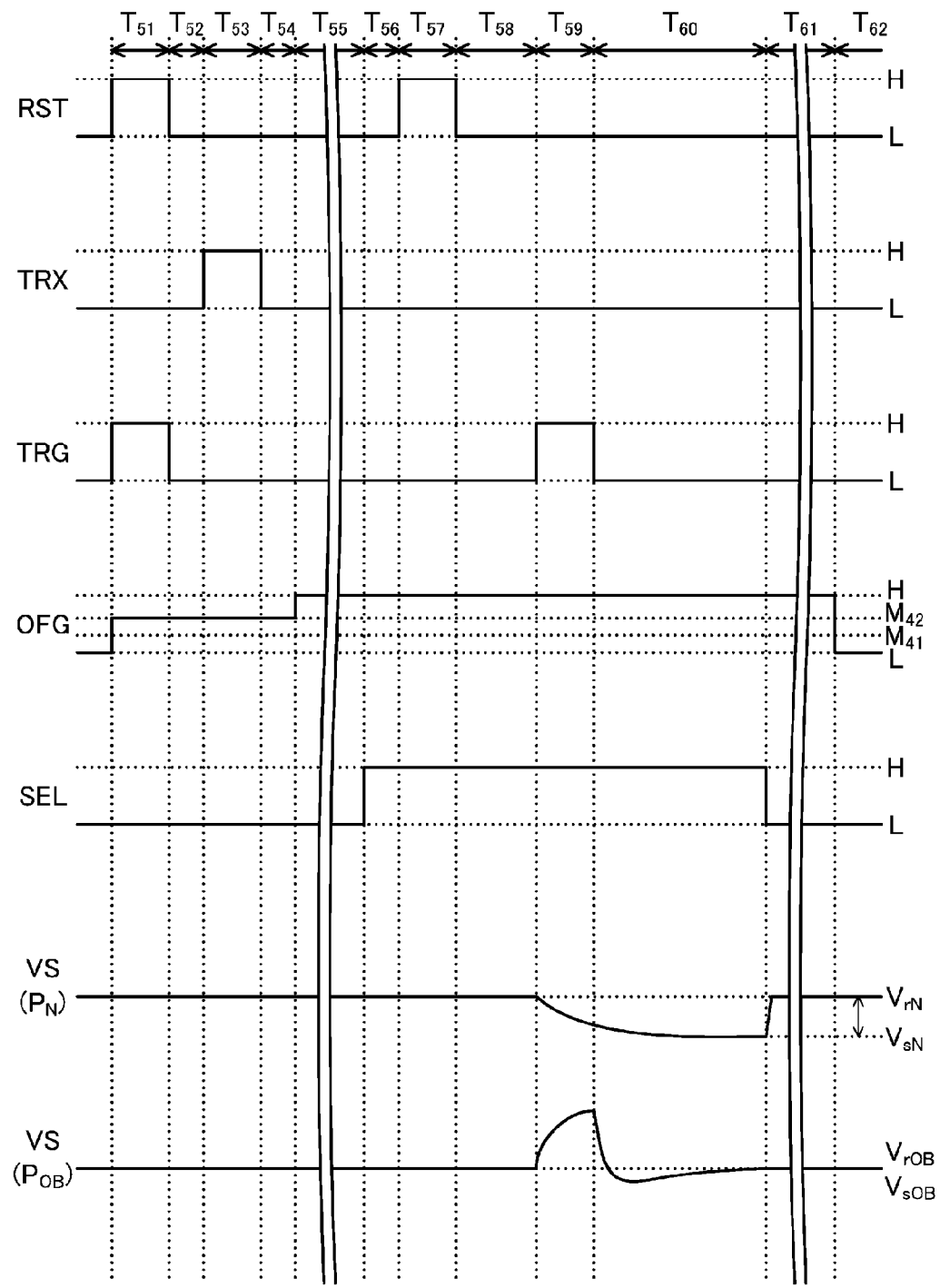
FIG. 23 is a timing chart illustrating the operation of a pixel circuit of a solid-state image sensor of a ninth embodiment of the present invention.

FIG. 23 is a timing chart illustrating the operation of a pixel circuit of the solid-state image sensor of the eighth embodiment of the present invention. FIG. 23 corresponds to FIG. 20 which illustrates the operation of the solid-state image sensor of the seventh embodiment of the present invention. Similar to FIG. 20, reference sign "$M_{41}$" is assigned to an intermediate voltage in a case where a gain is low, and reference sign "$M_{42}$" is assigned to an intermediate voltage in a case where a gain is high. In FIG. 23, a fluctuation in the voltage of the output signal line VS is illustrated in an emphasized manner, and the illustration of noise superimposed on the transfer control line TX or the reset control line RST is omitted.

As illustrated in FIG. 23, in the solid-state image sensor 1 of the eighth embodiment of the present invention, the discharge control line OFG goes to the low voltage L or the intermediate voltage $M_{42}$ during periods apart from a period during which the discharge control line OFG goes to the high voltage H. Particularly, during periods apart from the periods $T_{51}$ to $T_{61}$, the discharge control line OFG goes to the low voltage L, and thus the discharge transistor 15 enters an OFF mode.

As such, if the discharge transistor 15 enters an OFF mode, the concentration of charges (positive holes) having polarity opposite to that of charges (electrons) accumulated in the photodiode PD may increase under the gate 15G of the discharge transistor 15. Accordingly, charges generated due to dark current can be inhibited from flowing into the photodiode PD.

A period during which the discharge control line OFG goes to the low voltage L (period during which the low voltage L is applied to the gate 15G of the discharge transistor 15) may account for 90% or greater of a period that is the sum of the period during which the discharge control line OFG goes to the low voltage L (period during which the low voltage L is applied to the gate 15G of the discharge transistor 15) and periods during which the discharge control line OFG goes to the intermediate voltages $M_{41}$ and $M_{42}$ (periods during which the intermediate voltages $M_{41}$ and $M_{42}$ are applied to the gate 15G of the discharge transistor 15).

In this configuration, dark current which increases due to the intermediate voltages $M_{41}$ and $M_{42}$ being used instead of the low voltage L can be reduced to one tenth or less.

<Ninth Embodiment>

Hereinafter, a solid-state image sensor of a ninth embodiment of the present invention will be described. The only difference between the solid-state image sensor of the ninth embodiment of the present invention and the solid-state image sensor of the sixth embodiment of the present invention is a portion of an operation. Hereinafter, the points of difference between the solid-state image sensor of the ninth embodiment of the present invention and the solid-state image sensor of the sixth embodiment of the present invention will be described with reference to the accompanying drawings.

Figure 24:
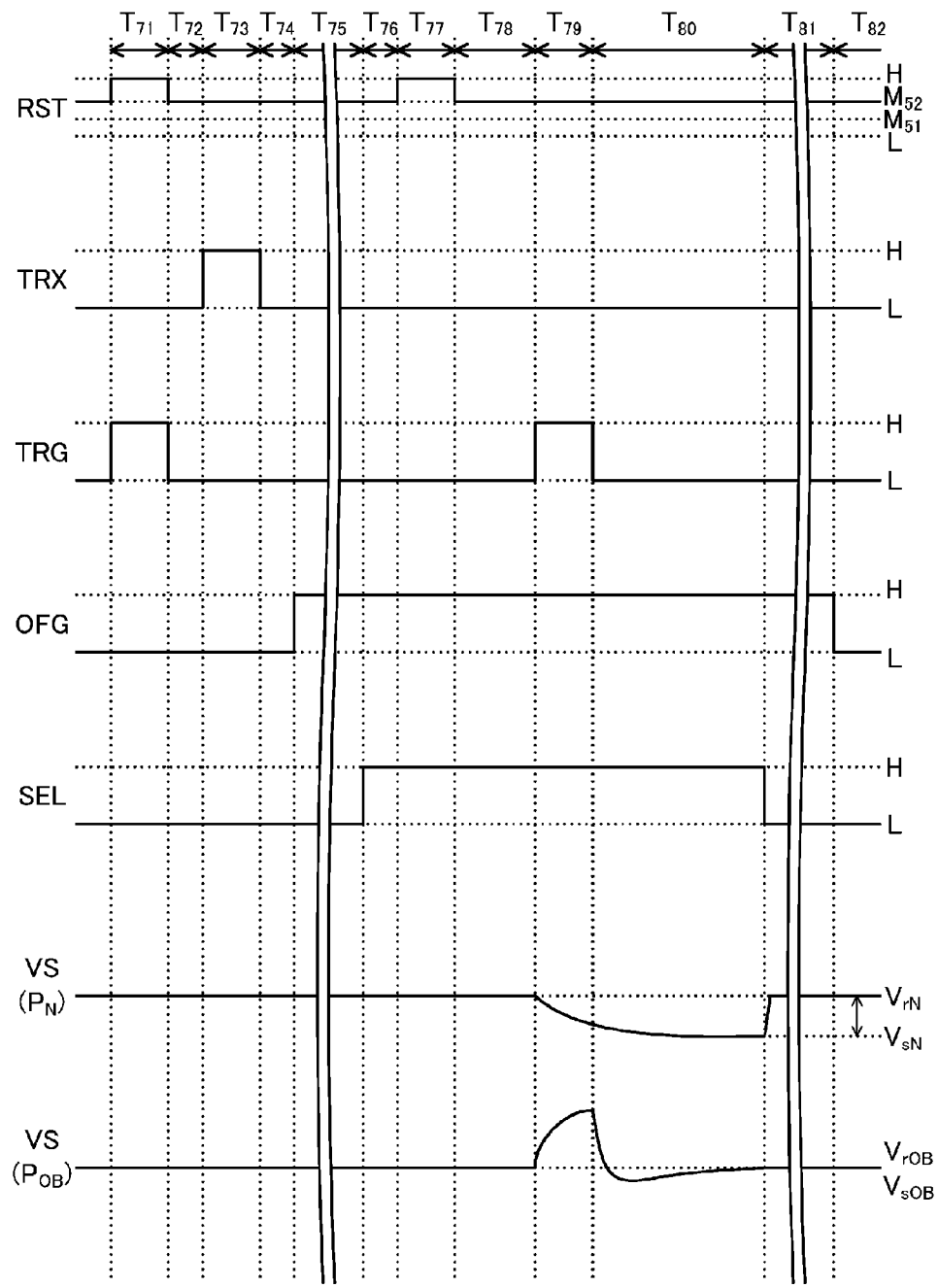
FIG. 24 is a timing chart illustrating the operation of a pixel circuit of a solid-state image sensor of a tenth embodiment of the present invention.
Figure 25:
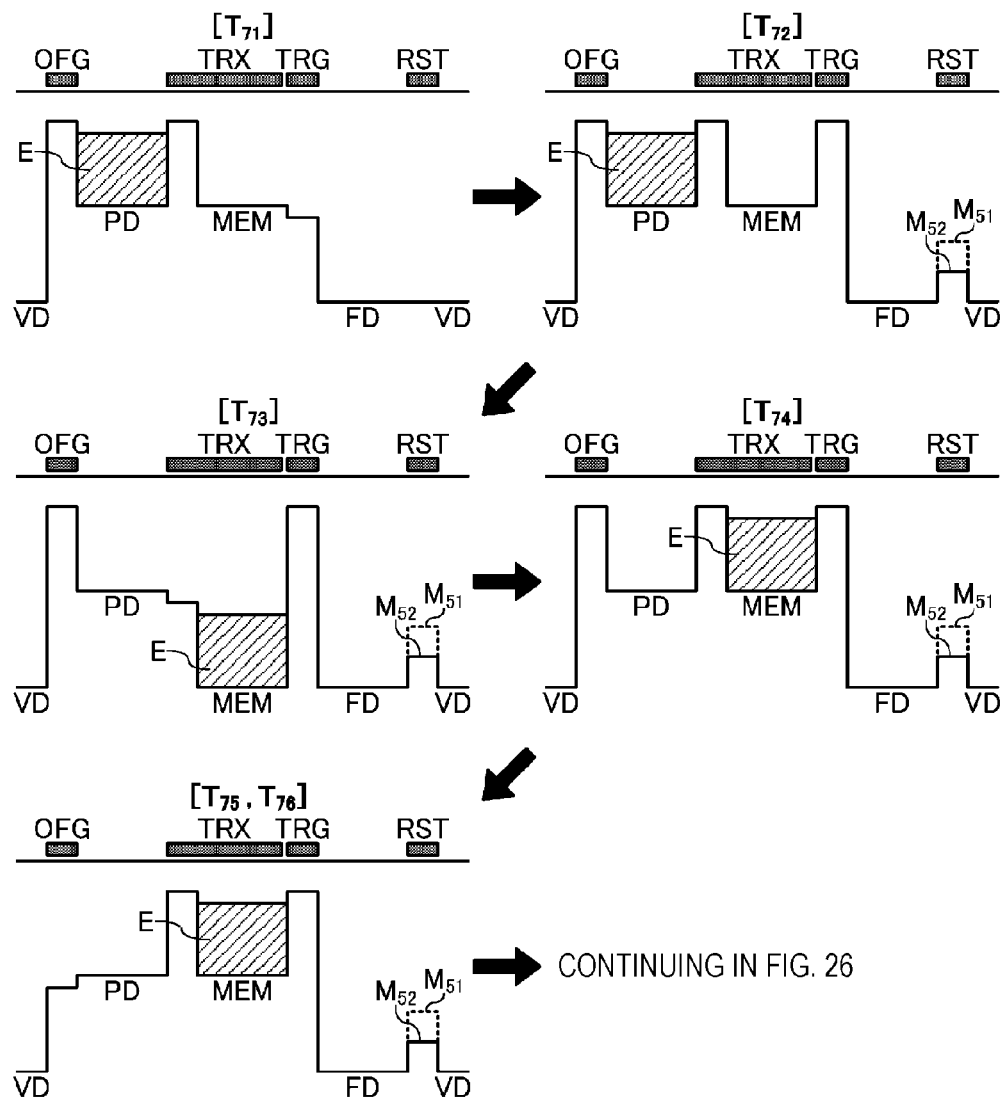
FIG. 25 is a potential diagram of an effective pixel circuit that performs the operation illustrated in FIG. 24.
Figure 26:
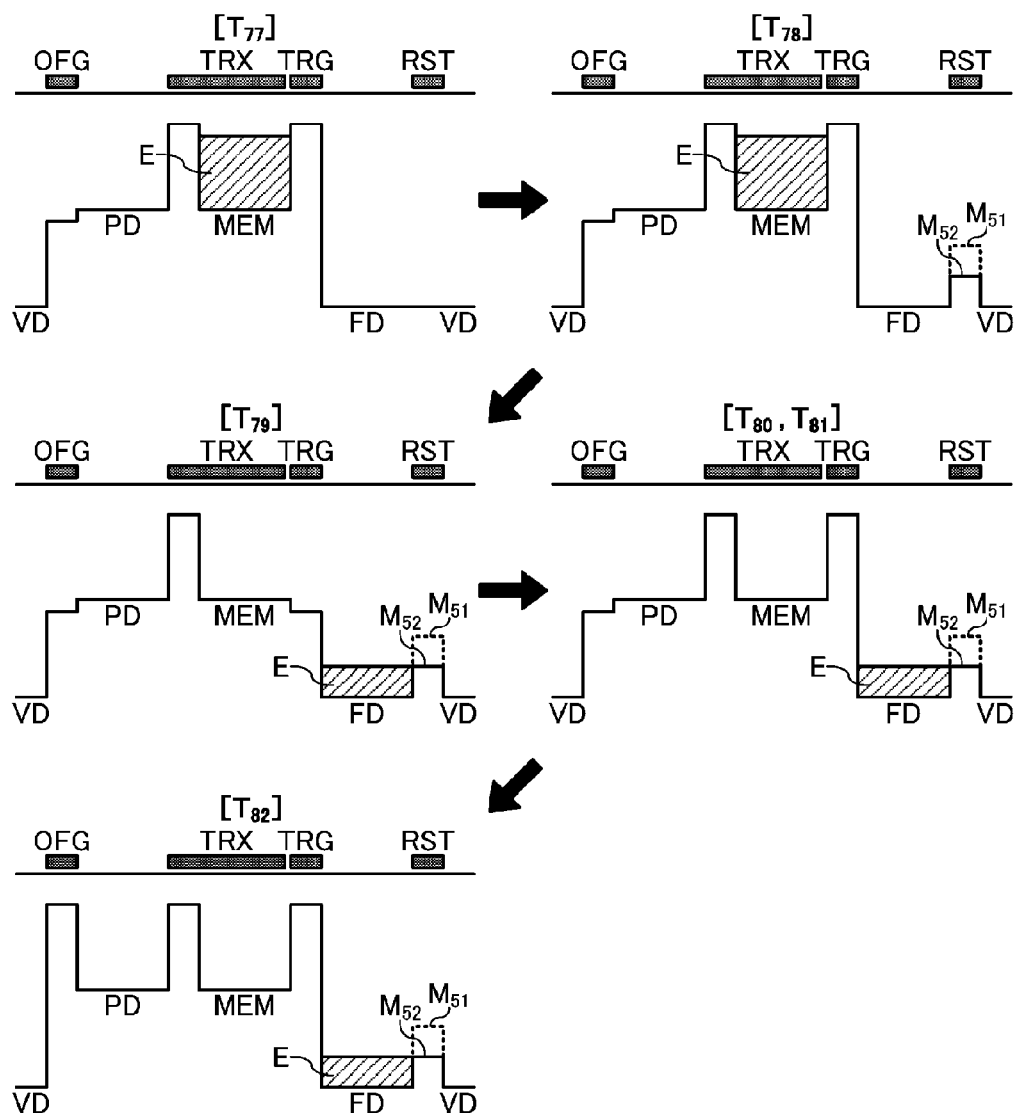
FIG. 26 is a potential diagram of the effective pixel circuit that performs the operation illustrated in FIG. 24.

FIG. 24 is a timing chart illustrating the operation of a pixel circuit of the solid-state image sensor of the ninth embodiment of the present invention. FIGS. 25 and 26 are potential diagrams of an effective pixel circuit that performs the operation illustrated in FIG. 24. FIGS. 24 to 26 respectively correspond to FIGS. 17 to 19 which illustrate the operation of the solid-state image sensor of the sixth embodiment of the present invention in a case where a set gain is high. Similar to FIGS. 17 to 19, reference sign "$M_{51}$" is assigned to an intermediate voltage or a potential barrier in a case where a gain is low, and reference sign "$M_{52}$" is assigned to an intermediate voltage or a potential barrier in a case where a gain is high. In FIG. 24, a fluctuation in the voltage of the output signal line VS is illustrated in an emphasized manner, and the illustration of noise superimposed on the second transfer control line TRG or the reset control line RST is omitted.

Although in FIGS. 24 to 26 illustration starts from a period $T_{71}$, the accumulation of the charges E in the photodiode PD is assumed to start at a certain timing before the period $T_{71}$ (electronic shutter). At this time, initially, the discharge control line OFG goes to the high voltage H, and the discharge transistor 15 enters an ON mode. Therefore, charges in the photodiode PD are discharged to the outside of the pixel circuits $P_N$ and $P_{OB}$ via the common power supply line VD. The discharge control line OFG goes to the low voltage L, and thus the accumulation of the charges E in the photodiode PD starts. Since light is not incident on the OB pixel circuit $P_{OB}$, the generation of charges via photoelectric conversion does not occur, and charges are not accumulated in the photodiode PD, but charges may be accumulated due to dark current or the like.

As illustrated in FIGS. 24 to 26, first, both the second transfer control line TRG and the reset control line RST go to the high voltage H during the period $T_{71}$, and both the transistor including the second transfer gate 17 as a gate and the reset transistor 13 enter an ON mode. Therefore, charges in the memory area MEM and the floating diffusion area FD are discharged to the common power supply line VD.

Subsequently, if the second transfer control line TRG goes to the low voltage L during a period $T_{72}$, a potential barrier under the second transfer gate 17 increases, and the transistor including the second transfer gate 17 as a gate enters an OFF mode. If the reset control line RST goes to an intermediate voltage $M_{52}$ at the same time, a potential barrier under the gate of the reset transistor 13 is present between an ON mode and an OFF mode.

Subsequently, if the first transfer control line TRX goes to the high voltage H during a period $T_{73}$, a potential barrier under the first transfer gate 16 decreases. That is, the potential barrier of the area between the photodiode PD and the memory area MEM decreases, and the potential of the memory area MEM decreases. Accordingly, the charges E in the photodiode PD are transferred to the memory area MEM. Since photoelectric conversion is not performed in the OB pixel circuit $P_{OB}$, almost no charges are transferred to the memory area MEM.

Subsequently, if the first transfer control line TRX goes to the low voltage L during a period $T_{74}$, a potential barrier under the first transfer gate 16 increases. That is, the potential barrier of the area between the photodiode PD and the memory area MEM increases, and the potential of the memory area MEM increases. Accordingly, the transfer of the charges E from the photodiode PD to the memory area MEM stops.

Subsequently, if the discharge control line OFG goes to the high voltage H during a period $T_{75}$, a potential barrier under the gate 15G of the discharge transistor 15 decreases, and the discharge transistor 15 enters an ON mode. Therefore, the charges E in the photodiode PD are discharged to the outside of the pixel circuits $P_N$ and $P_{OB}$ via the common power supply line VD. The aforementioned operations performed during the periods $T_{71}$ to $T_{75}$ can be simultaneously performed by all the pixel circuits $P_N$ and $P_{OB}$ in the pixel array 10.

Subsequently, if the selection control line SEL goes to the high voltage H during a period $T_{76}$, the selective transistor 14 enters an ON mode, and a signal (voltage) output from the output transistor 12 is applied to the output signal line VS.

Subsequently, if the reset control line RST goes to the high voltage H during a period $T_{77}$, a potential barrier under the gate of the reset transistor 13 decreases, and the reset transistor 13 enters an ON mode. Therefore, charges in the floating diffusion area FD are discharged to the outside of the pixel circuits $P_N$ and $P_{OB}$ via the common power supply line VD.

Subsequently, if the reset control line RST goes to the intermediate voltage $M_{52}$ during a period $T_{78}$, a potential barrier under the gate of the reset transistor 13 increases to a level between an ON mode and an OFF mode. At the end of the period $T_{78}$ (after a settling time has elapsed), the A/D conversion circuit 23 samples the voltage $V_{rN}$ of the output signal line VS in a state where charges are not retained in the floating diffusion area FD of the effective pixel circuit $P_N$, and the voltage $V_{rOB}$ of the output signal line VS in a state where charges are not retained in the floating diffusion area FD of the OB pixel circuit $P_{OB}$.

Subsequently, if the second transfer control line TRG goes to the high voltage H during a period $T_{79}$, a potential barrier under the second transfer gate 17 decreases, and the transistor including the second transfer gate 17 as a gate enters an ON mode. Therefore, the charges E in the memory area MEM are transferred to the floating diffusion area FD. In this case, the charges E exceeding the potential barrier (that is, the upper limit amount of charges retained by the floating diffusion area FD) under the gate of the reset transistor 13 are discharged to the outside of the pixel circuits $P_N$ and $P_{OB}$ via the common power supply line VD. In a case where a set gain is low, the reset control line RST goes to an intermediate voltage $M_{51}$ lower than the intermediate voltage $M_{52}$, and a potential barrier under the gate 17 of the reset transistor 13 is larger than that at the intermediate voltage $M_{52}$.

Subsequently, if the second transfer control line TRG goes to the low voltage L during a period $T_{80}$, a potential barrier under the second transfer gate 17 increases, and the transistor including the second transfer gate 17 as a gate enters an OFF mode. Therefore, the transfer of charges from the memory area MEM to the floating diffusion area FD stops. At the end of the period $T_{80}$ (after a settling time has elapsed), the A/D conversion circuit 23 samples the voltage $V_{sN}$ of the output signal line VS which corresponds to charges retained in the floating diffusion area FD of the effective pixel circuit $P_N$, and the voltage $V_{sOB}$ of the output signal line VS which corresponds to charges retained in the floating diffusion area FD of the OB pixel circuit $P_{OB}$.

Subsequently, if the selection control line SEL goes to a low voltage during a period $T_{81}$, the selective transistor 14 enters an OFF mode. The aforementioned operations performed during the periods $T_{76}$ to $T_{81}$ can be performed by the pixel circuits $P_N$ and $P_{OB}$ in each control group of the pixel array 10.

Subsequently, if the discharge control line OFG goes to the low voltage L during a period $T_{82}$, a potential barrier under the gate 15G of the discharge transistor 15 increases, and the discharge transistor 15 enters an OFF mode. Therefore, the discharge of charges from the photodiode PD stops. The operation performed during the period $T_{82}$ can be simultaneously performed by all the pixel circuits $P_N$ and $P_{OB}$ in the pixel array 10. The accumulation of charges in the photodiode PD may start from the period $T_{82}$. In this case, the timing when the discharge control line OFG goes to the low voltage L during the period $T_{82}$ is the timing of an electronic shutter (particularly, global shutter). In addition, in this case, in all the control groups, the period $T_{82}$ is not necessarily required to start after the completion of the operations performed during the periods $T_{76}$ to $T_{81}$ as illustrated in FIGS. 24 to 26, and there may be a control group in which the period $T_{82}$ starts before the start of the operations performed during the periods $T_{76}$ to $T_{81}$ or in the middle of the operations performed during the periods $T_{76}$ to $T_{81}$.

As described above, in the solid-state image sensor 1 of the ninth embodiment of the present invention, it is possible to directly reduce a fluctuation in the output of the pixel circuits $P_N$ and $P_{OB}$ belonging to the same control group, which is a cause of pseudo-smear, by limiting the upper limit amount of the charges E retained in the floating diffusion area FD. As a result, it is possible to effectively reduce the occurrence of pseudo-smear by adopting a simple configuration and operation in which the upper limit amount of the charges E eventually retained in the floating diffusion area FD is limited.

In the solid-state image sensor 1 of the ninth embodiment of the present invention, the upper limit amount of the charges E eventually retained in the floating diffusion area FD is further decreased to the extent corresponding to the condition in which pseudo-smear is likely to appear due to a high A/D conversion gain. As a result, it is possible to effectively reduce the occurrence of pseudo-smear as necessary.

<Modifications and the Like>

A portion of the solid-state image sensor 1 of the aforementioned embodiments can be modified as will be described, and modification examples can be realized.

Figure 27:
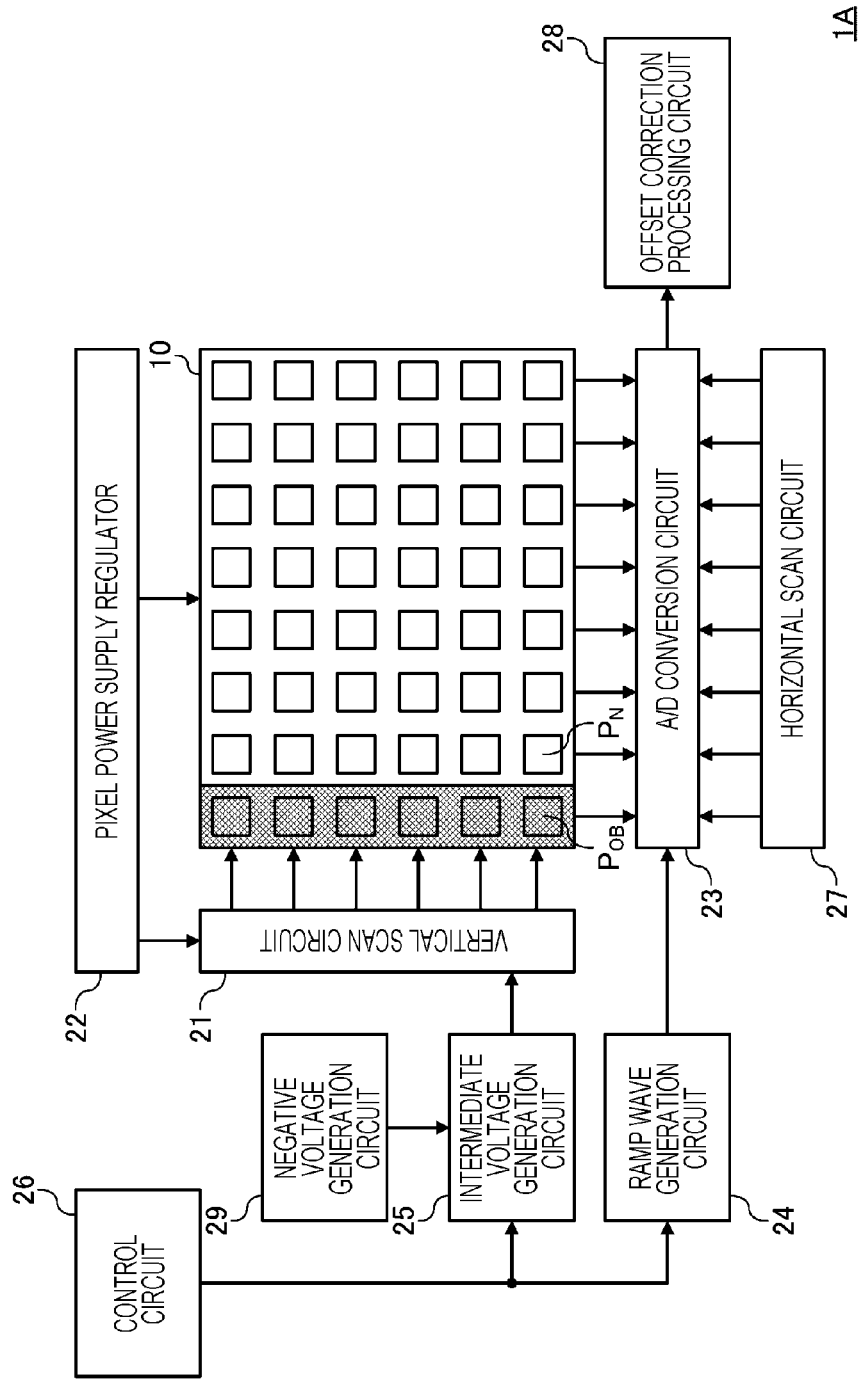
FIG. 27 is a block diagram illustrating the configuration of a modification example of the solid-state image sensor of the embodiments of the present invention.

[1] The intermediate voltages $M_1$, $M_2$, $M_{11}$, $M_{12}$, ... $M_{51}$ and $M_{52}$ applied to the pixel circuits $P_N$ and $P_{OB}$ by the vertical scan circuit 21 may be negative voltages in correspondence with the magnitude of a gain. An example of the configuration of a solid-state image sensor in this case will be described with reference to the accompanying drawings. FIG. 27 is a block diagram illustrating the configuration of a modification example of the solid-state image sensor of the embodiments of the present invention.

A solid-state image sensor 1A illustrated in FIG. 27 is different from the solid-state image sensor 1 illustrated in FIG. 1 in that the solid-state image sensor 1A includes a negative voltage generation circuit 29 which generates a negative voltage and applies the generated negative voltage to the intermediate voltage generation circuit 25. In this case, the intermediate voltage generation circuit 25 is capable of generating the intermediate voltages $M_1$, $M_2$, $M_{11}$, $M_{12}$, ... $M_{51}$, and $M_{52}$ which are negative voltages in correspondence with the magnitude of a gain.

Figure 28:
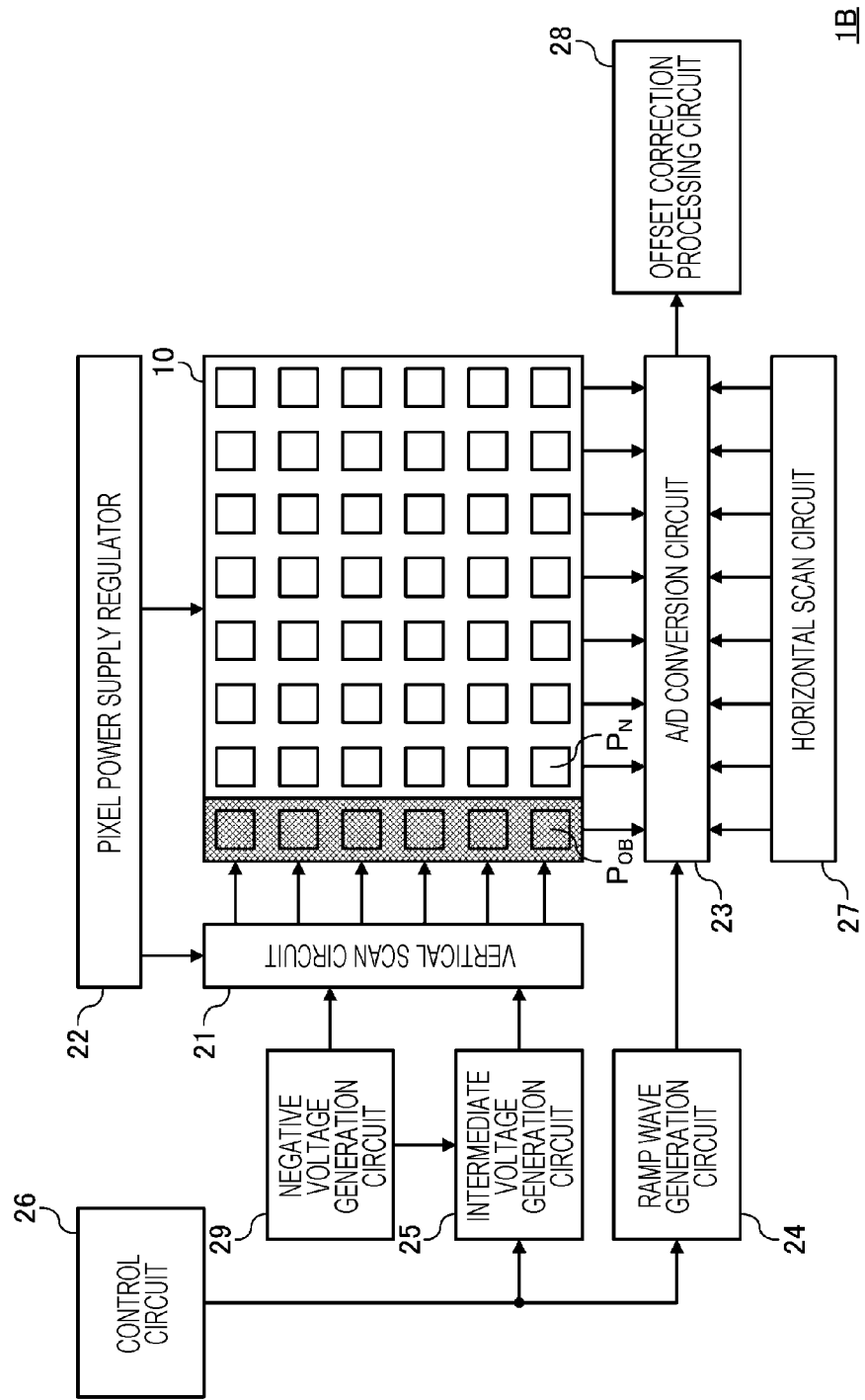
FIG. 28 is a block diagram illustrating the configuration of another modification example of the solid-state image sensor of the embodiments of the present invention.

The low voltage L applied to pixel circuits $P_N$ and $P_{OB}$ by the vertical scan circuit 21 may be a negative voltage. An example of the configuration of a solid-state image sensor in this case will be described with reference to the accompanying drawings. FIG. 28 is a block diagram illustrating the configuration of another modification example of the solid-state image sensor of the embodiments of the present invention.

A solid-state image sensor 1B illustrated in FIG. 28 is different from the solid-state image sensor 1 illustrated in FIG. 1 in that the solid-state image sensor 1B includes the negative voltage generation circuit 29 which generates a negative voltage and applies the generated negative voltage to the intermediate voltage generation circuit 25 and the vertical scan circuit 21. In this case, the intermediate voltage generation circuit 25 is capable of generating the intermediate voltages $M_1$, $M_2$, $M_{11}$, $M_{12}$, ... $M_{51}$, and $M_{52}$ which are negative voltages in correspondence with the magnitude of a gain. The vertical scan circuit 21 applies the negative voltage, which is applied from the negative voltage generation circuit 28, to the pixel circuits $P_N$ and $P_{OB}$ as the low voltage L.

As in the modification examples, if the vertical scan circuit 21 is configured to apply the intermediate voltages $M_1$, $M_2$, $M_{11}$, $M_{12}$, ... $M_{51}$, and $M_{52}$ or the low voltage L, which are negative voltages (voltages having a polarity different from that of the high voltage H) to the pixel circuits $P_N$ and $P_{OB}$, the concentration of charges (positive holes) having a polarity opposite to that of charges (electrons) accumulated in the photodiode PD can be increased under the transfer gate 11 or the gate of the discharge transistor 15. Accordingly, charges generated due to dark current can be inhibited from flowing into the photodiode PD.

The intermediate voltages $M_1$, $M_2$, $M_{11}$, $M_{12}$, ... $M_{51}$, and $M_{52}$ or the low voltage L which are negative voltages may be applied to a gate (the gate of each of the transistors 12 to 15, the transfer gate 11, the first transfer gate 16, or the second transfer gate 17) of any transistor in the pixel circuits $P_N$ and $P_{OB}$ illustrated in FIGS. 2, 11, and 15. Particularly, as described above, a negative voltage is preferably applied to at least transfer gate 11 or the gate of the discharge transistor 15 because charges generated due to dark current can be inhibited from flowing into the photodiode PD.

[2] The solid-state image sensor of the third embodiment of the present invention is equivalent to an example in which the low voltage L is applied to the transfer gates 11 of the pixel circuits $P_N$ and $P_{OB}$ of the solid-state image sensor of the second embodiment of the present invention so that the transistors including the transfer gates 11 as gates are capable of entering an OFF mode. The solid-state image sensor of the fifth embodiment of the present invention is equivalent to an example in which the low voltage L is applied to the gates of the discharge transistors 15 of the pixel circuits $P_N$ and $P_{OB}$ of the solid-state image sensor of the fourth embodiment of the present invention so that the discharge transistors 15 are capable of entering an OFF mode. Similarly, the solid-state image sensor of the first embodiment of the present invention may be also configured such that the low voltage L is applied to the gates of the reset transistors 13 of the pixel circuits $P_N$ and $P_{OB}$ to enable the reset transistors 13 to enter an OFF mode.

The solid-state image sensor of the eighth embodiment of the present invention is equivalent to an example in which the low voltage L is applied to the gates 15G of the discharge transistors 15 of the pixel circuits $P_N$ and $P_{OB}$ of the solid-state image sensor of the seventh embodiment of the present invention so that the discharge transistors 15 are capable of entering an OFF mode. Similarly, the solid-state image sensor of the sixth embodiment of the present invention may be also configured such that the low voltage L is applied to the second transfer gates 17 of the pixel circuits $P_N$ and $P_{OB}$ to enable the transistors including the second transfer gates 17 as gates to enter an OFF mode. Similarly, the solid-state image sensor of the ninth embodiment of the present invention may be also configured such that the low voltage L is applied to the gates of the reset transistors 13 of the pixel circuits $P_N$ and $P_{OB}$ to enable the reset transistors 13 to enter an OFF mode.

[3] If the upper limit amount of the charges E is excessively small, it is not possible to accumulate a sufficient amount of the charges E, and A/D converted data does not have the maximum value. If the upper limit amount of the charges E is excessively large, the reduction of the occurrence of pseudo-smear becomes difficult.

It is preferable to adopt a method of setting the upper limit amount of the charges E (that is, a method of setting the intermediate voltages $M_1$, $M_2$, $M_{11}$, $M_{12}$, ... $M_{51}$, and $M_{52}$) by which the upper limit amount is larger than or equal to the lower limit amount of charges at which data obtained via A/D conversion using a gain set by the A/D conversion circuit 23 has the maximum value, and is smaller than or equal to 1.5 times the lower limit amount.

If the upper limit amount of the charges E is set by this setting method, A/D converted data is capable of having the maximum value, and it is possible to effectively reduce the occurrence of pseudo-smear.

[4] The relationship between a set gain and an intermediate voltage generated by the intermediate voltage generation circuit 25 may be any type of relationship insofar as a relationship in which the intermediate voltage is increased to the extent of an increase in gain is satisfied. For example, an intermediate voltage may be increased linearly or non-linearly with an increase in gain (that is, the upper limit amount of the charges E is increased linearly or non-linearly). Alternatively, an intermediate voltage is increased in a stepwise manner with an increase in gain (that is, the upper limit amount of the charges E is increased in a stepwise manner).

[5] In the pixel circuit illustrated in FIG. 2, the reset power supply line VR is common in each control group. Alternatively, the reset power supply line VR may be common to all the pixel circuits $P_N$ and $P_{OB}$ in the pixel array 10. The reset power supply line VR and the common power supply line VD may be common (the drain of the reset transistor 13 may be connected to the common power supply line VD). In a case where the reset power supply line VR is common in the pixel circuits $P_N$ and $P_{OB}$, the pixel circuits $P_N$ and $P_{OB}$ are configured to include the selective transistors 14 as illustrated in FIGS. 11 and 15.

In each of the pixel circuits illustrated in FIGS. 11 and 15, the drain of the reset transistor 13 is connected to the common power supply line VD. Alternatively, the drain of the reset transistor 13 may be connected to the reset power supply line VR that is provided separately from the common power supply line VD. The reset power supply line VR may be common in each control group (the same as in the first to third embodiments, and refer to FIG. 2).

[6] Similar to the pixel circuits illustrated in FIGS. 11 and 15, the pixel circuit illustrated in FIG. 2 may be configured to include the selective transistor 14, or configured to include the selective transistor 14 and the discharge transistor 15.

Similar to the pixel circuit illustrated in FIG. 11, each of the pixel circuits illustrated in FIGS. 11 and 15 may be configured so as not to include the selective transistor 14. In this case, the following modifications are preferably made: similar to the solid-state image sensor 1 of the first to third embodiments of the present invention, the pixel circuits $P_N$ and $P_{OB}$ in the pixel array 10 are sequentially operated in the unit of the control group (refer to FIGS. 4 to 10), and selective signal output means is provided instead of the selective transistor 14.

[7] In the configurations illustrated in FIGS. 1, 27, and 28, the A/D conversion circuit 23 performs A/D conversion using a ramp wave generated by the ramp wave generation circuit 24. These configurations are merely examples, and the A/D conversion circuit 23 may perform A/D conversion using any method. As illustrated in FIGS. 1, 27, and 28, the configuration in which an A/D conversion gain can be easily changed is preferably adopted.

[8] In the configurations illustrated in FIGS. 1, 27, and 28, the OB pixel circuits (light shielding film) $P_{OB}$ are provided only at a left end of the pixel array 10. This configuration is merely an example, and the OB pixel circuits $P_{OB}$ may be provided at any position in the pixel array 10. For example, the OB pixel circuits $P_{OB}$ may be provided at both ends of the pixel array 10. The OB pixel circuits $P_{OB}$ may be provided along the circumference (for example, left end, upper end, right end, and lower end) of the pixel array 10.

In the configurations illustrated in FIGS. 1, 27, and 28, the pixel circuits $P_N$ and $P_{OB}$ are arrayed in a matrix pattern (arrayed in a vertical direction and a lateral direction in the drawings) in the pixel array 10. This configuration is merely an example, and the pixel circuits $P_N$ and $P_{OB}$ may be arrayed in any pattern in the pixel array 10. For example, the pixel circuits $P_N$ and $P_{OB}$ may be arrayed in the pixel array 10 in an oblique direction (direction inclined at ±45° with respect to the lateral direction in the drawings) of FIGS. 1, 27, and 28.

[9] The pixel circuits $P_N$ and $P_{OB}$ in the same row which are arrayed in the lateral direction in FIG. 1 belong to the same control group. The method of setting a control group is merely an example, and a control group may be set by any method. For example, the pixel circuits $P_N$ and $P_{OB}$ which are not adjacent to and are spaced from each other may be contained in the same control group. Pixel circuits in multiple rows may be contained in the same control group. Pixel circuits in a certain area rather than a row may be contained in the same control group.

[10] In the aforementioned example, the A/D conversion circuit performs A/D conversion on a correlated double sampled difference. Alternatively, the A/D conversion circuit 23 may directly perform A/D conversion on signals (voltages $V_{sN}$ and $V_{sOB}$) of the output signal line VS which are acquired in a state where charges are retained in the floating diffusion areas FD of the pixel circuits $P_N$ and $P_{OB}$.

[11] In the aforementioned solid-state image sensors, each pixel circuit generates and accumulates electrons, and includes an N-channel FET. The solid-state image sensors to which the present invention can be applied are merely examples. For example, the present invention can be also applied to a solid-state image sensor which each pixel circuit accumulates positive holes, and includes a P-channel FET. The polarity or magnitude of a voltage applied to a transistor of each of the pixel circuits $P_N$ and $P_{OB}$ is suitably changed according to an application form so as to perform the same operation as in the aforementioned examples.

[12] Features of the aforementioned solid-state image sensors can be combined together and realized insofar as the features are not contradictory to each other.

For example, the solid-state image sensors of the first and ninth embodiments of the present invention perform an operation (first upper limit amount limiting operation) in which the charges E retained by the floating diffusion area FD are limited so as not to exceed an upper limit amount. The solid-state image sensors of the second to fifth embodiments and the seventh and eighth embodiments of the present invention perform an operation (second upper limit amount limiting operation) in which the charges E accumulated by the photodiode PD are limited so as not to exceed the upper limit amount. The solid-state image sensor of the sixth embodiment of the present invention performs an operation (third upper limit amount limiting operation) in which the charges E accumulated by the memory area MEM are limited so as not to exceed an upper limit amount. Alternatively, a solid-state image sensor may be configured to be capable of simultaneously executing any combination of these operations.

<<Electronic Information Device>>

Figure 29:
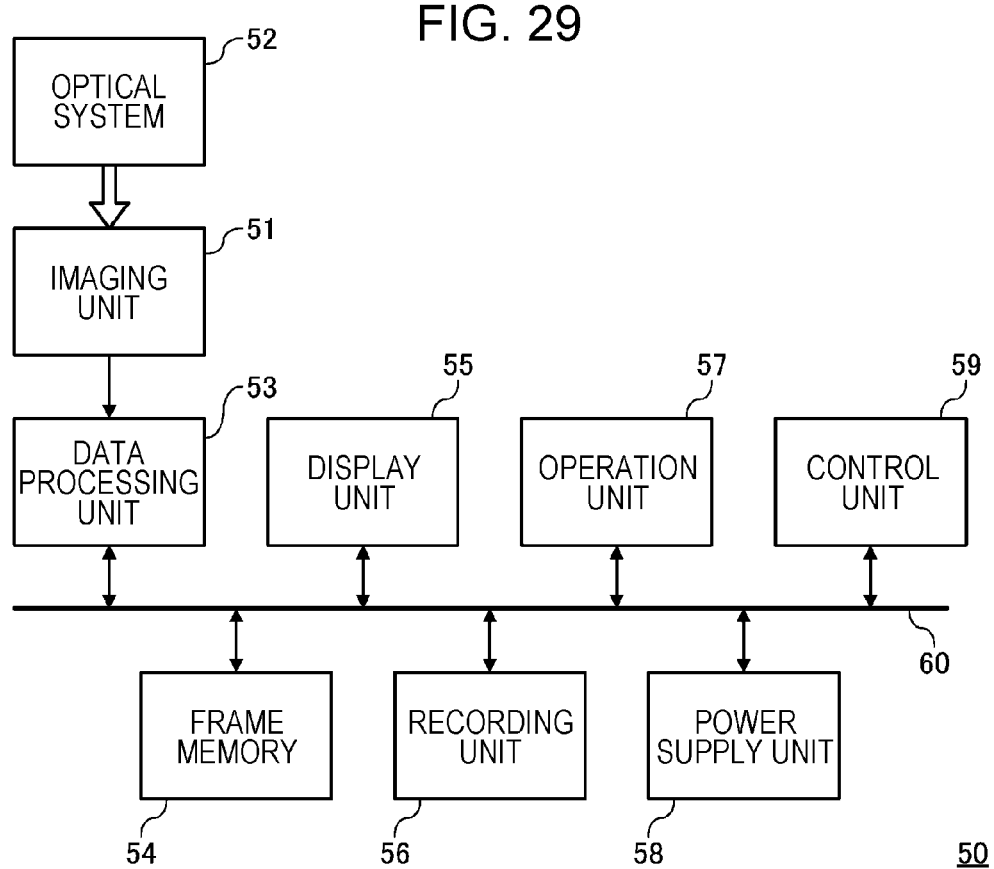
FIG. 29 is a block diagram illustrating the configuration of an electronic information device of an embodiment of the present invention.
Figure 30:
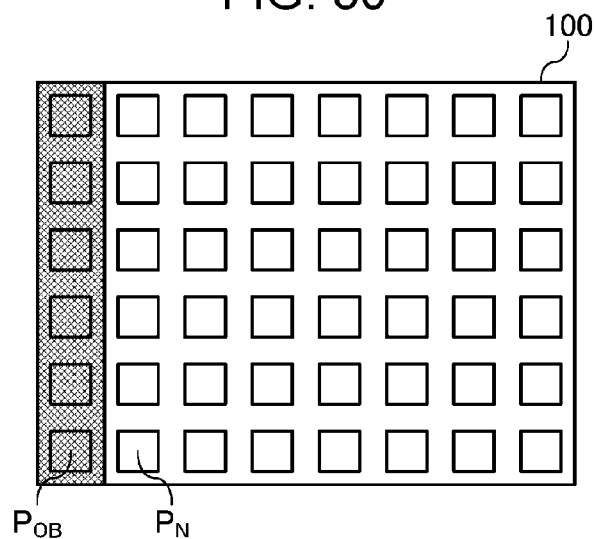
FIG. 30 is a schematic diagram illustrating a typical pixel array.

An example of the configuration of an electronic information device of an embodiment of the present invention which includes the solid-state image sensor 1, 1A, or 1B will be described with reference to FIG. 29. FIG. 29 is a block diagram illustrating an example of the configuration of the electronic information device of the embodiment of the present invention. An electronic information device 50 illustrated in FIG. 29 is not limited to an imaging device such as a digital steel camera or a digital video camera in which an imaging function using the solid-state image sensor 1, 1A, or 1B is a main function. The electronic information device 50 may be various devices such as a mobile phone, a tablet device, and a laptop computer in which an imaging function using the solid-state image sensor 1, 1A, or 1B is a secondary function.

As illustrated in FIG. 29, the electronic information device 50 of the embodiment of the present invention includes an imaging unit 51 that is equivalent to the solid-state image sensor 1, 1A, or 1B; an optical system 52 that is formed of optical components (a lens, an aperture, and the like) which forms an optical image on the imaging unit 51; a data processing unit 53 that is formed of a digital signal processor (DSP) and the like which generates image data by performing various processes (for example, demosaicking) on data generated by the imaging unit 51; a frame memory 54 that stores data when the data processing unit 53 processes data; a display unit 55 that displays image data generated by the data processing unit 53, an image for operation, and the like; a recording unit 56 that records image data generated by the data processing unit 53 as necessary; an operation unit 57 that is formed of buttons, a touch panel, or the like which receives an operation from a user; a power supply unit 58 that supplies power to operate the electronic information device 50; a control unit 59 that controls the operation of the electronic information device 50; and a bus 60 through which the aforementioned units are connected to each other.

A portion or the entirety of the control circuit 26 of the solid-state image sensor 1, 1A, or 1B may be a portion of the control unit 59 of the electronic information device 50. An offset correction process may not be performed by the imaging unit 51 (the offset correction processing circuit 28 of the solid-state image sensor 1, 1A, or 1B), but be formed by the data processing unit 53.

The electronic information device 50 illustrated in FIG. 29 is merely an application example of the solid-state image sensor 1, 1A, or 1B. The solid-state image sensor 1, 1A, or 1B can be also applied to an electronic information device having a configuration different from that of the electronic information device 50.

SUMMARY

The solid-state image sensors 1, 1A, or 1B of the embodiments of the present invention can be ascertained as follows.

The solid-state image sensor 1, 1A, or 1B of the embodiments of the present invention includes multiple pixel circuit units $P_N$ and $P_{OB}$, each including a photoelectric conversion unit PD that generates charges E via photoelectric conversion and accumulates the generated charges E, a floating diffusion unit FD that retains the charges E transferred from the photoelectric conversion unit PD, a transfer unit 11 through which the charges accumulated by the photoelectric conversion unit PD are transferred to the floating diffusion unit FD, an output unit 12 that outputs a signal corresponding to the amount of charges retained by the floating diffusion unit FD, and a reset unit 13 that discharges the charges E retained by the floating diffusion unit FD to the outside; and an A/D conversion unit 23 that acquires a signal output from the output unit 12, and performs A/D conversion on the acquired signal using a set gain. At least one of the pixel circuit units $P_N$ and $P_{OB}$ is configured such that the charges E transferred from the photoelectric conversion unit PD to the floating diffusion unit FD and retained by the floating diffusion unit FD are limited so as not to exceed an upper limit amount which is set to be smaller by the extent of an increase in the gain.

In the solid-state image sensor 1, 1A, or 1B, it is possible to directly reduce a fluctuation in the output of the pixel circuits $P_N$ and $P_{OB}$ belonging to the same control group, which is a cause of pseudo-smear, by limiting the upper limit amount of the charges E which are transferred from the photoelectric conversion unit PD to the floating diffusion unit FD and are retained by the floating diffusion unit FD. As a result, it is possible to effectively reduce the occurrence of pseudo-smear by adopting a simple configuration and operation in which the upper limit amount of the charges E eventually retained in the floating diffusion unit FD is limited.

In the solid-state image sensor 1, 1A, or 1B, the upper limit amount of the charges E eventually retained in the floating diffusion unit FD is further decreased to the extent corresponding to the condition in which pseudo-smear is likely to appear due to a high A/D conversion gain. As a result, it is possible to effectively reduce the occurrence of pseudo-smear as necessary.

In the solid-state image sensor 1, 1A, or 1B, at least one of the pixel circuit units $P_N$ and $P_{OB}$ is configured to perform at least one of a first upper limit amount limiting operation in which the charges E retained by the floating diffusion unit FD are limited so as not to exceed the upper limit amount, and a second upper limit amount limiting operation in which the charges E accumulated by the photoelectric conversion unit PD are limited so as not to exceed the upper limit amount.

In the solid-state image sensor 1, 1A, or 1B, it is possible to directly reduce a fluctuation in the output of the pixel circuits $P_N$ and $P_{OB}$ belonging to the same control group, which is a cause of pseudo-smear.

The solid-state image sensor 1, 1A, or 1B further includes a charge retaining unit MEM that temporarily retains the charges E before being transferred from the photoelectric conversion unit PD to the floating diffusion unit FD. The transfer unit includes a first transfer unit 16 through which the charges E accumulated by the photoelectric conversion unit PD are transferred to the charge retaining unit MEM, and a second transfer unit 17 through which the charges E retained by the charge retaining unit MEM are transferred to the floating diffusion unit FD. At least one of the pixel circuit units $P_N$ and $P_{OB}$ is configured to perform at least one of a first upper limit amount limiting operation in which the charges E retained by the floating diffusion unit FD are limited so as not to exceed the upper limit amount, a second upper limit amount limiting operation in which the charges E accumulated by the photoelectric conversion unit PD are limited so as not to exceed the upper limit amount, and a third upper limit amount limiting operation in which charges retained by the charge retaining unit MEM are limited so as not to exceed the upper limit amount.

In the solid-state image sensor 1, 1A, or 1B, it is possible to directly reduce a fluctuation in the output of the pixel circuits $P_N$ and $P_{OB}$ belonging to the same control group, which is a cause of pseudo-smear.

In the solid-state image sensor 1, 1A, or 1B, at least one of the pixel circuit units $P_N$ and $P_{OB}$ is configured such that the second upper limit amount limiting operation is performed in such a way that the transfer unit 11 transfers the charges E exceeding the upper limit amount from the photoelectric conversion unit PD to the floating diffusion unit FD, and the reset unit 13 discharges charges which are transferred from the photoelectric conversion unit PD to the floating diffusion unit FD.

Particularly, the solid-state image sensor 1, 1A, or 1B further includes an intermediate voltage generation unit 25 configured to generate intermediate voltages $M_{11}$ and $M_{12}$ of a magnitude between a first voltage H and a second voltage L in correspondence with the gain. In at least one of the pixel circuit units $P_N$ and $P_{OB}$, the transfer unit 11 forms a control terminal 11 of a transistor which enters an ON mode if the first voltage H is applied thereto, and enters an OFF mode if the second voltage L is applied thereto, and when the second upper limit amount limiting operation is performed, the intermediate voltages $M_{11}$ and $M_{12}$ are applied to the transfer unit.

In the solid-state image sensor 1, 1A, or 1B, it is possible to directly reduce a fluctuation in the output of the pixel circuits $P_N$ and $P_{OB}$ belonging to the same control group, which is a cause of pseudo-smear, by limiting the upper limit amount of the charges E accumulated in the photoelectric conversion unit PD.

In the solid-state image sensor 1, 1A, or 1B, at least one of the pixel circuit units $P_N$ and $P_{OB}$ is configured such that the third upper limit amount limiting operation is performed in such a way that the second transfer unit 17 transfers the charges E exceeding the upper limit amount from the charge retaining unit MEM to the floating diffusion unit FD, and the reset unit 13 discharges the charges E which are transferred from the charge retaining unit MEM to the floating diffusion unit FD.

Particularly, the solid-state image sensor 1, 1A, or 1B further includes an intermediate voltage generation unit 25 configured to generate intermediate voltages $M_{31}$ and $M_{32}$ of a magnitude between a first voltage H and a second voltage L in correspondence with the gain. In at least one of the pixel circuit units $P_N$ and $P_{OB}$, the second transfer unit 17 forms a control terminal of a transistor which enters an ON mode if the first voltage H is applied thereto, and enters an OFF mode if the second voltage L is applied thereto, and when the third upper limit amount limiting operation is performed, the intermediate voltages $M_{31}$ and $M_{32}$ are applied to the second transfer unit 17.

In the solid-state image sensor 1, 1A, or 1B, it is possible to directly reduce a fluctuation in the output of the pixel circuits $P_N$ and $P_{OB}$ belonging to the same control group, which is a cause of pseudo-smear, by limiting the upper limit amount of the charges E accumulated in the charge retaining unit MEM.

In the solid-state image sensor 1, 1A, or 1B, at least one of the pixel circuit units $P_N$ and $P_{OB}$ is configured such that the first upper limit amount limiting operation is performed in such a way that the reset unit 13 discharges the charges E exceeding the upper limit amount from the floating diffusion unit FD, and the transfer unit 11 transfers the charges E accumulated by the photoelectric conversion unit PD to the floating diffusion unit FD.

Particularly, the solid-state image sensor 1, 1A, or 1B further includes an intermediate voltage generation unit 25 configured to generate intermediate voltages $M_1$, $M_2$, $M_{51}$, and $M_{52}$ of a magnitude between a first voltage H and a second voltage L in correspondence with the gain. In at least one of the pixel circuit units $P_N$ and $P_{OB}$, the reset unit 13 includes a transistor 13 which enters an ON mode if the first voltage H is applied to a control terminal of the transistor 13, and enters an OFF mode if the second voltage L is applied to the control terminal, and when the first upper limit amount limiting operation is performed, the intermediate voltages $M_1$, $M_2$, $M_{51}$, and $M_{52}$ are applied to the control terminal of the transistor of the reset unit 13.

In the solid-state image sensor 1, 1A, or 1B, it is possible to directly reduce a fluctuation in the output of the pixel circuits $P_N$ and $P_{OB}$ belonging to the same control group, which is a cause of pseudo-smear, by limiting the upper limit amount of the charges E retained in the floating diffusion unit FD.

In the solid-state image sensor 1, 1A, or 1B, at least one of the pixel circuit units $P_N$ and $P_{OB}$ is configured to include a discharge unit 15, which discharges the charges E accumulated by the photoelectric conversion unit PD to the outside, and the second upper limit amount limiting operation is performed in such a way that the discharge unit 15 discharges the charges E, which exceed the upper limit amount, from the photoelectric conversion unit PD.

Particularly, the solid-state image sensor 1, 1A, or 1B further includes an intermediate voltage generation unit 25 configured to generate intermediate voltages $M_{21}$, $M_{22}$, $M_{41}$, and $M_{42}$ of a magnitude between a first voltage H and a second voltage L in correspondence with the gain. In at least one of the pixel circuit units $P_N$ and $P_{OB}$ the discharge unit 15 includes a transistor 15 which enters an ON mode if the first voltage H is applied to a control terminal of the transistor 15, and enters an OFF mode if the second voltage L is applied to the control terminal, and when the second upper limit amount limiting operation is performed, the intermediate voltages $M_{21}$, $M_{22}$, $M_{41}$, and $M_{42}$ are applied to the control terminal of the transistor 15.

In the solid-state image sensor 1, 1A, or 1B, it is possible to directly reduce a fluctuation in the output of the pixel circuits $P_N$ and $P_{OB}$ belonging to the same control group, which is a cause of pseudo-smear, by limiting the upper limit amount of the charges E accumulated in the photoelectric conversion unit PD.

In the solid-state image sensor 1, 1A, or 1B, all the transistors (the transistors 13 and 15, the transistor including the transfer gate 11 as a gate, and the transistor including the second transfer gate 17 as a gate) are configured such that the first voltage H, the intermediate voltages $M_1$, $M_2$, $M_{11}$, $M_{12}$, . . . $M_{51}$, and $M_{52}$ and the second voltage L are selectively applied to the control terminals (the gates of the transistors 13 and 15, the transfer gate 11, and the second transfer gate 17).

In the solid-state image sensor 1, 1A, or 1B, the concentration of charges having a polarity opposite to that of charges accumulated in the photoelectric conversion unit PD can be increased particularly under the gate of the transistor (the gate of the transistor 15 or the transfer gate 11). Accordingly, charges generated due to dark current can be inhibited from flowing into the photoelectric conversion unit PD.

The solid-state image sensor 1, 1A, or 1B further includes an offset correction processing unit 28 that performs an offset correction process on data obtained by performing A/D conversion on signal, which is output from a pixel circuit unit $P_N$ exposed to light, by the A/D conversion unit 23, based on data obtained by performing A/D conversion on a signal, which is output from a pixel circuit unit $P_{OB}$ shielded from light, by the A/D conversion unit 23.

In the solid-state image sensor 1, 1A, or 1B, it is possible to further reduce or eliminate the pseudo-smear, which has been reduced by limiting the upper limit amount of charges transferred from the photoelectric conversion unit PD to the floating diffusion unit FD and retained by the floating diffusion unit FD, but which has remained, via an offset correction process.

In the solid-state image sensor 1, 1A, or 1B, a period during which the second voltage L is applied to the control terminal of the transistor (the gates of the transistors 13 and 15, the transfer gate 11, or the second transfer gate 17) accounts for 90% or greater of a period that is the sum of the period during which the second voltage L is applied to the control terminal of the transistor (the gates of the transistors 13 and 15, the transfer gate 11, or the second transfer gate 17) and periods during which the intermediate voltages $M_1$, $M_2$, $M_{11}$, $M_{12}$, . . . $M_{51}$, and $M_{52}$ are applied to the control terminal of the transistor.

In the solid-state image sensor 1, 1A, or 1B, dark current which increases due to the intermediate voltages $M_1$, $M_2$, $M_{11}$, $M_{22}$, . . . $M_{52}$, and $M_{52}$ being used instead of the second voltage L can be reduced to one tenth or less.

In the solid-state image sensor 1, 1A, or 1B, the polarity of the second voltage L is different from that of the first voltage H.

In the solid-state image sensor 1, 1A, or 1B, the concentration of charges having a polarity opposite to that of charges accumulated in the photodiode PD can be increased particularly under the gate of the transistor (the gate of the transistor 15 or the transfer gate 11). Accordingly, charges generated due to dark current can be inhibited from flowing into the photodiode PD.

In the solid-state image sensor 1, 1A, or 1B, the intermediate voltage generation unit 25 generates the intermediate voltages $M_1$, $M_2$, $M_{11}$, $M_{12}$, . . . $M_{51}$, and $M_{52}$, which have a polarity different from that of the first voltage H, in correspondence with the magnitude of the gain.

In the solid-state image sensor 1, 1A, or 1B, the concentration of charges having a polarity opposite to that of charges accumulated in the photodiode PD can be increased particularly under the gate of the transistor (the gate of the transistor 15 or the transfer gate 11). Accordingly, charges generated due to dark current can be inhibited from flowing into the photodiode PD.

In the solid-state image sensor 1, 1A, or 1B, the upper limit amount is larger than or equal to the lower limit amount of the charges E at which data obtained via A/D conversion using the gain set by the A/D conversion unit 23 has the maximum value, and is smaller than or equal to 1.5 times the lower limit amount.

In the solid-state image sensor 1, 1A, or 1B, A/D converted data is capable of having the maximum value, and it is possible to effectively reduce the occurrence of pseudo-smear.

An electronic information device 50 of the present invention includes the solid-state image sensor 1, 1A, or 1B.

INDUSTRIAL APPLICABILITY

The present invention can be applied to a solid-state image sensor which is represented by an amplified image sensor such as a CMOS image sensor, and to an electronic information device including the solid-state image sensor.

REFERENCE SIGNS LIST 1, 1A, 1B SOLID-STATE IMAGE SENSOR
10 PIXEL ARRAY

11 TRANSFER GATE (TRANSFER UNIT)
12 OUTPUT TRANSISTOR (OUTPUT UNIT)
13 RESET TRANSISTOR (RESET UNIT)
14 SELECTIVE TRANSISTOR
15 DISCHARGE TRANSISTOR (DISCHARGE UNIT)
15G GATE
15D DRAIN
16 FIRST TRANSFER GATE (FIRST TRANSFER UNIT)
17 SECOND TRANSFER GATE (SECOND TRANSFER UNIT)
21 VERTICAL SCAN CIRCUIT
22 PIXEL POWER SUPPLY REGULATOR
23 A/D CONVERSION CIRCUIT (A/D CONVERSION UNIT)
24 RAMP WAVE GENERATION CIRCUIT
25 INTERMEDIATE VOLTAGE GENERATION CIRCUIT (INTERMEDIATE VOLTAGE GENERATION UNIT)
26 CONTROL CIRCUIT
27 HORIZONTAL SCAN CIRCUIT
28 OFFSET CORRECTION PROCESSING CIRCUIT (OFFSET CORRECTION PROCESSING UNIT)
29 NEGATIVE VOLTAGE GENERATION CIRCUIT
50 ELECTRONIC INFORMATION DEVICE
51 IMAGING UNIT
52 OPTICAL SYSTEM
53 DATA PROCESSING UNIT
54 FRAME MEMORY
55 DISPLAY UNIT
56 RECORDING UNIT
57 OPERATION UNIT
58 POWER SUPPLY UNIT
59 CONTROL UNIT
60 BUS
$P_N$ EFFECTIVE PIXEL CIRCUIT (PIXEL CIRCUIT UNIT)
$P_{OB}$ OB PIXEL CIRCUIT (PIXEL CIRCUIT UNIT)
PD PHOTODIODE (PHOTOELECTRIC CONVERSION UNIT)
B EMBEDDED AREA
FD FLOATING DIFFUSION AREA (FLOATING DIFFUSION UNIT)
MEM MEMORY AREA (CHARGE RETAINING UNIT)
TX TRANSFER CONTROL LINE
TRX FIRST TRANSFER CONTROL LINE
TRG SECOND TRANSFER CONTROL LINE
RST RESET CONTROL LINE
SEL SELECTION CONTROL LINE
OFG DISCHARGE CONTROL LINE
VR RESET POWER SUPPLY LINE
VD COMMON POWER SUPPLY LINE
VS SIGNAL OUTPUT LINE
S SUBSTRATE
W WELL
X GATE INSULATING FILM
H HIGH VOLTAGE (FIRST VOLTAGE)
L LOW VOLTAGE (SECOND VOLTAGE)
$M_1, M_2, M_{11}, M_{12}, M_{21}, M_{22}$ INTERMEDIATE VOLTAGE
$M_{31}, M_{32}, M_{41}, M_{42}, M_{51}, M_{52}$ INTERMEDIATE VOLTAGE

The invention claimed is:

1. A solid-state image sensor, comprising
a plurality of pixel circuit units, each including a photoelectric conversion unit that generates charges via photoelectric conversion and accumulates the generated charges, a floating diffusion unit that retains charges transferred from the photoelectric conversion unit, a transfer unit through which charges accumulated by the photoelectric conversion unit are transferred to the floating diffusion unit, an output unit that outputs a signal corresponding to the amount of charges retained by the floating diffusion unit, and a reset unit that discharges charges retained by the floating diffusion unit to the outside,
an A/D conversion unit that acquires a signal output from the output unit, and performs A/D conversion on the acquired signal using a set gain, and
charge retaining circuitry that temporarily retains charges before being transferred from the photoelectric conversion unit to the floating diffusion unit,
wherein at least one of the pixel circuit units is configured such that charges transferred from the photoelectric conversion unit to the floating diffusion unit and retained by the floating diffusion unit are limited so as not to exceed an upper limit amount which is set to be smaller by the extent of an increase in the gain,
the transfer unit includes a first transfer unit through which charges accumulated by the photoelectric conversion unit are transferred to the charge retaining circuitry, and a second transfer unit through which charges retained by the charge retaining circuitry are transferred to the floating diffusion unit, and
wherein at least one of the pixel circuit units is configured to perform at least one of
a first upper limit amount limiting operation in which charges retained by the floating diffusion unit are limited so as not to exceed the upper limit amount,
a second upper limit amount limiting operation in which charges accumulated by the photoelectric conversion unit are limited so as not to exceed the upper limit amount, and
a third upper limit amount limiting operation in which charges retained by the charge retaining circuitry are limited so as not to exceed the upper limit amount.

2. The solid-state image sensor according to claim 1, further comprising
an intermediate voltage generation unit configured to generate an intermediate voltage of a magnitude between a first voltage and a second voltage in correspondence with the gain, wherein
in at least one of the pixel circuit units, the second transfer unit forms a control terminal of a transistor which enters an ON mode if the first voltage is applied thereto, and enters an OFF mode if the second voltage is applied thereto, and
when the third upper limit amount limiting operation is performed, the intermediate voltage is applied to the second transfer unit.

3. The solid-state image sensor according to claim 2, wherein all the transistors are configured such that the first voltage, the intermediate voltage, and the second voltage are selectively applied to the control terminals.

4. The solid-state image sensor according to claim 2, at least one of the pixel circuit units is configured such that the third upper limit amount limiting operation is performed in such a way that the second transfer unit transfers charges exceeding the upper limit amount from the charge retaining circuitry to the floating diffusion unit, and the reset unit discharges charges which are transferred from the charge retaining circuitry to the floating diffusion unit.

5. The solid-state image sensor according to claim 2, the polarity of the second voltage is different from that of the first voltage.

6. The solid-state image sensor according to claim 1, further comprising
an intermediate voltage generation unit configured to generate an intermediate voltage of a magnitude between a first voltage and a second voltage in correspondence with the gain, wherein
in at least one of the pixel circuit units, the reset unit includes a transistor which enters an ON mode if the first voltage is applied to a control terminal of the transistor, and enters an OFF mode if the second voltage is applied to the control terminal, and
when the first upper limit amount limiting operation is performed, the intermediate voltage is applied to the control terminal of the transistor of the reset unit.

7. The solid-state image sensor according to claim 1, further comprising
an intermediate voltage generation unit configured to generate an intermediate voltage of a magnitude between a first voltage and a second voltage in correspondence with the gain, wherein
at least one of the pixel circuit units includes a discharge circuitry that discharges charges accumulated by the photoelectric conversion unit to the outside, the discharge circuitry including a transistor which enters an ON mode if the first voltage is applied to a control terminal of the transistor, and enters an OFF mode if the second voltage is applied to the control terminal, and
when the second upper limit amount limiting operation is performed, the intermediate voltage is applied to the control terminal of the transistor of the discharge circuitry.

8. The solid-state image sensor according to claim 1, further comprising
an offset correction processing unit that performs an offset correction process on data obtained by performing A/D conversion on signal, which is output from a pixel circuit unit exposed to light, by the A/D conversion unit, based on data obtained by performing A/D conversion on a signal, which is output from a pixel circuit unit shielded from light, by the A/D conversion unit.

9. An electronic information device comprising a solid-state image sensor according to claim 1.

10. A solid-state image sensor, comprising
a plurality of pixel circuit units, each including a photoelectric conversion unit that generates charges via photoelectric conversion and accumulates the generated charges, a floating diffusion unit that retains charges transferred from the photoelectric conversion unit, a transfer unit through which charges accumulated by the photoelectric conversion unit are transferred to the floating diffusion unit, an output unit that outputs a signal corresponding to the amount of charges retained by the floating in diffusion unit, and a reset unit that discharges charges retained by the floating diffusion unit to the outside;
an A/D conversion unit that acquires a signal output from the output unit, and performs A/D conversion on the acquired signal using a set gain,
an intermediate voltage generation unit configured to generate an intermediate voltage of a magnitude between a first voltage and a second voltage in correspondence with the gain, wherein
at least one of the pixel circuit units is configured such that charges transferred from the photoelectric conversion unit to the floating diffusion unit and retained by the floating diffusion unit are limited so as not to exceed an upper limit amount which is set to be smaller by the extent of an increase in the gain,
at least one of the pixel circuit units is configured to perform at least one of
a first upper limit amount limiting operation in which charges retained by the floating diffusion unit are limited so as not to exceed the upper limit amount, and
a second upper limit amount limiting operation in which charges accumulated by the photoelectric conversion unit are limited so as not to exceed the upper limit amount,
in at least one of the pixel circuit units, the transfer unit forms a control terminal of a transistor which enters an ON mode if the first voltage is applied thereto, and enters an OFF mode if the second voltage is applied thereto, and
when the second upper limit amount limiting operation is performed, the intermediate voltage is applied to the transfer unit.

11. The solid-state image sensor according to claim 10, further comprising
an intermediate voltage generation unit configured to generate an intermediate voltage of a magnitude between a first voltage and a second voltage in correspondence with the gain, wherein
in at least one of the pixel circuit units, the reset unit includes a transistor which enters an ON mode if the first voltage is applied to a control terminal of the transistor, and enters an OFF mode if the second voltage is applied to the control terminal, and
when the first upper limit amount limiting operation is performed, the intermediate voltage is applied to the control terminal of the transistor of the reset unit.

12. The solid-state image sensor according to claim 11, the polarity of the second voltage is different from that of the first voltage.

13. The solid-state image sensor according to claim 10, further comprising
an intermediate voltage generation unit configured to generate an intermediate voltage of a magnitude between a first voltage and a second voltage in correspondence with the gain, wherein
at least one of the pixel circuit units includes discharge circuitry that discharges charges accumulated by the photoelectric conversion unit to the outside, the discharge circuitry including a transistor which enters an ON mode if the first voltage is applied to a control terminal of the transistor, and enters an OFF mode if the second voltage is applied to the control terminal, and
when the second upper limit amount limiting operation is performed, the intermediate voltage is applied to the control terminal of the transistor of the discharge circuitry.

14. The solid-state image sensor according to claim 13, the polarity of the second voltage is different from that of the first voltage.

15. The solid-state image sensor according to claim 10, wherein all the transistors are configured such that the first voltage, the intermediate voltage, and the second voltage are selectively applied to the control terminals.

16. The solid-state image sensor according to claim 10, further comprising
an offset correction processing unit that performs an offset correction process on data obtained by performing A/D conversion on signal, which is output from a pixel circuit unit exposed to light, by the A/D conversion unit, based on data obtained by performing A/D conversion on a signal, which is output from a pixel circuit unit shielded from light, by the A/D conversion unit.

17. An electronic information device comprising a solid-state image sensor according to claim 10.

18. The solid-state image sensor according to claim 10, at least one of the pixel circuit units is configured such that the second upper limit amount limiting operation is performed in such a way that the transfer unit transfers charges exceeding the upper limit amount from the photoelectric conversion unit to the floating diffusion unit, and the reset unit discharges charges which are transferred from the photoelectric conversion unit to the floating diffusion unit.

19. The solid-state image sensor according to claim 10, the polarity of the second voltage is different from that of the first voltage.

* * * * *